United States Patent
Futsuhara et al.

[19]

[11] Patent Number: 6,047,634

[45] Date of Patent: Apr. 11, 2000

[54] FAIL-SAFE AUTOMATIC SLIDING OPERATION CONTROL APPARATUS FOR PRESS

[75] Inventors: Koichi Futsuhara; Toshihito Shirai; Masayoshi Sakai, all of Urawa, Japan

[73] Assignee: The Nippon Signal Co., Ltd., Tokyo, Japan

[21] Appl. No.: 09/051,885

[22] PCT Filed: Mar. 7, 1997

[86] PCT No.: PCT/JP97/00727

§ 371 Date: Jul. 17, 1998

§ 102(e) Date: Jul. 17, 1998

[87] PCT Pub. No.: WO98/09802

PCT Pub. Date: Mar. 12, 1998

[30] Foreign Application Priority Data

Sep. 3, 1996 [JP] Japan .................................. 8-233244

[51] Int. Cl.⁷ .............................. B30B 15/14; B30B 15/26
[52] U.S. Cl. .............................. 100/43; 100/48; 100/344; 100/348; 100/349; 192/129 A; 192/131 R; 192/134
[58] Field of Search .................... 100/43, 48, 53, 100/344, 348, 349; 192/129 A, 131 R, 134

[56] References Cited

U.S. PATENT DOCUMENTS

| | | | |
|---|---|---|---|
| 1,962,742 | 6/1934 | Jongedyk | 192/129 A |
| 2,082,210 | 6/1937 | McMaster | 192/129 A |
| 4,075,961 | 2/1978 | Harris | 192/129 A |
| 4,298,114 | 11/1981 | Nagai et al. | 100/53 |
| 4,309,696 | 1/1982 | Nagai et al. | 192/134 |
| 4,667,184 | 5/1987 | Futsuhara . | |
| 5,027,114 | 6/1991 | Kawashima et al. . | |
| 5,285,721 | 2/1994 | Sugimoto et al. . | |
| 5,345,138 | 9/1994 | Mukaidono et al. . | |
| 5,432,337 | 7/1995 | Kato et al. . | |
| 5,495,228 | 2/1996 | Futsuhara et al. . | |
| 5,568,059 | 10/1996 | Futsuhara et al. . | |
| 5,689,398 | 11/1997 | Miller et al. | 192/129 A |

FOREIGN PATENT DOCUMENTS

| | | |
|---|---|---|
| 54-95851 | 7/1979 | Japan . |
| 63-43099 | 2/1988 | Japan . |
| 63-40719 | 10/1988 | Japan . |
| 6-15493 | 1/1994 | Japan . |
| 6-201733 | 4/1994 | Japan . |
| 6-147398 | 5/1994 | Japan . |
| 6-202895 | 7/1994 | Japan . |
| 6-98518 | 12/1994 | Japan . |
| 7-92193 | 10/1995 | Japan . |
| 8-273508 | 10/1996 | Japan . |
| WO 93-23772 | 11/1993 | WIPO . |
| WO 94-23496 | 10/1994 | WIPO . |
| WO 94/23303 | 10/1994 | WIPO . |
| WO 95-10789 | 4/1995 | WIPO . |
| WO 96/30923 | 10/1996 | WIPO . |

*Primary Examiner*—Stephen F. Gerrity
*Attorney, Agent, or Firm*—Jacobson, Price, Holman & Stern, PLLC

[57] ABSTRACT

The present invention relates to a fail-safe automatic sliding operation control apparatus for a press. The entrance and withdrawal behaviors of an operator's hand relative to danger zones (D, $D_N$) on a bolster of the press are detected by an output generation configuration of two optical curtains. A signal for permitting a lowering operation of the slide is generated when the operator's hand is withdrawn from the danger zones (D, $D_N$).

28 Claims, 34 Drawing Sheets

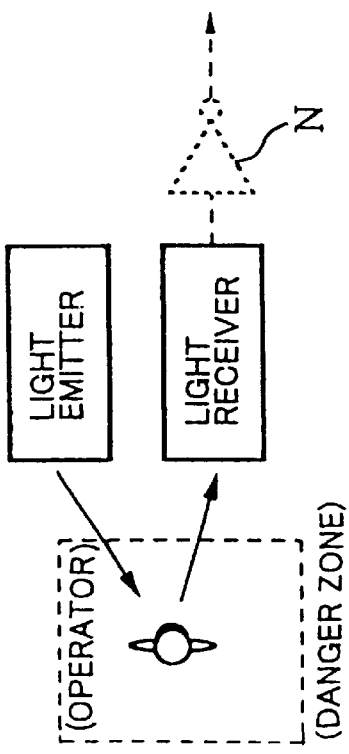
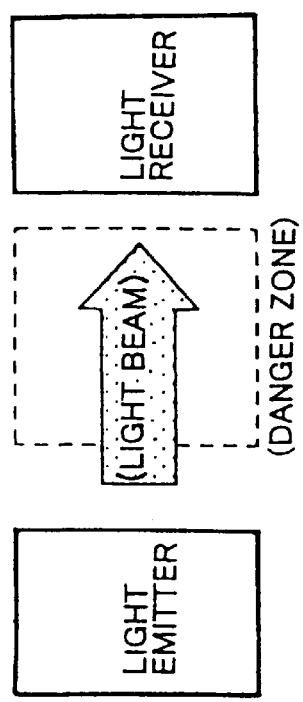
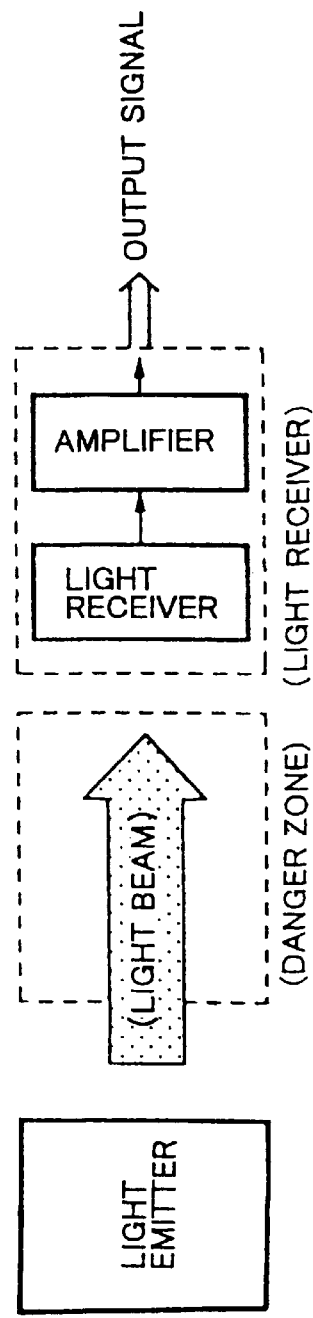

FIG. 28
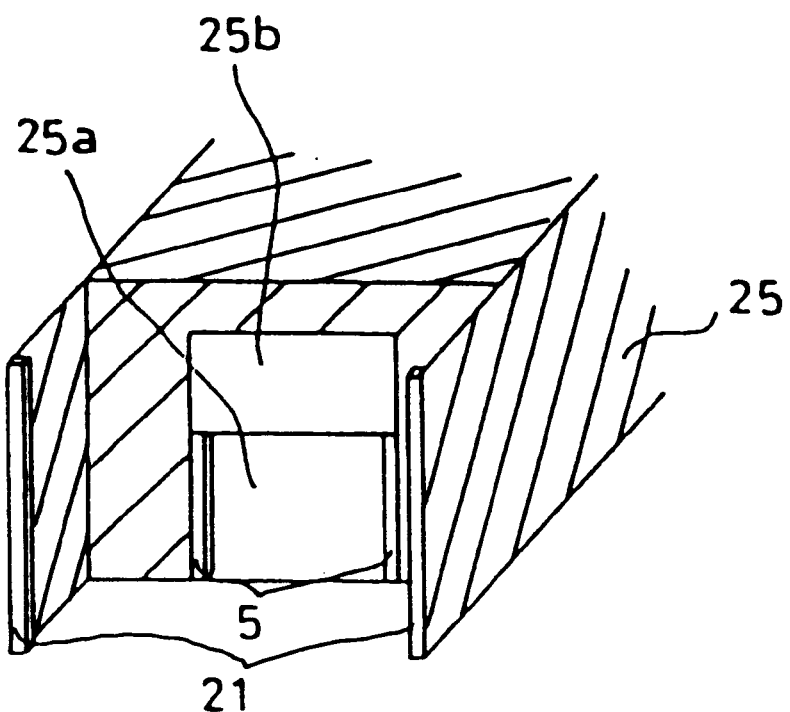
FIG. 29
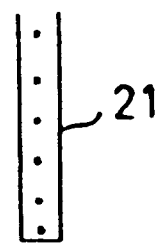

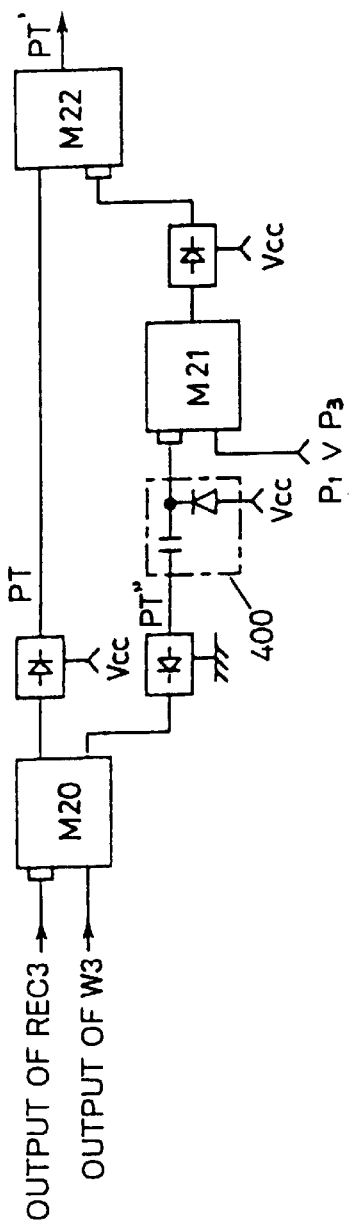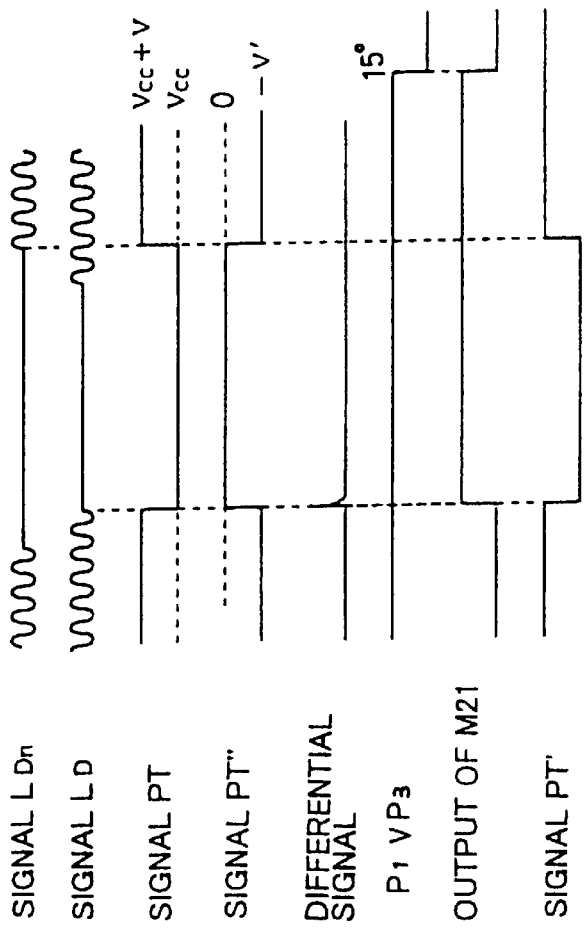

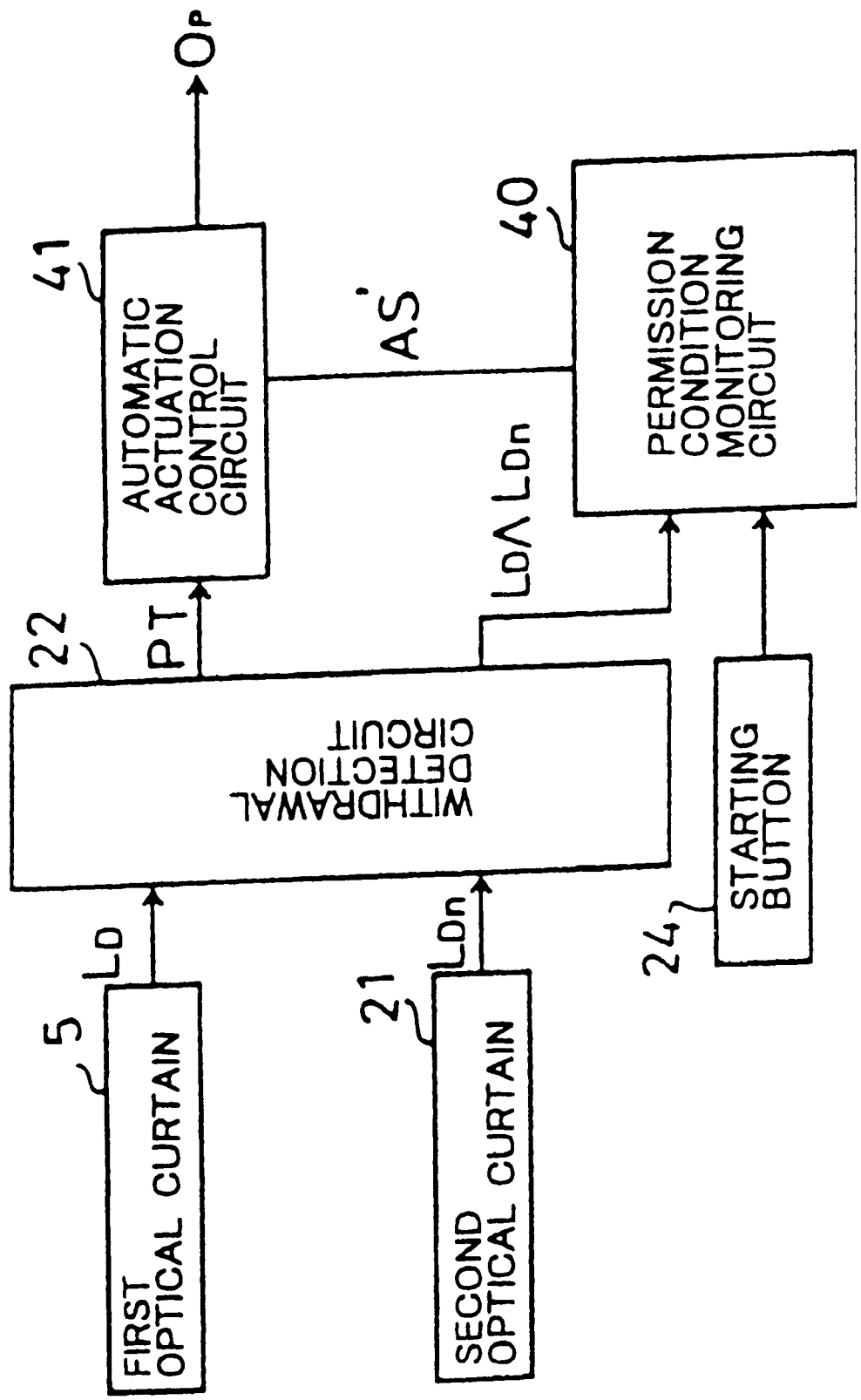

FAIL-SAFE AUTOMATIC SLIDING OPERATION CONTROL APPARATUS FOR PRESS

BACKGROUND OF THE INVENTION

1. Field of the Invention

The present invention relates to a fail-safe automatic sliding operation control apparatus for a press in which the safety of the operator is ensured during sliding operation of the press, and the automatic operation of the slide is made possible.

2. Description of the Related Art

In a press control system, a serious accident may result, should a malfunction occur in the control system. Therefore, it is desired that such a control circuit, which is related to a sliding operation of a press, have a fail-safe constitution. In the following description, the term "fail-safe constitution" refers to those system constitutions for sensors or for control circuits which will never indicate "safety" under a dangerous situation; and those constitutions, in the case of electric/electronic circuits, in which output signals are never generated when a fault has occurred in the circuits.

As shown in FIG. 1, the conventional press has a slide 2 which is reciprocally moved in the vertical direction by means of a crank mechanism (not shown) within a body 1. The slide 2 is located above a bolster 3, and an operation button 4 is provided at the front side of the body 1. Provided between the bolster 3 and the operation button 4 is an optical beam type safety apparatus 5 (referred to as an "optical curtain" hereinafter) for confirming a safe status in the dangerous zone above the bolster 3. Reference numerals 6 and 7 designate metal molds (upper and lower types) which are set on the slide 2 side and bolster 3 side, respectively.

In the operational control for a safety one cycle in such a conventional press, the safe status of the operator is confirmed by means of the optical curtain 5. The slide 2 is lowered only when the operation button 4 is kept pressed by the operator, and the slide 2 is automatically moved upwardly during its rising interval. The operation button 4 is manipulated at each reciprocating motion of the slide 2. Typically, a brake is actuated at a predetermined position in the slide rising interval for each reciprocating motion of the slide 2 so as to confirm the brake function, i.e., to confirm that the slide can be stopped in the vicinity of a top dead center (within a predetermined crank angle range) (overrun monitoring function).

Shown in FIG. 2 is a positional relationship between the optical curtain 5 and the operation button 4 of the press shown in FIG. 1.

In a normal working state, the zone D within a one-dot chain line is a danger zone (as defined according to EN292-1 or ISO/TR12100-1) which is defined by the optical curtain 5 at the front of body 1 and by both sides of the bolster 3. The bolster is typically enclosed by means of block fences for preventing operators from entering the press. This danger zone D is a region determined on the basis of the speed of the slide and a moving speed of an operator, and represents the minimum region required for ensuring the safe status of operators. This region, represented by a distance between the bolster 3 and the optical curtain 5 when viewed from the front of the press, must remain clear, which means that the slide will be suddenly stopped if a hand of the operator enters within this region during the lowering of the slide. Further, the distance L between the optical curtain 5 and the operation button 4 represents a distance by which the hand of the operator should be spaced or drawn from the danger zone D as a re-confirmation of safe status just before the actuation of the slide after the safe status (absence of hand) in the danger zone D has been signaled. The reference character $D_N$ designates a further danger zone which includes the distance L.

The "safety one cycle operation of the press" means that the operator's hands should normally remain outside the danger zone $D_N$, i.e., the hands should remain on the operation button (or outside the operation button) during the lowering motion of the slide. Thus, in the safety one cycle operation, the optical curtain 5 detects a slide sudden stop condition, while the operation button 4 provides a slide actuation condition.

There will be described hereinafter the features in the safety cycle operation utilizing the operation button.

1) Utilization of Operation Button

The operation button is utilized only for the lowering of the slide, the rising of the slide being automatically effected. In other words, the lowering motion period of the slide is a working stroke involving danger (dangerous stroke), and the rising motion period of the slide does not involve danger, so that the operation button is utilized for the dangerous stroke only.

2) Position of Operation Button

The position of the operation button acts to ensure the safe status of the operator outside the danger zone on the bolster over the optical curtain, and that the hands of the operator are spaced from the optical curtain by a predetermined distance. Thus, lowering of the slide is permitted under this situation only. In addition, the reason why the operation button is to be operated by both hands is to indicate that both hands of the operator are located at this distance.

3) Existence of Operation Button

The operation button is provided for signaling and implementing the operator's intention to actuate the slide, and acts as a press side sensor for confirming this intention.

4) Structure of Operation Button

In an ON/OFF operation for electric current I making use of an operation button, there are two possible implementations. One is to allow the current I to flow by turning ON the contact points when the operation button is pushed as shown in FIG. 3, and the other is to cut off the current I by turning OFF the contact points when the operation button is pushed as shown in FIG. 4. In the structure of FIG. 3, should the contact points not make contact with each other when the operation button is pushed, the current I does not flow. Thus, in the case of operating a slide by means of the current I, the slide will not move downwardly even if the operation button is pushed, so that the slide operates with a safety mechanism. In the structure of FIG. 4, if a disconnection in the wire for the current I should occur, current will continue to flow as if the operation button were pushed, resulting in lowering motion of the slide. In view of the above, there is adopted an operation button having the structure shown in FIG. 3, for operation of a fail-safe press.

The operation button in FIG. 3 is constructed to be pushed by the operator's hand such that the contact points are contacted with each other by this force, thereby allowing flow of the current I. Namely, the logical structure is such that the operator's energy for pushing the operation button is converted into the energy of current I for driving the slide.

Shown in FIGS. 5 and 6 are examples of sensors having logical structures identical with those in FIGS. 3 and 4, respectively.

FIG. 5 shows a logical structure identical with that of the operation button shown in FIG. 3, i.e., an example of a fail-safe sensor.

In FIG. 5, a sensor 10 is provided with a detection part 12 which has a reflected light detection type sensor substantially at the center of a cover 11. When the operator's hand 13 is positioned above the detection part 12 (corresponding to the pushing of the operation button), the light beam, which is normally emitted from the detection part 12, is reflected by the operator's hand 13 and received, whereby the existence of the operator's hand 13 is detected (this detection triggers the generation of current I). Thus, in the sensor 10 of FIG. 5, the generation of reflected light corresponds to the force of an operator's hand when pushing the operation button; signal energy from light reception is generated when the operator's hand 13 is positioned above the detection part 12, and the current I is generated by this energy.

FIG. 6 shows an example of a sensor corresponding to the operation button of FIG. 4.

In FIG. 6, a sensor 10' is provided with a light emitting part 14 and a light receiving part 15, which are disposed on opposing sides of the cover 11'. When a light beam Be is blocked or intercepted by the operator's hand 13, a light detection output signal of the light receiving part 15 disappears which, in turn, shuts down the output current, i.e., current I in FIG. 4. In this sensor 10', failure of either of the light emitting or receiving elements results in disappearance of the current I. However, the sensor structure in FIG. 6 does not constitute a fail-safe system because a possibly dangerous output signal may be erroneously generated under a failed condition.

Summarizing the aforementioned functions of the operation button in a safety one cycle operation, the following Table 1 is obtained.

TABLE 1

| | Function |
| --- | --- |
| Utilization of operation button (operation by both hands) | To be used for action involving danger (only for lowering of slide) |
| Information attributed to the operation button: | |
| Position of Button; | Confirmation of distance of hands from optical curtain; |
| Existence of Button; and | Notification of operator's intention to actuate the slide; |
| Structure of Button | Conversion of the existence of hands into energy to thereby generate another energy for permitting the lowering motion operation of slide. |

Meanwhile, a mechanism called "interlock" permits an actuation of the relevant machine only when the zone regarded as dangerous is safe. However, "interlock" as defined by the European Standard EN 1088 or EN 292-1 does not necessarily permit actuation of the slide even when the danger zone D of FIG. 2 is safe. Namely, it permits the actuation of the slide only when the safe status (absence of hands from danger zone D) is positively re-confirmed. This reconfirmation is accomplished through use of the operation button in the safety one cycle operation. The safe status to be re-confirmed by this operation button corresponds to that information attributed to the operation button shown in Table 1.

In the safety one cycle operation of the conventional press, should the operator's hand have been placed onto the bolster during the lowering of the slide, the operation button will, of course, be released or turned OFF, initiating the function of the normal brake. Thereafter, the optical curtain is intercepted, initiating the function of the emergency brake. Thus, the slide stop operation is doubly initiated, first by the operator's rejection of operation and second by the emergency brake responsive to breach of the optical curtain.

However, the operator may suffer physical ailments such as tenosynonitis when the frequency of pushing the operation button is increased. Thus, there is demanded an operation system which does not impose burden onto the operator.

If the sensor 10 in FIG. 5 is adopted, the action of pushing an operation button can be omitted. However, such an action is still required to locate the hand 13 on the detection part 12 of sensor 10 at each reciprocating motion of the slide, so that the working state itself is not greatly improved. Rather, the working state may be even worse due to the action of the hand necessary to fit within the concave portion.

Further, there may be envisaged an automatic operation control for the slide, which depends on the optical curtain 5 of FIG. 1 only. However, safety problems are then involved, as described hereinafter.

The actuation of the slide in the absence of a both-hand type operation button means that all of the functions in the operation button indicated in Table 1 are not provided. As such, the slide 2 is immediately lowered based only on the absence of the operator's hand from the danger zone D, i.e., the slide is lowered as soon as the operator's hands are withdrawn from the danger zone D after manually inserting a work between the upper and lower metal molds 6 and 7.

This method involves the following problems, as compared to the aforementioned conventional safety one cycle operation.

(1) The operator is spaced from the danger zone D, but is still standing very closely, so that the operator may erroneously or inadvertently enter the danger zone D. Namely, the region in which the operator must exist is not limited.

(2) The operator is not bound or restricted during the lowering of the slide. Thus, the operator's behavior can not be predicted.

(3) The operator is unable to signal an intention to actuate the slide. Due to the lack of communication between the operator and the press, the lowering of the slide may occur contrary to the operator's intention.

(4) The device for slide stoppage is embodied in a single element, assuming there is only one operator.

(5) The timing as to when the slide of the press shall be lowered is not indicated.

Thus, it is necessary to provide the function of the conventional operation button by some procedure. As one such procedure, there is envisaged a procedure to monitor the position of the operator's hand such as by means of a CCD camera. However, this requires complicated information processing capable of consistently judging the movement of the hand, without failure. Further, it becomes expensive.

Then, there has been conventionally proposed a light-beam type safety apparatus for automating the operation of the press, as shown in Japanese Examined Patent Publication No. 7-92193. In this apparatus, there are provided a plurality of layers of optical curtains from the outside toward the inside of the press, and the entrance and escape motions of the human body into and from the danger zone are detected by the interceptive configuration of the plurality of layers of optical curtains. However, this light-beam type safety apparatus is not constituted in a fail-safe manner.

The reasons thereof will be explained hereinafter, in detail.

Firstly, there will be described a constitutional principle of a fail-safe optical curtain.

Shown in FIGS. 7 through 9 are constitutional examples of optical curtains. It is assumed that the light receiver does not have a function of NOT operation, and the number of light beams is one.

In the optical curtain of FIG. 7, when a person enters the danger zone (danger zone D of FIG. 2), the light beam is intercepted so that the light receiver does not receive it.

In the optical curtain of FIG. 8, when a person enters the danger zone, the light beam reflected by the person is received by the light receiver. Thus, when the presence/absence of a person and those of input/output signals of the light receiver are represented by binary logical values, "1" and "0", respectively, Tables 2 and 3 are obtained for the optical curtains of FIG. 7 and FIG.8, respectively. In these tables, the logical value is given in the parentheses.

TABLE 2

| Presence/Absence of Person | Input of Light Receiver | Output of Light Receiver |
| --- | --- | --- |
| Absence (1) | Yes (1) | Yes (1) |
| Presence (0) | No (0) | No (0) |

TABLE 3

| Presence/Absence of Person | Input of Light Receiver | Output of Light Receiver | Output of NOT circuit |
| --- | --- | --- | --- |
| Absence (1) | No (0) | No (0) | Yes (1) |
| Presence (0) | Yes (1) | Yes (1) | No (0) |

If safety, the absence of a person from the danger zone, is to be represented by a logical value "1", the constitution of the optical curtain of FIG. 8 requires a NOT circuit N which performs a NOT operation for the output of the light receiver, as depicted by a dotted line.

The constitution of the optical curtain of FIG. 8 is difficult to adopt as a fail-safe one, since it involves the following problems.

(1) In case of failure of the light emitter (such as light emitting element), if the circuit of the light receiver is operating normally, the logical value "1" is not generated from the light receiver irrespectively of the presence of a person in the danger zone. At this time, the output signal of NOT circuit N has a logical value "1" which represents safe status (the absence of a person in the danger zone), failing to indicate the possible danger (logical value "0").

(2) Even if the light emitter and light receiver are operating normally, when a disconnection fault has occurred in the input line of NOT circuit N, the output of NOT circuit N continually has a logical value "1" to represent safe status, irrespectively of the state in the danger zone.

For at least these reasons, if a fail-safe system is to be provided, there should not be adopted such a constitution as shown in FIG. 8 where safe status is represented by either of binary values derived from a NOT circuit.

Meanwhile, in the structure of FIG. 7, the input/output relation of the light receiver, the output of which is used to represent safe status (logical value "1"), is realized in a logically monotonous (or united) manner. Namely, the logical relationship, i.e., the logical value, of the output is the same as that of the input. This type of logical structure is the basic principle of signal processing in a fail-safe system. This basic principle is known from U.S. Pat. No. 5,345,138.

In practice, the output signal from the light receiver may be amplified, as shown in FIG. 9. In this case, the amplifier should also have a fail-safe characteristic (where an output signal is not generated upon failure). A fail-safe amplifier is known from International Unexamined Patent Publication WO 94/23303. Further, known from International Unexamined Patent Publications WO 93/23772 and WO/95/10789 is a fail-safe optical sensor which is provided with a plurality of light beams and generates an output signal in the relationship of Table 2.

There will be described hereinafter a system construction in which a solenoid valve for driving the slide of a press is controlled using the aforementioned fail-safe sensor.

The principle of fail-safe machine operation control described hereinafter is disclosed in U.S. Pat. No. 5,345,138, where a sensor output signal, Se, is provided as a permission signal. On the other hand, proposed such as by U.S. Pat. No. 5,285,721 is a fail-safe operation control circuit for a press.

FIGS. 10 and 11 show a constitutional principle in the case in which fail-safe operation control of a press is performed by means of an output signal, Se, of a sensor.

In the circuit configuration of FIG. 10, the output SI (electric current) of solenoid driving circuit is generated only when an operation instruction M exists and the output signal, Se, of the sensor (optical curtain) is being generated. FIG. 11 shows a time chart of the respective signals in the circuit of FIG. 10. When the presence and absence of generation of the respective signals M, Se, Si, SI are represented by logical values "1" and value "0", respectively, the logical relationship between the respective output signals is provided in Table 4.

TABLE 4

| M | Se | Si | SI |
| --- | --- | --- | --- |
| 1 | 1 | 1 | 1 |
| 1 | 0 | 0 | 0 |
| 0 | 1 | 0 | 0 |
| 0 | 0 | 0 | 0 |

As understood from Table 4, the output signal SI becomes a logical value "1" only when both of the input signals M, Se of the AND gate have logical values of "1", while the output signal SI assuredly becomes logical value "0" if either of the input signal M or Se is logical value "0", which means that a NOT operation is not included. Namely, in the constitution of FIG. 10, the output and input sides are connected with each other through the aforementioned monotonous logical relationship.

A normally closed solenoid valve is used within the press, the valve being one in which the movable iron core (plunger) is lifted up to open the valve thereby passing a pressure when its coil L is supplied with an electric current; the iron core will drop by gravity to close the valve when the electric current is cut off. In the system construction of FIG. 10, there is no function for stopping output based on the sensor output. Such a system is called a "normally closed system". The best known example of a "normally closed system" is an electromagnetic clutch brake.

Shown in FIGS. 12 and 13 are constitutional examples of machine operation control circuits which have a function to stop output based on the sensor output.

FIG. 12 shows a concrete example of a circuit in which a contact point "r" of electromagnetic relay Re for shutting off the electric current is inserted in series in an electric current supply circuit of a coil L for the solenoid valve.

In the constitution of FIG. 12, a NOT circuit N' is to be necessarily inserted, so as to shut off the electric current of the coil L when a danger is indicated, i.e., when the output signal SI should have a logical value "0". Namely, by the provision of NOT circuit N', the electromagnetic relay Re is supplied with an electric current thereby opening (turning OFF) the contact point "r" to thereby shut off the output signal SI, when the sensor output signal Se has disappeared to become logical value "0" (indicative of danger). When the sensor output signal Se has the logical value "1" (indicative of safe status) the electromagnetic relay Re is not supplied with electric current, so that the contact point "r" is kept closed (i.e., ON). Thus, the NOT circuit N', electromagnetic relay Re, and contact point "r" thereof cooperatively constitute an output stoppage circuit for stopping the actuation of a solenoid valve when the sensor output signal Se has indicated a danger (logical value "0"). This output stoppage circuit is constituted such that the electromagnetic relay Re is not supplied with electric current when safe status is indicated, i.e., under the normal condition, whereas an electric current is supplied thereto only when a dangerous situation has been detected. This type of system construction adopting the output stoppage circuit of FIG. 12 is called a "normally open system". This normally open system includes the NOT circuit N'. Thus, for example, even if the output signal SI should be shut off when the sensor output signal Se becomes a logical value "0", the contact point "r" may be kept closed (kept ON), since the electromagnetic relay Re is not excited, if a disconnection fault has occurred in the input or output line of the NOT circuit N'. Therefore, those system constitutions having such an output stoppage circuit configuration explained above can not be used in a fail-safe system.

FIG. 13 shows the circuit configuration of FIG. 12, as a logical circuit. Further, Table 5 shows a truth value for the respective signals in FIG. 13.

TABLE 5

| M | Se | /Se | SI |
|---|----|----|----|
| 1 | 1  | 0  | 1  |
| 0 | 1  | 0  | 0  |
| 1 | 0  | 1  | 0  |
| 0 | 0  | 1  | 0  |

In Table 5, the signal /Se is one which is renewedly formed or generated by the output stoppage circuit which is constituted of the NOT circuit N', electromagnetic relay Re, and contact point "r". In the logical circuit of FIG. 13, the logical relationship is nominally identical with that of Table 4, which relationship is between the operation instruction M, the sensor output signal Se, and the output signal SI of the solenoid driving circuit, but this logical circuit internally has a dual-step NOT operation function. Thus, a monotonous relationship is not obtained (i.e., there is included a process for converting the logical value "1", into "0", and the logical value "0" into "1") due to the interposition of the signal /Se by the output stoppage function, as understood from the truth value table of Table 5 which was prepared by including the internal constitution. As such, the light-beam type safety apparatus described in Japanese Examined Patent Publication No. 7-92193 has not been constituted in a fail-safe manner, since its system constitution has such a NOT operation function as explained above.

Namely, the light-beam type safety apparatus described in Japanese Examined Patent Publication No. 7-92193 is provided with a stop signal generation circuit, a foreign matter escape signal generation circuit, and a stoppage releasing signal generation circuit. The most important feature of this apparatus is that it has the stoppage releasing signal generation circuit for starting the operation of the press, and the stop signal generation circuit for stopping the operation of the press, and that the starting and stopping are instructed using different routes in the operation of the press. This system is also essentially unable to be regarded as being fail-safe, in that it has an output stoppage circuit such as that shown in FIGS. 12 and 13. In fact, in the circuit configuration shown in FIG. 1 of the Japanese Examined Patent Publication No. 7-92193, the interception signal for the light to be input to the stop signal generation circuit is supplied by the negation of the light receiving signal. As such, the stop signal is not generated if a disconnection fault of the input or output line of the stop signal generation circuit has occurred. Thus, the press can not be stopped, no matter how the aforementioned three circuit elements are constituted. Besides, its constitution is more complicated when compared with the basic constitution of a fail-safe system of FIGS. 10 and 11. When adopting any conventional light-beam type safety apparatus as a fail-safe operation control circuit, such a circuit should be constituted such that the stoppage releasing signal is not generated when the output stoppage signal can not be generated. Thus, those conventional light-beam type safety apparatuses are insufficient as a safety apparatus for a press, and are considered to be outside of the basic principle for securing safety.

SUMMARY OF THE INVENTION

The present invention has been achieved in view of the aforementioned circumstances, and it is therefore an object of the present invention to provide a fail-safe automatic sliding operation control apparatus for a press, which is constituted such that an operation permission signal is provided by output signals from a plurality of detecting devices in conformity with the basic principles of fail-safe control to thereby assuredly secure the safety of operators while providing the apparatus at a lower cost. It is another object of the present invention to further enhance safety, by defining conditions for generating the operation permission signal.

The logical processing in the present invention is effected based on fail-safe signal processing (called "dynamic fail-safe signal"). However, it is known that logical processing can be effected based on multiple-route processing as a majority operation such as disclosed in Japanese Unexamined Patent Publication No. 6-202895.

Thus, the present invention provides a fail-safe automatic sliding operation control apparatus for a press in which a work located on a bolster is processed by downwardly moving the slide to the work. The control apparatus includes a first detecting device, a second detecting device, a withdrawal detection device, and an actuation device.

The first detecting device is for detecting whether a human body has entered within a first danger zone which is established to include the bolster. The second detecting device is for detecting whether a human body has entered within a second danger zone. The second danger zone is established outside of the first danger zone and includes the first danger zone.

The withdrawal detection device is for generating a human-body-withdrawal-detection-signal indicative of withdrawal of the human body from the first and second danger zones, when a human-body-absence-detection-signal is generated from the first detecting device and therafter a human-body-absence-detection-signal is generated from the second detecting device. The actuation control device is for generating an automatic actuation signal for the slide, when the human-body-withdrawal-detection-signal is generated from the withdrawal detection device.

According to such a constitution, the automatic actuation signal is generated from the actuation control device when the withdrawal detection device detects that the operator's hand has been withdrawn from the first and second danger zones after the operator has conducted a work exchanging operation.

The withdrawal detection device is constituted to generate the human-body-withdrawal-detection-signal when a first human-body-absence-detection-signal is generated by the first detecting device and thereafter a second human-body-absence-detection-signal is generated by the second detecting device, after a first human-body-presence-detection-signal is generated by the second detecting device and thereafter a second human-body-presence-detection-signal is generated by the first detecting device.

According to such a constitution, when the operator is to conduct a work exchanging operation, the operator's hand once enters the first and second danger zones and is thereafter withdrawn from the first and second danger zones. This procedure is detected by the withdrawal detection device based on the output generation state of the first and second detecting devices, and an automatic actuation signal is generated from the actuation control device to thereby actuate the slide when the operator's hand has been withdrawn from the danger zones.

The withdrawal detection device may be constituted to generate, at the time of withdrawal of the human body, the human-body-withdrawal-detection-signal by judging that the human body has been withdrawn based on the human-body-absence-detection-signal of the second detecting device; and to stop generating, at the time of entrance of the human body, the human-body-withdrawal-detection-signal by judging that the human body has entered a danger zone, based on the human-body-presence-detection-signal of the first detecting device.

According to such a constitution, there can be provided spatial hysteresis at the time of withdrawal and entrance of the human body, so that the generation state of the human-body-withdrawal-detection-signal can be stabilized.

It is advisable to provide a guard fence around the second danger zone such that the guard fence encloses the bolster, except for a work insertion zone for use by the operator. The human body detection zones of the first and second detecting devices can be accordingly restricted.

The apparatus may further comprise a permission condition monitoring device for monitoring whether a continuation permission condition of the actuation control device is satisfied or not, and for generating an automatic actuation permission signal when the continuation permission condition is satisfied. In this case, the actuation control device is constituted to generate an automatic actuation signal based on the human-body-withdrawal-detection-signal, only when the automatic actuation permission signal is being generated. According to such a constitution, automatic actuation by the actuation control device can be executed only when the automatic actuation permission signal is being generated by the permission condition monitoring device.

The permission condition monitoring device stops generating the automatic actuation permission signal when either of the first and second human-body-absence-detection-signals of the first and second detecting devices, respectively, have disappeared during lowering motion of the slide.

Further, the permission condition monitoring device may be constituted to stop generating the automatic actuation permission signal when the human-body-presence-detection-signals of the first and second detecting devices have been generated within a predetermined period of time after the human-body-absence-detection-signals of the first and second detecting devices have been generated.

The permission condition monitoring device may be constituted to stop generating the automatic actuation permission signal when a generation interval between the human-body-presence-detection-signals from the first and second detecting devices has exceeded a previously set working time interval.

The apparatus may further comprise a starting button which is manually operated by the operator. The actuation control device is constituted to be enabled to operate by an ON operation of the starting button, so as to generate an automatic actuation signal based on the human-body-withdrawal-detection-signal. According to such a constitution, the actuation control device is started through the starting button operation of the operator. Thus, the slide is not actuated unless the operator has an intention of working.

The actuation control device may further comprise a manual actuation signal generation device for generating a manual actuation signal for the slide by an ON operation of the starting button, and an automatic actuation signal generation device which is set when the slide, which was actuated based on the manual actuation signal, has passed a bottom dead center, such that the automatic actuation signal generation device generates the automatic actuation signal based on the human-body-withdrawal-detection-signal.

According to such a constitution, at the first or initial actuation of the slide, the slide is lowered by the starting button until the slide passes the bottom dead center, at which time the transference to automatic actuation control is conducted.

The actuation control device may further include a starting button OFF confirming device for confirming that the starting button is turned OFF after the same has been turned ON, and to be enabled to operate by the generation of a confirmation signal of the starting button OFF confirming device. According to such a constitution, automatic actuation control is enabled only when the starting button is operating normally.

The apparatus may further include a resetting device for resetting a withdrawal detection signal from the withdrawal detection device during a slide rising interval. According to such a constitution, the withdrawal detection signal can be stopped at each reciprocating motion of the slide.

The apparatus may further comprise an overrun monitoring device for monitoring whether the slide has stopped at a position within a predetermined range including a top dead center based on a brake signal generated during a slide rising interval, and for generating a brake normality signal when the slide has stopped within the predetermined range. In this case, the actuation control device is permitted to generate the automatic actuation signal when the brake normality signal is generated. This construction improves safety, since automatic actuation control of the slide is enabled only when brake equipment for stopping the slide is operating normally.

The overrun monitoring device is constituted such that the brake normality signal is maintained when the human-body-withdrawal-detection-signal is generated under a state in which the slide has stopped within the predetermined range. According to such a constitution, overrun monitoring is conducted using the withdrawal detection signal of the withdrawal detection device.

The apparatus is constituted so that the brake normality signal of the overrun monitoring device is input to the permission condition monitoring device, such that the automatic actuation permission signal from the permission condition monitoring device is permitted to be generated when the brake normality signal is being generated.

The apparatus may further comprise a manual actuation device for generating a manual actuation signal based on the operator's manual operation. In this case, slide actuation operation by the manual actuation device and slide actuation operation by the actuation control device are selectively switched to each other by a switching device. According to such a constitution, a manual or an automatic mode may be selected as the slide actuation operation mode. The switching device is a power supply switch for the second detecting device, and the actuation control device is set by the turning ON of the power supply switch. According to such a constitution, the switching between manual and automatic modes can be performed simply by turning on/off the power supply switch of the second detecting device, so that the switching between manual/automatic modes is simplified.

The apparatus may further comprise a delay device for delaying the human-body-withdrawal-detection-signal for a predetermined period of time before inputting the human-body-withdrawal-detection-signal to the actuation control device. According to such a constitution, when the operator discovers a work setting mistake after completion of a work exchanging operation, the setting can be corrected if within a predetermined period of time.

The first and second detecting devices may be embodied as first and second interrupter type optical sensors, respectively, each comprising a light emitting element and a light receiving element which are arranged in opposition to one another at a boundary of a corresponding one of the first and second danger zones. Each of the optical sensors is constituted to comprise a plurality of light emitting elements and a plurality of light receiving elements which are vertically arranged in opposition to one another along a boundary plane of the corresponding one of the first and second danger zones. Thus, there can be constituted an optical curtain having a plurality of light axes.

The plurality of light emitting elements and the plurality of light receiving elements of each of the optical sensors may be advantageously disposed such that light emitting elements and light receiving elements are vertically and alternately arranged at one side of the boundary plane of the corresponding one of the danger zones; and light receiving elements and light emitting elements are vertically and alternately arranged at the other side of the boundary plane of the corresponding one of the danger zones, so as to oppose the light emitting elements and light receiving elements, respectively, at the one side. In this way, although there may occur an influence of reflected light from a reflective body because of directivities of the light emitting elements and light receiving elements if the reflective body exists in the vicinity of the optical sensor, the influenced region can be narrowed.

The light axes of the first optical sensor disposed at the boundary plane of the first danger zone and the light axes of the second optical sensor disposed at the boundary plane of the second danger zone may be advantageously arranged in a vertically offset manner from each other along the boundary planes, when viewed from the front of the boundary planes.

According to such a constitution, as compared to the conventional optical sensors, the gaps between the light axes of the respective optical sensors can be widened without degrading human body detection capability. Thus, the number of light emitting elements and light receiving elements within the optical sensors can be reduced, thereby reducing the cost of the optical sensors.

The apparatus may further comprise a switching circuit for closing a power supply circuit of the slide, by generation of a driving signal based on an automatic actuation signal from the actuation control device. The switching circuit includes an emergency cut-off switch which is turned ON simultaneously with an input of the actuation signal, and turned OFF at a predetermined OFF delay time after stoppage of the input of the actuation signal; and two normal cut-off switches which are turned ON at a predetermined ON delay time after an input of the actuation signal, and turned OFF simultaneously with stoppage of the input of the actuation signal. The two normal cut-off switches, which are connected in parallel to each other, are connected in series with the emergency cut-off switch. The two normal cut-off switches are alternately turned ON/OFF by signals having a mutually complementary relationship. Further, the emergency cut-off switch may be constituted to be turned ON by an OFF confirmation signal indicating that the two normal cut-off switches are both OFF, and kept ON by a normality confirmation signal indicative of a normal condition in which the two normal cut-off switches are turned ON/OFF alternately.

The present invention further provides for a fail-safe automatic sliding operation control apparatus for a press, provided with a switching circuit for controlling opening and closing of a power supply circuit for a movable part of the press. The power supply circuit comprises an emergency cut-off switch which is turned ON simultaneously with an input of an actuation signal of the movable part, and turned OFF at a predetermined OFF delay time after stoppage of the input of the actuation signal; and two normal cut-off switches which are turned ON at a predetermined ON delay time after an input of the actuation signal, and turned OFF simultaneously with stoppage of the input of the actuation signal. The two normal cut-off switches, which are connected in parallel to each other, are connected in series with the emergency cut-off switch. The two normal cut-off switches are alternately turned ON/OFF by signals having a mutually complementary relationship based on the actuation signal. The apparatus may further comprise a control device for keeping closure of the emergency cut-off switch under a condition that the two normal cut-off switches are being turned ON/OFF alternately.

According to such a constitution, the emergency cut-off switch is in an ON state and the two normal cut-off switches are alternately turned ON/OFF in a normal power supplying state, so that the power supply circuit of the movable part is continuously supplied with an electric current. When the normal cut-off switches are not alternately turned ON/OFF in a normal manner, the emergency cut-off switch is turned OFF by the control device to thereby open the power supply circuit to stop the current thereto. Thus, even if the power supply circuit is being supplied with an electric current, the current to the power supply circuit can be immediately cut off to stop the motion of the movable part upon the occurrence of a failure.

Concretely, the control device generates an ON driving signal for the emergency cut-off switch when an OFF confirmation signal, indicating that both of the two normal cut-off switches are OFF at the time of input of the actuation signal, is being generated. The control device continuously generates an ON driving signal for the emergency cut-off switch when a normality confirmation signal, indicative of a normal state in which the two normal cut-off switches are being alternately turned ON/OFF based on the actuation signal, is being generated.

BRIEF DESCRIPTION OF THE DRAWINGS

FIG. 7 is a view for explaining a constitutional principle of a fail-safe system of an optical curtain;

FIG. 8 is an example of an optical curtain which can not constitute a fail-safe system;

FIG. 9 is an example of an optical curtain where an amplifier has been added to the example of FIG. 7;

FIG. 28 is a view showing an exemplary constitution of a guard fence;

FIG. 29 is another exemplary arrangement of a starting button;

FIG. 32 is yet another circuit diagram of a withdrawal detection circuit;

FIG. 33 is a time chart of FIG. 32;

FIG. 34 is a whole circuit diagram of a second embodiment according to the present invention;

DETAILED DESCRIPTION OF THE PREFERRED EMBODIMENTS

There will be explained hereinafter an automatic sliding operation control apparatus according to the embodiments of the present invention, with reference to the accompanying drawings.

Figure 14:
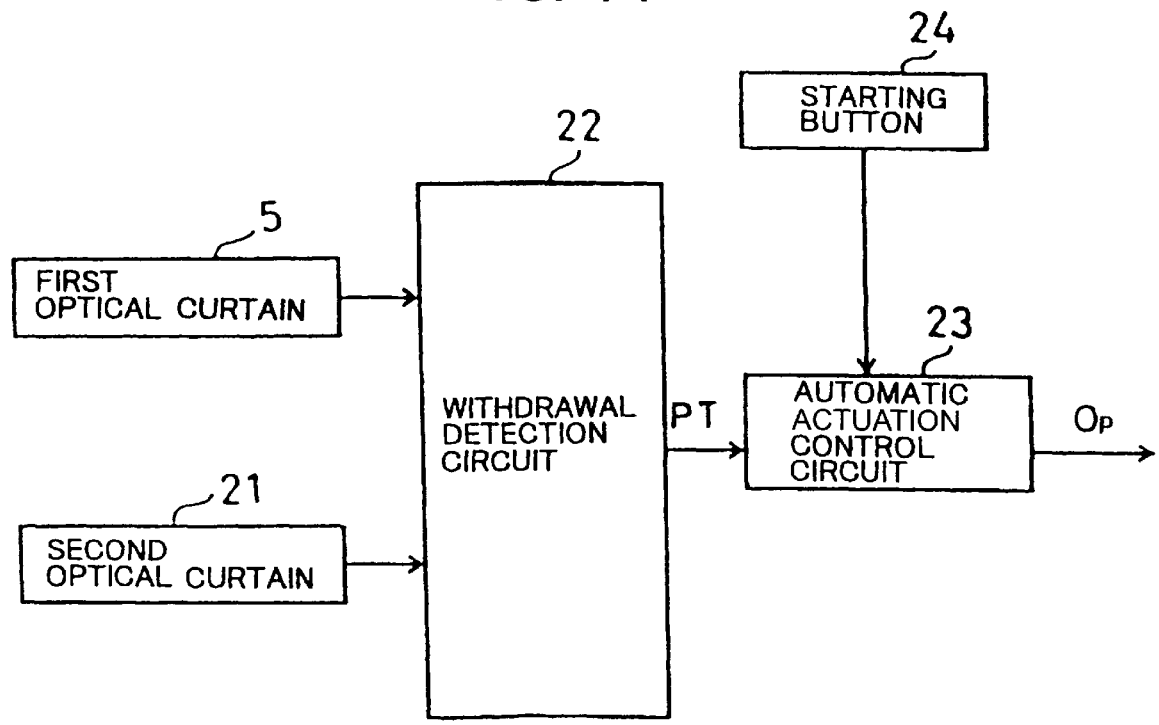
FIG. 14 is a whole circuitry diagram of an automatic sliding operation control apparatus for a press according to a first embodiment of the present invention.

FIG. 14 shows a circuit configuration according to a first embodiment of the present invention. Those parts which are identical to the conventional apparatus of FIG. 1 are depicted by the same numerals to avoid their redundant description.

Figure 10:
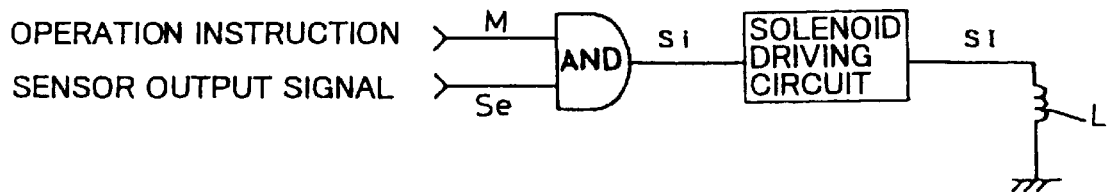
FIG. 10 is a circuit configuration principle diagram of a fail-safe machine operation control adopting a sensor output.
Figure 11:
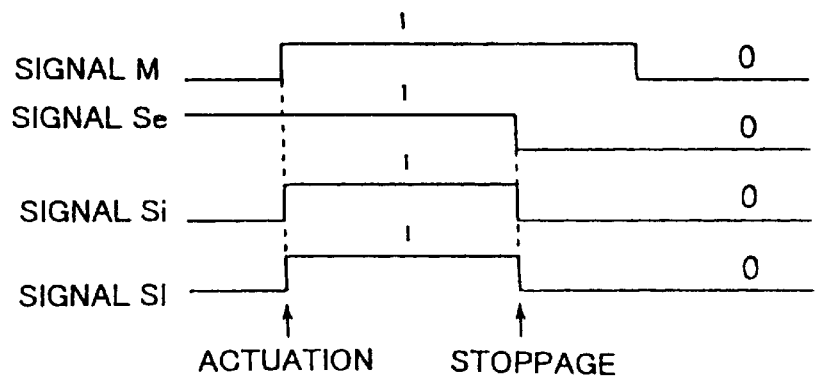
FIG. 11 is a time chart of the diagram of FIG. 10.
Figure 12:
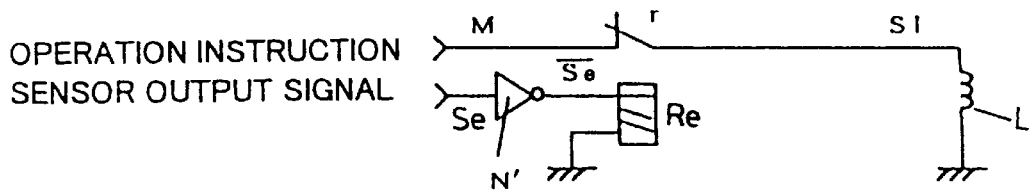
FIG. 12 is a concrete circuit diagram for explaining a constitutional principle of a not fail-safe machine operation control adopting a sensor output.
Figure 13:
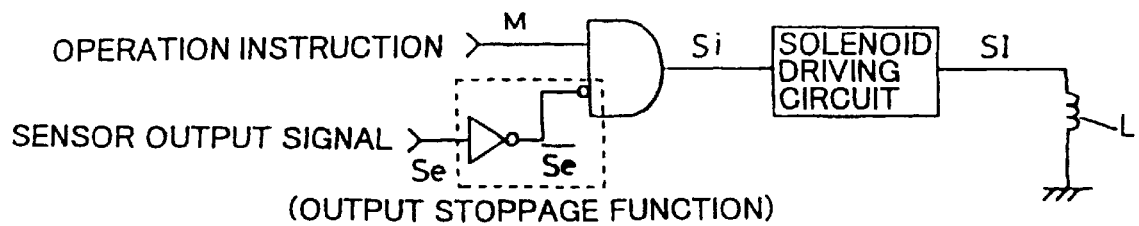
FIG. 13 is a logical circuit diagram of FIG. 12.

In FIG. 14, first and second optical curtains 5, 21, which are first and second detecting devices, respectively, may be representatively embodied as interrupter type optical sensors, the constitutional principle of which has been shown in FIG. 7 or 9. Detection outputs of these first and second optical curtains 5, 21 are input to a withdrawal detection device, embodied as a withdrawal detection circuit 22. Based on the detection outputs of both optical curtains 5, 21, the withdrawal detection circuit 22 generates a detection signal, PT, indicative of withdrawal of the human body and outputs the signal PT to an actuation control device, embodied as an automatic actuation control circuit 23, when it has detected that a human body (hands of operator) has once entered first and second danger zones D, $D_N$ (shown in FIG. 15) and thereafter has been withdrawn from the first and second danger zones D, $D_N$, as will be described later. The automatic actuation control circuit 23 generates an operation signal, Op, as an automatic actuation signal for the slide 2, when a starting button 24 is turned ON and thereafter the detection signal PT is input as an operation permission signal, the constitutional principle of which has been shown in FIG. 10.

Figure 15:
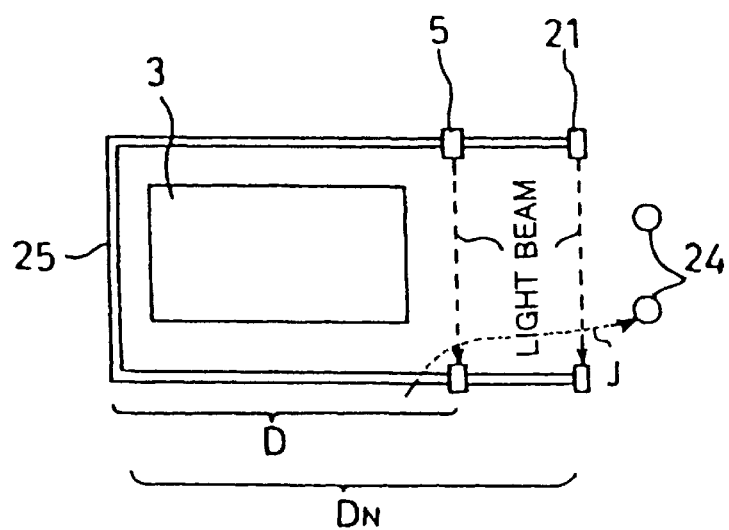
FIG. 15 is a view showing a positional relationship between an optical curtain and a starting button of the present invention.

Shown in FIG. 15 is an exemplary arrangement of the first and second optical curtains 5, 21 and the starting button 24.

Figure 1:
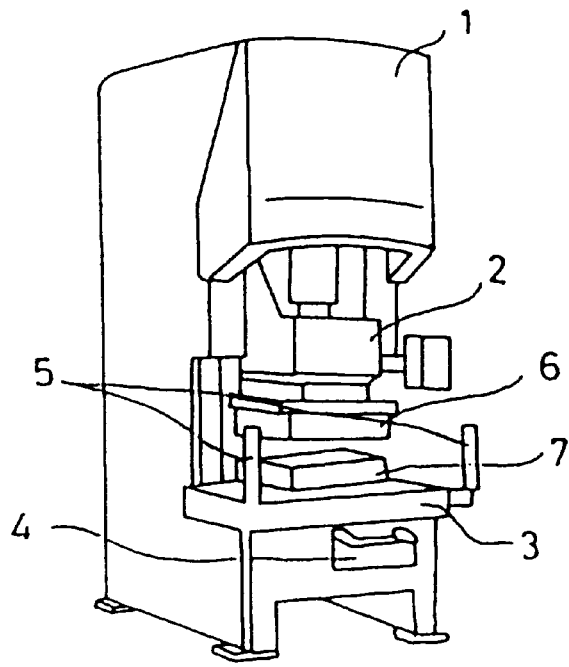
FIG. 1 is a perspective view of a conventional press.
Figure 2:
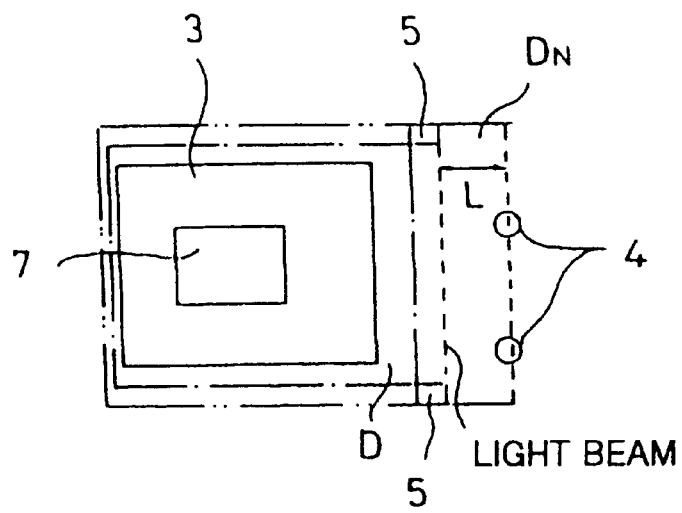
FIG. 2 is a diagram showing a relationship between an optical curtain and an operation button of the press of FIG. 1.
Figure 3:
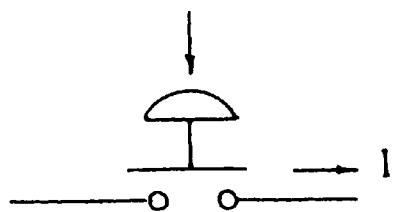
FIGS. 3 and 4 are exemplary constitutions of an operation button in which the electric current flows upon turning ON and OFF of the button, respectively.
Figure 4:
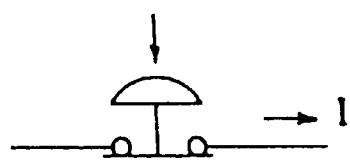
Figure 5:
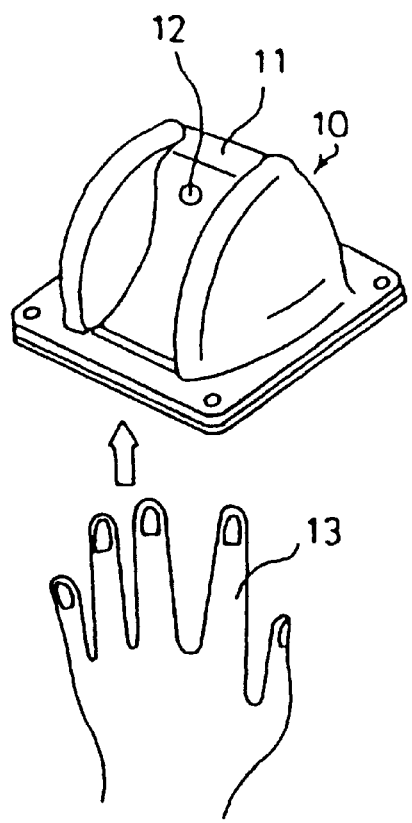
FIG. 5 is an exemplary view of a sensor corresponding to the operation button of FIG. 3.
Figure 6:
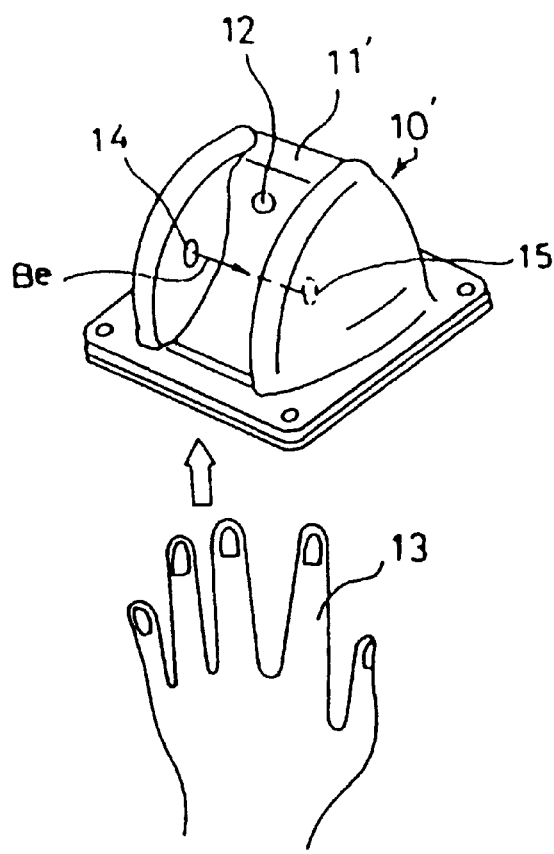
FIG. 6 is an exemplary view of a sensor corresponding to the operation button of FIG. 4.

In FIG. 15, the optical curtain 5 defines the first danger zone D including the bolster 3, in a manner similar to the conventional apparatus shown in FIGS. 1 and 2. The second optical curtain 21 is arranged to form a curtain of optical beam above the conventional operation button 4, to thereby define the second danger zone $D_N$ which includes the first danger zone D. The starting button 24 is arranged outside the second optical curtain 21. Further, there is provided a guard fence 25 at the rear and side surfaces of the press body.

There will be explained hereinafter an operation of the automatic sliding operation control apparatus of the press according to this embodiment.

The operator (not shown) will firstly set a work between the upper and lower metal molds 6 and 7, when the press becomes ready for use by turning on the power. Thereafter, when the starting button 24 is pushed by the operator, the slide 2 moves downwardly and then upwardly to stop at a top dead center. Next, after the operator has completed the insertion of the second work, the slide 2 automatically starts to move downwardly responsive to the operation signal, Op, from the automatic actuation control circuit 23. The operation signal, Op, is generated in response to receipt of the detection signal, PT, from the withdrawal detection circuit 22. The withdrawal detection circuit 22 generates the detection signal, PT, in response to the state in which no part of the operator intercepts either of the light beams of the first optical curtain 5 and the second optical curtain 21, i.e., all body parts of the operator have been withdrawn from the first and second danger zones D and $D_N$.

According to the invention, safe status is indicated by the withdrawal of the operator's hand from the second danger zone $D_N$ within the second optical curtain 21 in the system of this embodiment, whereas safe status is indicated by the presence of the operator's hand on the operation button 4 in the conventional system. As such, it is desirable to ensure that the optical curtain occupies a sufficiently large zone.

There will be explained hereinafter a concrete example of the withdrawal detection circuit 22 of FIG. 14.

Figure 16:
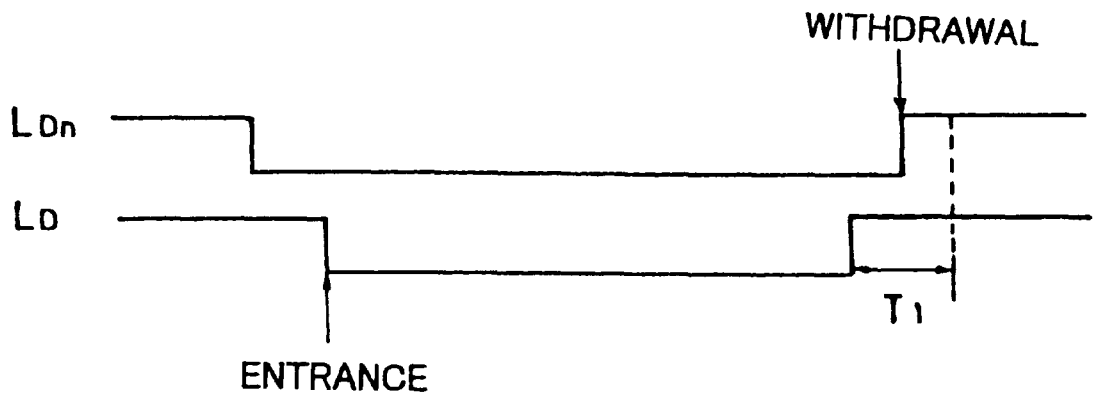
FIG. 16 is a time chart showing an output relationship between two optical curtains.

With respect to FIG. 16, reference character $L_D$ shall designate the output signal of the first optical curtain 5 for monitoring the first danger zone D, and reference character $L_{Dn}$ shall designate the output signal of the second optical curtain 21 for monitoring the second danger zone $D_N$. When the operator performs a work exchanging operation, the time chart of the output signals $L_D$ and $L_{Dn}$ of the first and second optical curtains 5 and 21, respectively, is shown in FIG. 16, because the side peripheries of the first and second danger zones D and $D_N$ are enclosed by the guard fence 25. In FIG. 16, the signals $L_D$ and $L_{Dn}$ are represented by a binary value of "1" or "0", providing that $L_D = L_{Dn} = 1$ when the light is not intercepted, and $L_D = L_{Dn} = 0$ when the light is intercepted.

Further, entrance into the first and second danger zones D and $D_N$ can be represented by $/L_D \wedge /L_{Dn} = 1$, and withdrawal from the first and second danger zones D and $D_N$ can be represented by $L_D \wedge L_{Dn} = 1$, providing that signals $/L_D$ and $/L_{Dn}$ are negative signals for the output signals $L_D$ and $L_{Dn}$, respectively, wherein the mark "/" represents negation and the mark "$\wedge$" represents a logical product.

Figure 17:
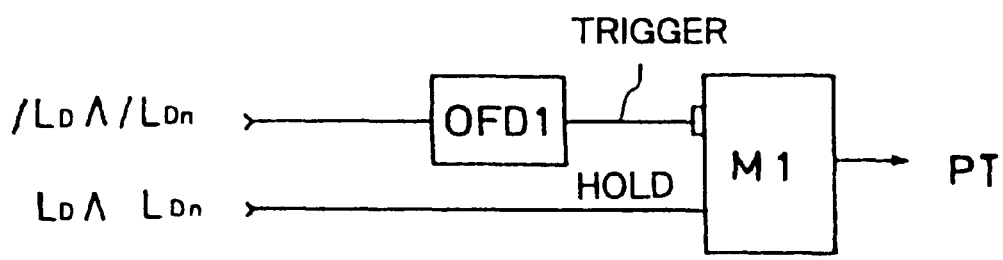
FIG. 17 is a circuit diagram of a withdrawal detection circuit of FIG. 14.

Based on the above, the withdrawal detection circuit 22 can be constituted in such a manner as shown in FIG. 17.

In FIG. 17, the circuit is constituted of a self-hold circuit M1 which receives the signal ($/L_D \wedge /L_{Dn} = 1$) representing the entrance as a trigger input and the signal ($L_D \wedge L_{Dn} = 1$) representing the withdrawal as a hold input, and an OFF delay circuit OFD1 for delaying the stoppage of the signal $/L_D \wedge /L_{Dn}$ by a predetermined period of time T1. In this respect, the delay time T1 of the OFF delay circuit OFD1 is provided for holding the signal /$L_D$/\/$L_{Dn}$ during the period from the state (entrance state) where both signals $L_D$ and $L_{Dn}$ are made OFF, up to the state (withdrawal state) where both signals $L_D$ and $L_{Dn}$ are made ON due to withdrawal of the operator from the second danger zone $D_N$, as shown in FIG. 16. Thus, the delay time T1 is set at a period equal to or longer than the working period of time from the entrance of the operator's hand up to withdrawal thereof, into and from the danger zone, respectively.

Namely, if the first and second optical curtains 5 and 21 are intercepted due to entrance of the operator, /$L_D$/\/$L_{Dn}$ becomes 1 (/$L_D$/\/$L_{Dn}$=1). Further, upon withdrawal of the operator from the first danger zone D after completing a work exchanging operation, /$L_D$/\/$L_{Dn}$ becomes 0 (/$L_D$/\/$L_{Dn}$=0). Nonetheless, the trigger input of the self-hold circuit M1 is kept a logical value "1", by virtue of the OFF delay circuit OFD1. If $L_D$/\$L_{Dn}$ becomes 1 ($L_D$/\$L_{Dn}$=1) responsive to withdrawal of the operator from the second danger zone $D_N$ within the delay time T1, the detection signal PT is generated from the self-hold circuit M1. (How to constitute a fail-safe OFF delay circuit is disclosed in U.S. Pat. No. 4,667,184.)

Figure 18:
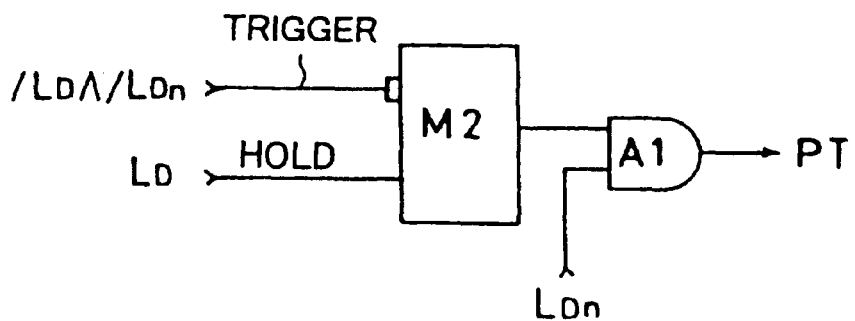
FIG. 18 is another circuit diagram of the withdrawal detection circuit.

FIG. 18 shows another constitutional example of the withdrawal detection circuit 22.

In FIG. 18, the circuit 22 is constituted of a self-hold circuit M2 which receives the signal /$L_D$/\/$L_{Dn}$ representing the entrance as a trigger input and the signal $L_D$ as a hold input, and an AND gate A1 for calculating a logical product of the output signal from the self-hold circuit M2 and the signal $L_{Dn}$.

In FIG. 18, the circuit 22 is constituted such that the signal /$L_D$/\/$L_{Dn}$ is self-held at the self-hold circuit M2, simply by the signal $L_D$ representing the withdrawal from the first danger zone D, instead of the processing by the OFF delay circuit OFD1 of FIG. 17; the detection signal PT is generated responsive to generation of the signal $L_{Dn}$ upon withdrawal of the operator from the second danger zone $D_N$.

Figure 19:
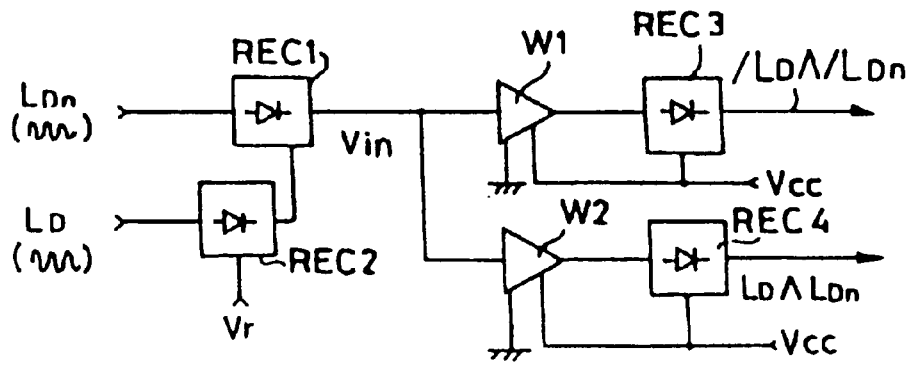
FIG. 19 is a circuit diagram of signal generation representing an entrance and a withdrawal.
Figure 20:
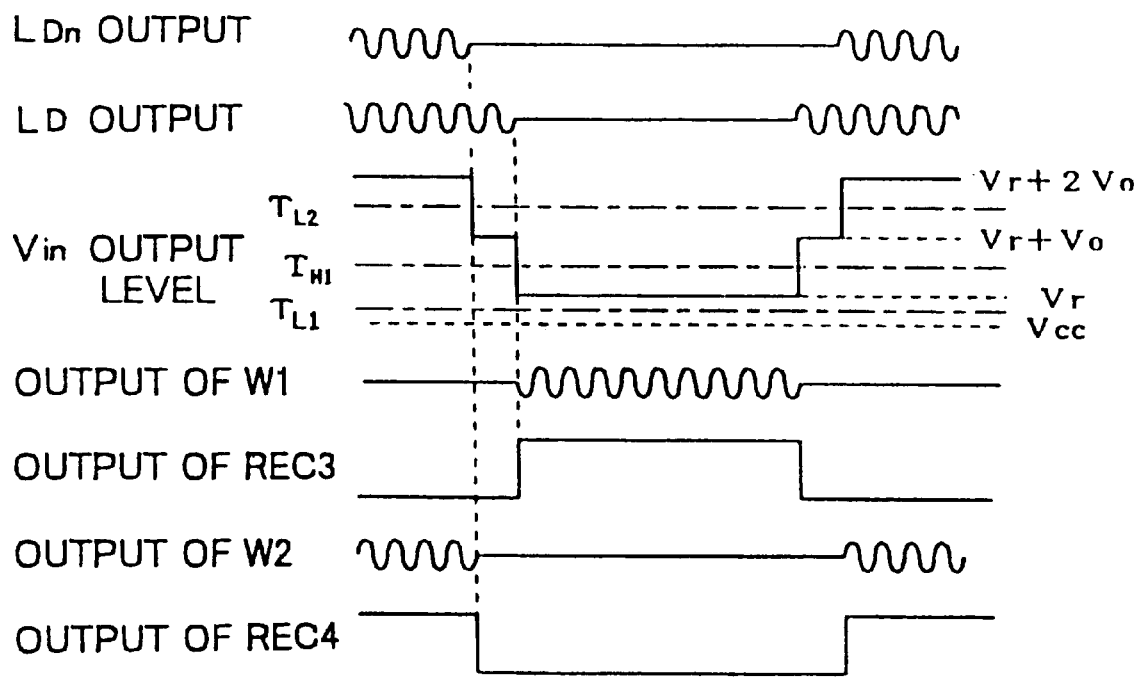
FIG. 20 is a time chart of FIG. 19.

Shown next in FIGS. 19 and 20 is a generation circuit for generating the signals /$L_D$/\/$L_{Dn}$ and $L_D$/\$L_{Dn}$ for rendering the generation of detection signal PT of FIG. 17 as fail-safe.

Provided in FIG. 19 are voltage doubler rectifying circuits REC1 through REC4 and window comparators W1 and W2. Further, the output signals $L_D$ and $L_{Dn}$ of the optical curtains 5, 21 shall be AC (alternating current) signals.

In the above, each of optical curtains 5, 21 shall be a fail-safe constitution which, sequentially scanning, drives a plurality of light emitting elements and light receiving elements such as known from U.S. Pat. Nos. 5,495,228 and 5,432,337. Although the output signals of the known optical curtains are provided as direct current output signals by rectifying the AC output signals, the output signals may be used without passing a rectifying circuit. Further, each of the voltage doubler rectifying circuits REC1 through REC4 has two capacitors and two diodes, and is constituted to generate its output by superimposing a rectified output corresponding to an input signal onto a power supply voltage, such as is known from U.S. Pat. No. 5,027,114 and International Unexamined Patent Publication WO 94/23303. Each of the window comparators W1 and W2 is constituted of a fail-safe window comparator/AND gate comprising a plurality of resistors and transistors, such as is known from U.S. Pat. Nos. 5,027,114; 5,285,271, and 5,345,138.

In the circuit of FIG. 19, the input level $V_{in}$ for each of window comparators W1 and W2 such as shown in FIG. 20 shall be a constant voltage $V_r$($V_r$>$V_{cc}$:$V_{cc}$ is a power supply voltage), when neither of the output signals $L_D$ and $L_{Dn}$ of both optical curtains 5 and 21 is generated; $V_r$+$V_0$ ($V_0$ is a rectified output voltage of each of the voltage doubler rectifying circuits REC1 and REC2, based on the output signals $L_D$ and $L_{Dn}$) when the output signal $L_D$ is generated and the output signal $L_{Dn}$ is not generated; and $V_r$+2$V_0$ when both output signals $L_D$ and $L_{Dn}$ are generated. Further, the lower limit threshold value $T_{L1}$ of the window comparator W1 is set between $V_{cc}$ and $V_r$, and its upper limit threshold value $T_{H1}$ is set between $V_r$ and $V_0$+$V_r$. The lower limit threshold value $T_{L2}$ of the window comparator W2 is set between $V_r$+$V_0$ and $V_r$+2$V_0$. The circuit configuration of FIG. 19 is known from U.S. Pat. Nos. 5,432,337 and 5,495,228, in which the AC input signals are subjected to summing to have a multiple value by means of the voltage doubler rectifying circuits, and the threshold value calculation is performed by means of a fail-safe window comparator.

According to such a constitution, when neither of output signals $L_D$ and $L_{Dn}$ is generated due to the entrance of the operator's hand into the first and second danger zones D and $D_N$, the output level of the voltage doubler rectifying circuit REC1 becomes $V_r$ which is within the upper limit and lower limit threshold values of the window comparator W1. Thus, the window comparator W1 oscillates to generate an AC signal, so that the signal /$L_D$/\/$L_{Dn}$=1 having a level higher than that of the power supply voltage $V_{cc}$ is generated from the voltage doubler rectifying circuit REC3. Further, when both output signals $L_D$ and $L_{Dn}$ are generated due to the withdrawal of the operator's hand from the first and second danger zones D and $D_N$, the output level of the voltage doubler rectifying circuit REC1 becomes $V_r$+2$V_0$ which exceeds the lower limit threshold value $T_{L2}$ of the window comparator W2. Thus, the window comparator W2 oscillates to generate an AC signal, so that the signal $L_D$/\$L_{Dn}$=1 having a level higher than that of power supply voltage $V_{cc}$ is generated from the voltage doubler rectifying circuit REC4.

In the circuit of FIG. 19, if at least one of the voltage doubler rectifying circuits REC1 and REC2 fail, the input level of the window comparators W1 and W2 is lowered, so as not to become $V_r$+2$V_0$. Thus, the window comparator W2 does not oscillate. As a result, the hold input signal of the self-hold circuit M1 is not generated, so that the detection signal PT is never generated.

The self-hold circuit M1 can be constituted by adopting a fail-safe window comparator/AND gate such as is known from the aforementioned U.S. Pat. No. 5,027,114. In this case, the window comparator W2 and voltage doubler recitifying circuit REC4 can be omitted, if the hold terminal side of a window comparator constituting the self-hold circuit M1 is made such that the processing function is performed by the window comparator W2 of FIG. 19.

Further, the circuit of FIGS. 7–9 can also be constituted in a fail-safe manner, noting that the signal /$L_D$/\/$L_{Dn}$ shall be slightly delayed by virtue of the smoothing operation of the voltage doubler rectifying circuit REC3. In this case, the output of the voltage doubler rectifying circuit REC2 is directly input to the hold terminal of the self-hold circuit M2, and the lower limit threshold value of this hold terminal is set between $V_r$ and $V_r$+$V_0$. Further, the AND gate may be constituted of the aforementioned fail-safe window comparator/AND gate, and there may be performed a threshold value treatment similar to that for the window comparator W2 at the signal $L_{Dn}$ receiving terminal side.

There will be now briefly explained the fail-safe window comparator/AND gate hereinafter.

Figure 21:
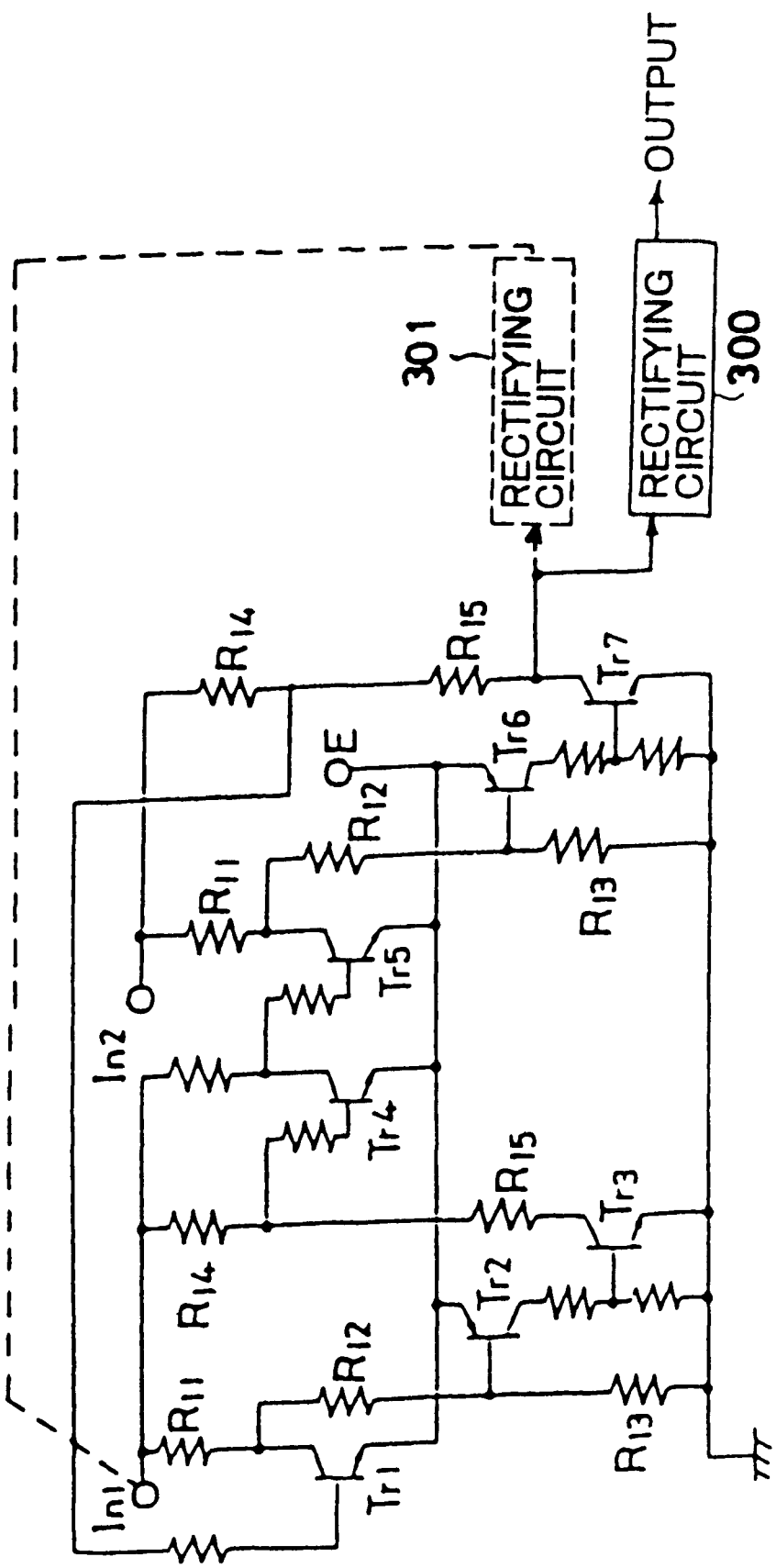
FIG. 21 is an exemplary circuit of a fail-safe window comparator/AND gate used as window comparator, AND gate, and self-hold circuit used in the present invention.

FIG. 21 shows an example of a 2-input fail-safe window comparator/AND gate. In this figure, R11 and R15 are resistors, $T_{r1}$ to $T_{r7}$ are transistors, E is a power source voltage of the circuit, $l_{n1}$ and $l_{n2}$ are input terminals, and numeral 300 is a rectifying circuit. In this case, transistors $T_{r2}$ and $T_{r6}$ are of a PNP type, and the other transistors of an NPN type.

Next, the operation of the circuit will be briefly explained. When an input voltage is not applied to input terminals $l_{n1}$ and $l_{n2}$, transistors $T_{r2}$ and $T_{r6}$ are in an ON condition. When a predetermined voltage is applied to input terminals $l_{n1}$ and $l_{n2}$, transistors $T_{r1}$ to $T_{r7}$ are successively turned on and off as follows:

$T_{r2}$OFF→$T_{r3}$OFF→$T_{r4}$ON→$T_{r5}$OFF→$T_{r6}$OFF→$T_{r7}$OFF→
$T_{r1}$ON→$T_{r2}$ON→$T_{r3}$ON→$T_{r4}$OFF→$T_{r5}$ON→$T_{R6}$ON→
$T_{r7}$ON→$T_{r1}$OFF→....

When the transistors are operated in the aforementioned manner, oscillation is generated. Output of this oscillation is sent out in the form of a DC output through the rectifying circuit 300. In this case, the oscillating condition of this circuit is as follows:

Both input voltages V1 and V2 satisfy the following expression:

(E<)(R11+R12+R13)E/R13<V1=V2
    <(R14+R15)E/R15 where the input voltages of input terminals $l_{n1}$ and $l_{n2}$ are V1 and V2, respectively. It can be known from the above expression that the AND gate function is provided. This arithmetic circuit is characterized in that output is not generated when a disconnection fault is caused in any of resistors R11 to R15 and also when a failure is caused in any of transistors $T_{r1}$ to $T_{r7}$. That is, this circuit is provided with the following fail-safe characteristics: when no signals are input into the two input terminals, an output is not generated; and also when only one of the two input terminals is supplied with an input signal, output is not generated.

Window comparators are structured in such a manner that resistors R11 to R15, with respect to each input terminal $l_{n1}$, $l_{n2}$, are nonsymmetrically provided in the figure, so that the input threshold values of input terminals $l_{n1}$ and $l_{n2}$ are different.

When another rectifying circuit 301 is provided as shown by a broken line in the figure and the rectified output is fed back to one of the input terminals (for example, $l_{n1}$), a fail-safe self-hold circuit can be formed in which the input signal given to input terminal $l_{n1}$, to which the rectified output is fed back, is used as a trigger signal, and the input signal given to the other terminal $l_{n2}$, to which the rectified output is not fed back, is used as a hold signal.

Figure 22:
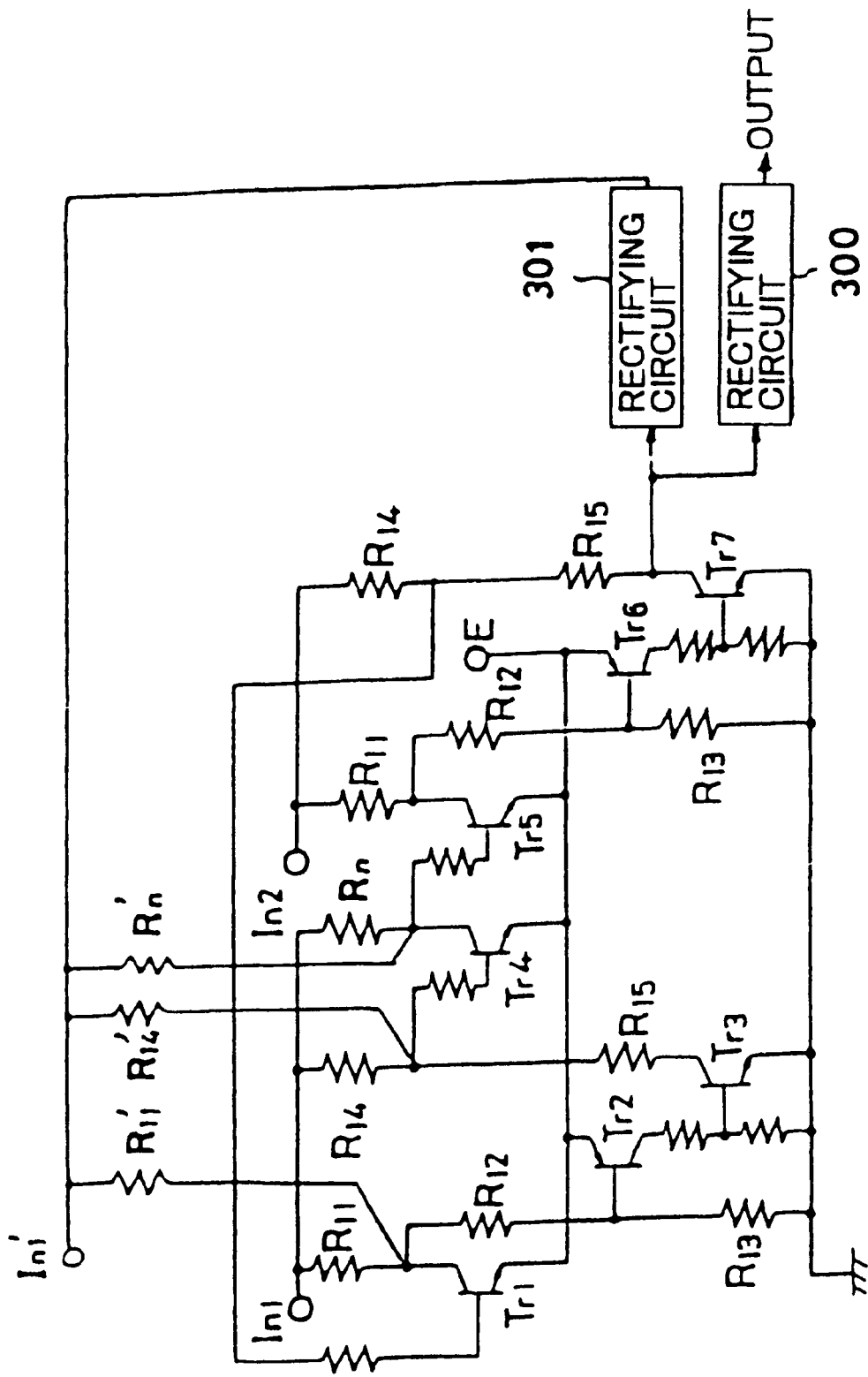
FIG. 22 is another exemplary circuit of a self-hold circuit using the fail-safe window comparator/AND gate of FIG. 21.

In case of constituting a self-hold circuit by utilizing a fail-safe window comparator/AND gate, there may be provided an input terminal $l_{n1}'$ for inputting a feedback signal, different from the input terminal $l_{n1}$ of the trigger signal, to moderate interference between the trigger signal and feedback signal, as shown in FIG. 22.

In the circuit configurations in FIGS. 17 and 18, once the detection signal PT is generated, it continues to be generated unless either the first optical curtain 5 or the second optical curtain 21 is intercepted. As such, the lowering motion of the slide may be repeatedly performed unless the work exchange operation is conducted. To avoid this situation, FIG. 23 shows an example of a circuit configuration for resetting the detection signal PT at each reciprocating motion of the slide.

Figure 23:
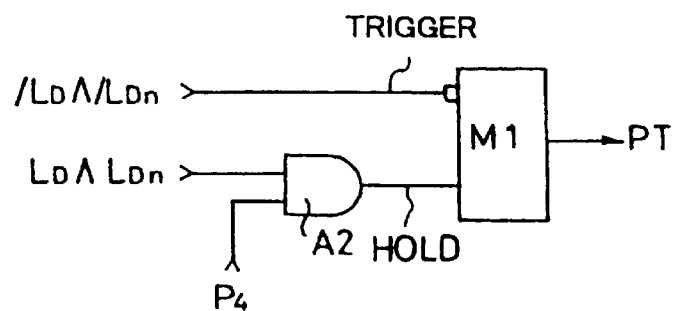
FIG. 23 is a withdrawal detection circuit for resetting a withdrawal detection signal at each reciprocating motion.

In FIG. 23, a signal $P_4$ is a detection signal of the crank angle to be generated at each reciprocating motion of the slide 2 of a crank type press, and becomes OFF (logical value "0") such as at crank angles of from 240° to 270° in the slide rising interval.

Figure 24:
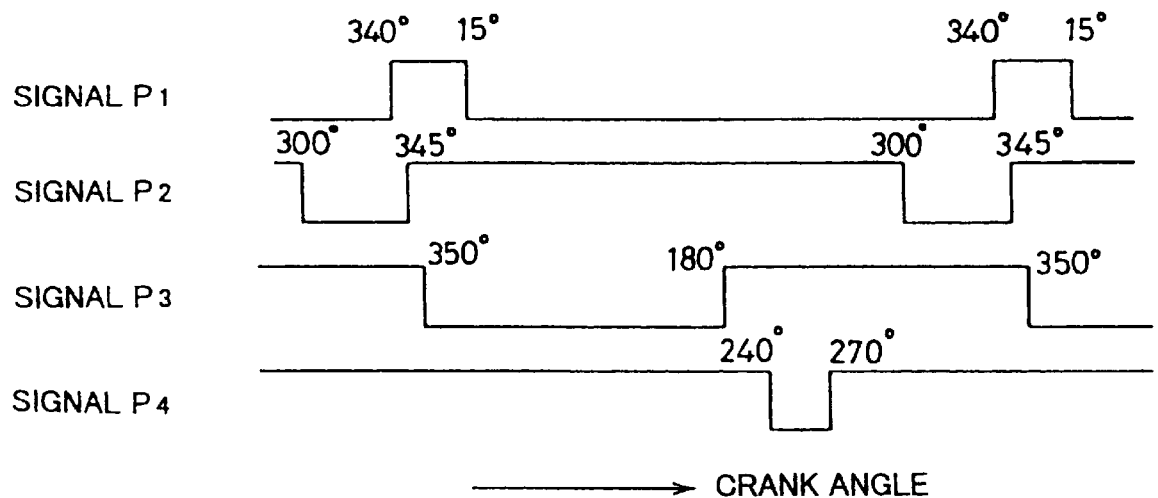
FIG. 24 is a time chart of crank angle detection signals.

In the crank type press, the crank angle may be detected by means of a cam switch. Further, there are generated, corresponding to the crank angle, a signal $P_1$ which indicates that the slide is within a predetermined range (such as at crank angles from 340° to 15° through top dead center) near top dead center (crank angle is 0°), and the output level of which becomes a logical value "1" when the slide is within the predetermined range; a signal $P_2$ for stopping the slide within the predetermined range, and which becomes a logical value "0" when the slide is in another predetermined range (such as at crank angles from 300° to 345°) of the rising interval of the slide; a signal $P_3$ which indicates that the slide is in the rising stroke, and becomes a logical value "1" when the slide is in a predetermined rising interval (such as at crank angles from 180° to 350°); and the aforementioned signal $P_4$ which becomes a logical value "0" in a further predetermined range (such as at crank angles from 240° to 270°) of the rising interval of the slide. FIG. 24 shows a time chart of the signals $P_1$ through $P_4$.

To constitute the detection signal of the crank angle in a fail-safe manner a procedure to rectify an AC signal by a rectifying circuit may be employed. In this case, the high level and low level of output of the rectifying circuit correspond to logical value "1" and logical value "0", respectively. The fail-safe constitution for the detection signal of the crank angle is known from Japanese Unexamined Patent Publication NO. 6-147398.

FIG. 23 shows a constitution for resetting the detection signal PT at each reciprocating motion of the slide in the circuit of FIG. 17, in which the signals $L_D\wedge L_{Dn}$ and $P_4$ are input to an AND gate A2, the logical product output of which is input to a hold input of the self-hold circuit M1. According to such a constitution, the logical product output of the AND gate A2 disappears at each reciprocating motion of the slide so that the detection signal PT from the self-hold circuit M1 is reset. As such, the detection signal PT is generated at each reciprocating motion of the slide. In this case, the AND gate A2 functions as a reset device.

Further in case of the circuit of FIG. 18, the hold terminal of the self-hold circuit M2 may be directly input with the signal $P_4$, and one of the input terminals of the AND gate A1 may be input with the signal $L_D\wedge L_{Dn}$. In this case, the self-hold circuit M2 functions as the resetting device.

Figure 26:
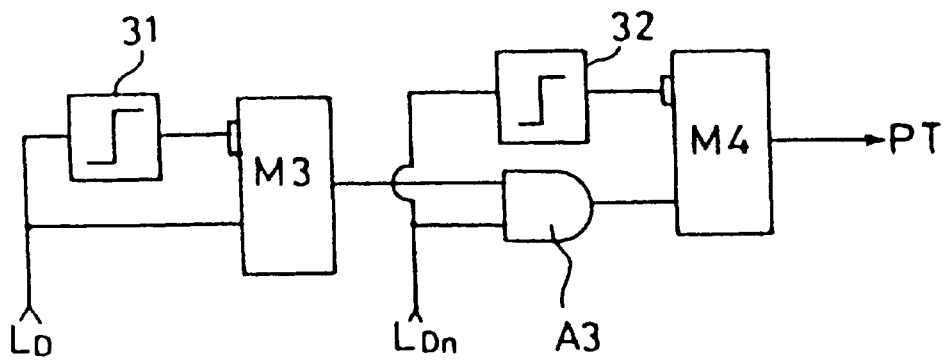
FIG. 26 is a still further withdrawal detection circuit.

Instead of detecting the signal $/L_D\wedge/L_{Dn}=1$, the circuit may be constituted to detect the leading edge of each of signals $L_D$ and $L_{Dn}$, as shown in FIG. 26.

Figure 27:
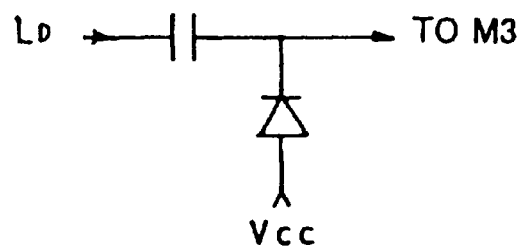
FIG. 27 is a concrete example of a leading-edge detection circuit of FIG. 26.

Namely, in the circuit of FIG. 26, there are provided a leading-edge detection circuit 31 for the signal $L_D$, and a leading-edge detection circuit 32 for the signal $L_{Dn}$. Each of these leading-edge detection circuit 31 and 32 may be a differentiating circuit such as constituted of capacitor and diode shown in FIG. 27. M3 and M4 are self-hold circuits, and A3 is an AND gate.

According to such a constitution, when the operator's hand is withdrawn from the first and second danger zones D and $D_N$ after once entering these zones for a work exchanging operation, the interception of light of the first optical curtain 5 firstly disappears to raise the signal $L_D$ so that the output of self-hold circuit M3 is generated by the output of the leading-edge detection circuit 31. Thereafter, the interception of light of the second optical curtain 21 disappears, so that the logical output of the AND gate A3 is generated by the leading-edge of signal $L_{Dn}$, and the detection signal PT from the self-hold circuit M4 is generated by the output of leading-edge detection circuit 32.

In the apparatus of the present invention, the guard fence 25 of FIG. 15 may be constituted in a manner such as shown in FIG. 28, to clarify notification of the working intention of the operator. Namely, in case of the signal PT of FIGS. 17 and 18, the judgment of entrance of the operator's hand is not taken into consideration. Thus, if a bird has flown into or debris has been thrown into the machine to block the light beam during outdoor operation such as shown in FIG. 15, the operation permission signal for slide actuation may be generated contrary to the operator's intention. To avoid this, the guard fence 25 covers the whole zone of the side surfaces and front surface, except for an opening part 25a which serves as a work insertion zone for the operator. Further, the upper guard fence part of opening part 25a is constituted of a transparent member 25b, such as plastic, to visually confirm the inserted operator's hand. The position of the starting button 24 may be located at a position below the second optical curtain 21 so as not to directly intercept the light beams of the second optical curtain 21 by the operator's hand during manual operation of the starting button 24.

Figure 30:
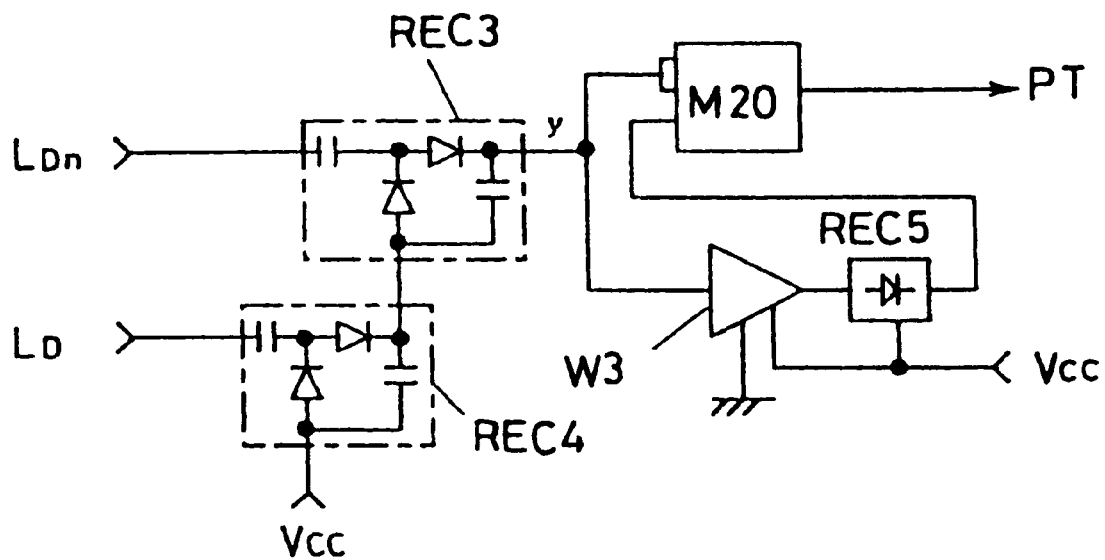
FIG. 30 is still another circuit diagram of a withdrawal detection circuit.
Figure 31:
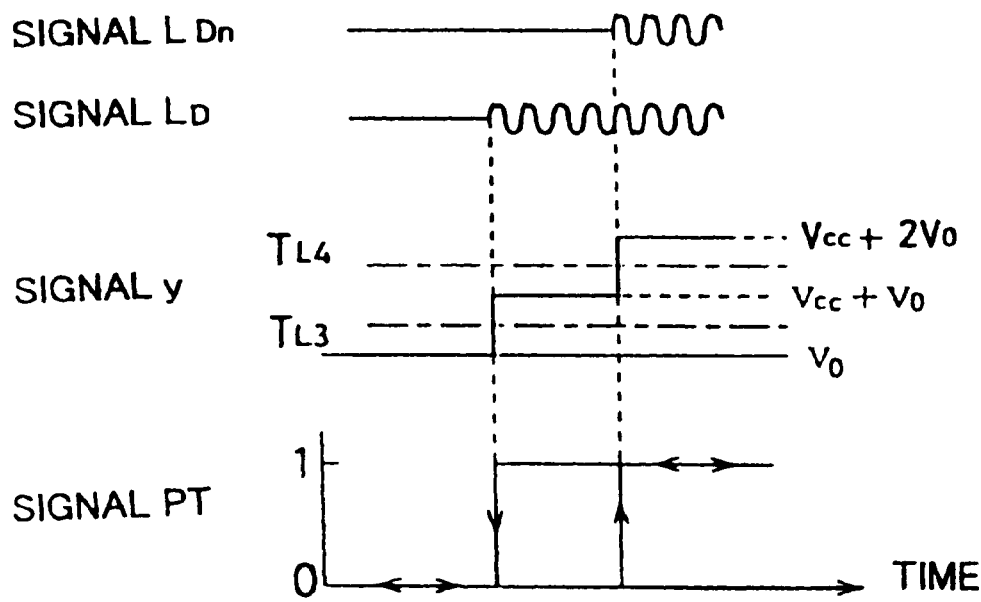
FIG. 31 is a time chart of FIG. 30.

FIGS. 30 and 31 show examples of a withdrawal detection circuit for attaining one cycle operation making use of the first and second optical curtains.

During one cycle operation of a press adopting an operation button, once the operator has pushed the operation button, the slide is automatically moved downwardly so long as the operation permission signal is provided, even though the operator's hand may go over the operation button. Namely, even when the operator's hand enters the danger zone $D_N$ shown in FIG. 2, the slide is moved downwardly, unless the optical curtain 5 for monitoring the danger zone D is intercepted.

FIG. 30 shows an example of a withdrawal detection circuit which is adapted to automatically attain such one cycle operation control.

In FIG. 30, the output signals $L_D$ and $L_{Dn}$ of the first and second optical curtains 5 and 21, respectively, are rectified by the voltage doubler rectifying circuits REC3 and REC4 having constitutions similar to those shown in FIGS. 19 and 20, and the rectified output voltage $V_0$ is superimposedly added with the power supply voltage $V_{cc}$. The output "y" from the voltage doubler rectifying circuit REC3 is input to both a window comparator W3 and the trigger terminal side of a self-hold circuit M20. The output of the window comparator W3 is rectified by a voltage doubler rectifying circuit REC5 to become a hold input of the self-hold circuit M20. Further, the lower limit threshold values $T_{L3}$ and $T_{L4}$ of the window comparator W3 and self-hold circuit M20, respectively, are set such that $V_{cc}<T_{L3}<V_{cc}+V_0$ and $V_{cc}+V_0<T_{L4}<V_{cc}+2V_0$.

In the process of the withdrawal of the operator's hand from the danger zones D and $D_N$, the output signal $L_D$ is firstly resumed and then the output signal $L_{Dn}$ is resumed, as shown in FIG. 31. As such, the output signal "y" of the voltage doubler rectifying circuit REC3 varies in a stepped manner with respect to a change in the outputs of the optical curtains 5, 21, as shown in FIG. 31. Thus, an output from the window comparator W3 is generated when the operator's hand is withdrawn from the danger zone D, and the self-hold circuit M20 is triggered when the hand is withdrawn from the danger zone $D_N$, resulting in generation of the withdrawal detection signal PT indicative of the withdrawal of the operator's hand from both danger zones D and $D_N$. Further, in this circuit, once the withdrawal detection signal PT has been generated, this withdrawal detection signal PT from the self-hold circuit M20 continues to be generated by virtue of the output from the window comparator W3 even if the operator's hand enters the danger zone $D_N$. Thus, the output of self-hold circuit M20 is stopped when the operator's hand enters the danger zone D. Namely, the output signal PT of self-hold circuit M20 has hysteresis for the withdrawal and entrance, as shown in FIG. 31. In other words, the optical curtain 21 dedicatedly reports the withdrawal of the operator's hand as a logical value "1", and the optical curtain 5 reports the entrance of the operator's hand into the danger zone as a logical value "0".

By providing hysteresis for the withdrawal detection signal PT such as in the aforementioned constitution, one cycle operation of the press may be automated.

FIGS. 32 and 33 show examples of a circuit for generating the withdrawal detection signal only when the work setting operation is normally conducted by the operator, taking into consideration the sequence of entrance and withdrawal of the operator's hand during the rising interval of the slide.

In FIG. 32, M21 and M22 are self-hold circuits and 400 is a differentiating circuit for extracting a leading-edge component of the rectified negative output signal of self-hold circuit M20 shown in FIG. 30. Further, the signals $P_1$ and $P_3$ are detection signals for the crank angle shown in FIG. 24, in which the signal $P_1$ becomes ON within the region of a crank angle between 340° and 15°, and the signal $P_3$ becomes ON within the region of a crank angle between 180° and 350°. The self-hold circuit M20 is the same as that shown in FIG. 30.

As shown in the time chart of FIG. 33, the output signal PT of self-hold circuit M20 disappears when the operator's hand enters the danger zone D for work setting to thereby block the optical curtain 5. Thus, a rectified negative output signal PT" rises up, and its differential signal is input to a trigger terminal of the self-hold circuit M21. At this time, if the slide is in the rising interval, a logical sum signal ($P_1 \lor P_3$, the mark "$\lor$" representing logical sum) of the signals $P_1$ and $P_3$ which is input to a hold terminal of the self-hold circuit M21, has a logical value "1". Thus, the self-hold circuit M21 generates an output which is input to a trigger terminal of the self-hold circuit M22. Thereafter, the operator's hand is withdrawn from the danger zone $D_N$ by completing the work setting and the optical curtain 21 generates an output, so that the output signal PT of the self-hold circuit M20 is resumed and input to a hold terminal of the self-hold circuit M22, resulting in generation of a final withdrawal detection signal PT' from the self-hold circuit M22.

According to such a constitution, the final withdrawal detection signal PT' is generated only when the entrance and withdrawal actions of the operator's hand are combinedly conducted within the rising interval (region from 180° to 15°).

There will be explained hereinafter a second embodiment of the present invention.

In this embodiment, automatic actuation control of the slide is permitted if a continuation permission condition exists. A monitoring circuit is provided for monitoring whether this continuation permission condition is satisfied or not, such that the continuation of automatic actuation is permitted when the determined condition is satisfied. The purpose of monitoring the condition of continuation permission is to confirm the operator's intention using information derived from the conventional operation button.

FIG. 34 shows a circuit configuration of the embodiment. Those parts which are identical to the embodiment of FIG. 14 are depicted by the same numerals.

In FIG. 34, a permission condition monitoring device is embodied as a permission condition monitoring circuit 40. The permission condition monitoring circuit 40 monitors whether the continuation permission condition for automatic actuation control of the slide 2 is satisfied or not, and generates an automatic actuation permission signal AS' when such condition is satisfied. This permission condition monitoring circuit 40 is adapted to store an automatic actuation instruction to be set by ON operation of the starting button 24, and by the generation of a continuation permission signal AS indicating that the continuation permission condition is satisfied. The permission condition monitoring circuit 40 also generates an automatic actuation permission signal AS' under the condition that the starting button 24 is OFF.

The automatic actuation permission signal AS' of the permission condition monitoring circuit 40 is input to an automatic actuation control circuit 41. The automatic actuation control circuit 41 generates a sliding operation signal, Op, at every input of the detection signal PT if the automatic actuation permission signal AS' has been generated.

Figure 35:
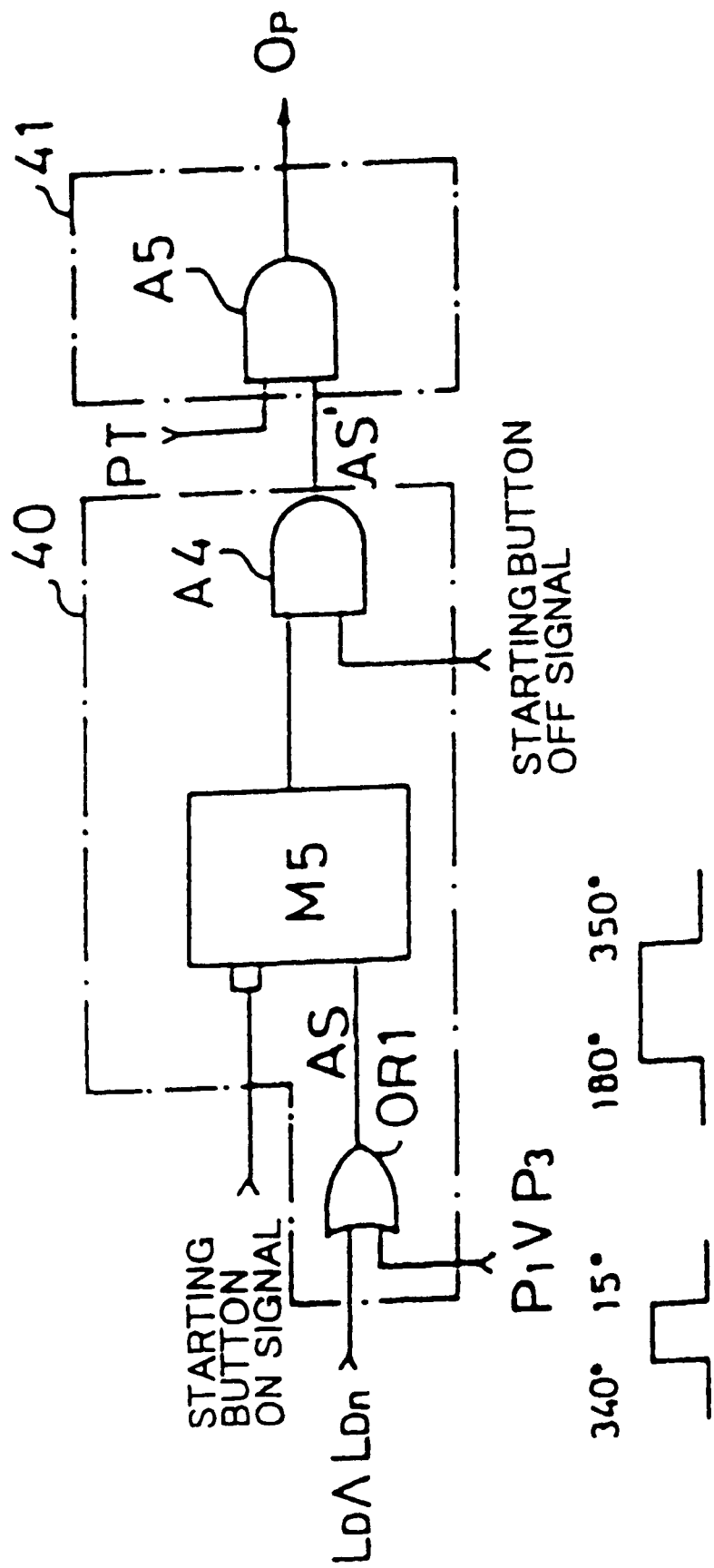
FIG. 35 is a circuit diagram of a permission condition monitoring circuit and an automatic actuation control circuit in the second embodiment.

FIG. 35 shows a circuitry example of the permission condition monitoring circuit 40. In the exemplary embodiment, this circuit 40 is constituted to monitor possibly dangerous movements of the operator such as action to approach the first danger zone D during lowering motion of the slide, as the continuation permission condition.

In FIG. 35, an OR gate OR1 performs a logical sum operation of the signals $L_D \wedge L_{Dn}$ and $P_1 \vee P_3$ (the mark "$\vee$" represents logical sum) to generate the continuation permission signal AS. The signals $P_1$ and $P_3$ are the detection signals of the crank angle, as shown in FIG. 24. The signal $P_1$ becomes ON (logical value "1") within an angle range such as from 340° to 15° near top dead center of the slide, and the signal $P_3$ becomes ON (logical value "1") within an angle range such as from 180° to 350° in the rising interval of the slide as noted above. A self-hold circuit M5 is set by the ON signal (logical value "1") of the starting button 24, and holds this ON signal of the starting button 24 by the output signal from the OR gate OR1. An AND gate A4 performs a logical product operation of the OFF signal of the starting button 24 and the output signal of self-hold circuit M5, and inputs the automatic actuation permission signal AS' to an AND gate A5. This AND gate A5 of the automatic actuation control circuit 41 performs a logical product operation of the automatic actuation permission signal AS' and the detection signal PT, to thereby generate the sliding operation signal, Op.

Since the operator typically conducts a work exchanging action during the rising interval (safe crank angle interval) of the slide, the optical curtains 5, 21 may be intercepted in the range of crank angles between 180° and 15° (logically, generation range of $P_1 \vee P_3 = 1$). Thus, in the range of signal $P_1 \vee P_3 = 1$, even if the signal $L_D \wedge L_{Dn}$, indicative of absence of the human body, is stopped by regarding it as being a normal working action of the operator, the continuation permission signal AS is not stopped, so that the output of the self-hold circuit M5 is self held.

Meanwhile, when the slide 2 has exceeded the crank angle of 15° and is in the lowering stroke (from 15° to 180°), the signal $P_1 \vee P_3 = 0$. At this time, if the first and second optical curtains 5, 21 are blocked due to the entrance of the operator into the danger zone D, this is a dangerous situation. Thus, with disappearance of signal $L_D \wedge L_{Dn}$ ($L_D \wedge L_{Dn} = 0$, i.e., $L_D = 0$ or $L_{Dn} = 0$, i.e., disappearance of $L_D \wedge L_{Dn}$), the continuation permission signal AS from the OR gate OR1 stops. The result is that the output of self-hold circuit M5 stops, so that the automatic actuation permission signal AS' disappears. Thereafter, the sliding operation signal Op is not generated even if the detection signal PT is generated due to withdrawal of the operator from the danger zones D and DN, because of lack of the automatic actuation permission signal AS'. Thus, the automatic actuation operation stops. To conduct the automatic actuation operation thereafter, it is necessary to perform the ON operation of starting button 24 again. This type of driving operation is called "re-actuation prevention control" in terms of press operation, and can be attained in FIG. 35.

In the above, the reason why the OFF signal of starting button 24 is used as a generation prerequisite of the automatic actuation permission signal AS' is to confirm that the generation of the ON signal of starting button 24 is not due to a malfunction of starting button 24. Namely, it is constituted to generate the automatic actuation permission signal AS' only when the starting button 24 is operating normally. Thus, the AND gate A4 functions as a starting button OFF confirming device.

There will be shown hereinafter another example of a circuit for generating the continuation permission signal AS to be input to a hold terminal of the self-hold circuit M5 of FIG. 35.

Figure 36:
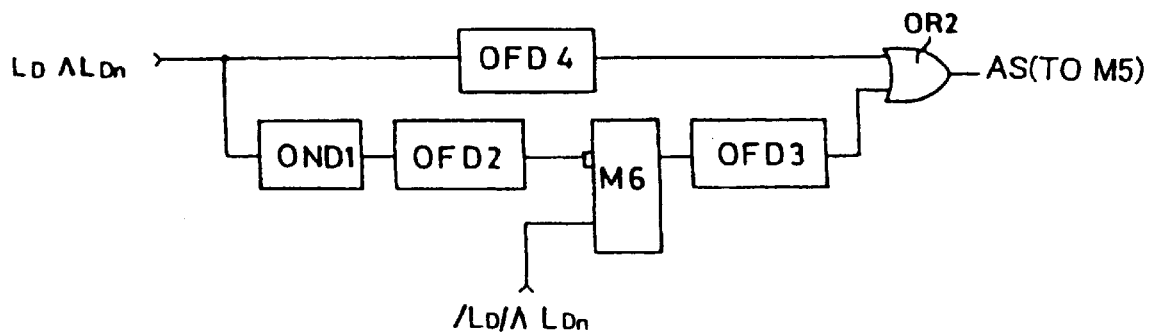
FIG. 36 is another principal circuit diagram of the permission condition monitoring circuit.

FIG. 36 shows an exemplary circuit for generating the continuation permission signal AS by monitoring, as the continuation permission condition, the operator's unexpected action such as immediate re-entrance just after withdrawal. Such an action is unexpected because it is assumed that the work exchanging action is normally completed by a single combination of entrance and withdrawal.

In FIG. 36, OFF delay circuits OFD2, OFD4 establish allowed times T2, T4 of both the optical curtains 5, 21 for altering from light passing state to light interception state. Conversely, an OFF delay circuit OFD3 establishes an allowed time T3 of both the optical curtains 5, 21 for altering from light interception state to light passing state. An ON delay circuit OND1 establishes a time $TD_X$, for the aforementioned continuation permission condition, during which immediate re-entrance is not allowed just after withdrawal.

Figure 37:
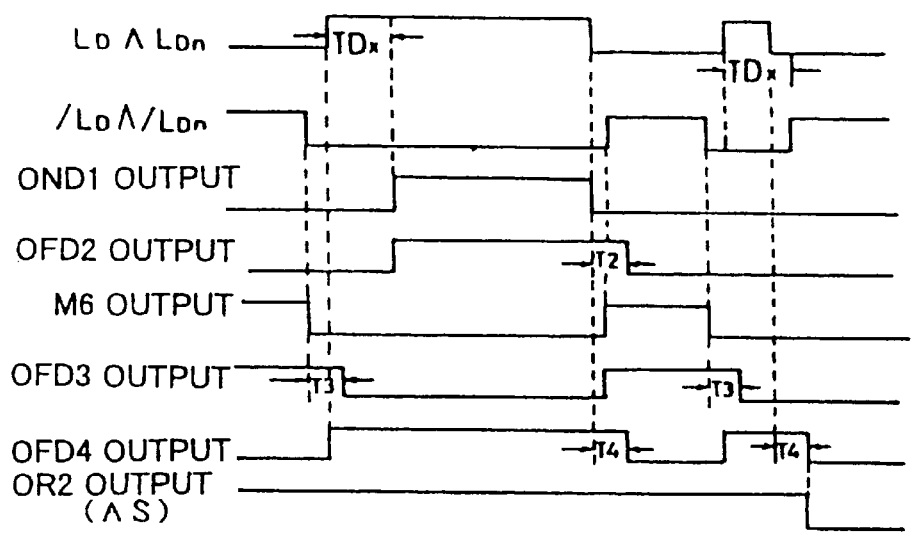
FIG. 37 is an operational time chart of the circuit of FIG. 36.

FIG. 37 shows a time chart of a function of the circuit shown in FIG. 36.

Apparent from FIG. 37, an output of the ON delay circuit OND1 is not generated even by re-entrance ($/L_D \vee /L_{Dn} = 1$) before the lapse of time TDx after withdrawal ($L_D \wedge L_{Dn} = 1$) from the danger zones D and $D_N$. Thus, an output of a self-hold circuit M6 is not generated, so that the continuation permission signal AS disappears upon stoppage of an output of the OFF delay circuit OFD4. In this respect, there are known fail-safe OFF delay circuits such as from International Unexamined Patent Publication WO94/23303 and International Unexamined Patent Publication WO94/23496.

In case of entrance after lapse of the time $TD_X$ after withdrawal from the danger zones D, $D_N$, the output of the ON delay circuit OND1 has been generated; this output is held at the OFF delay circuit OFD2 until the signal $/L_D \wedge /L_{Dn}$ indicative of the presence of the human body becomes ON after the signal $L_D \wedge L_{Dn}$ indicative of the absence of the human body has become OFF, so that the ON of signal $/L_D \vee /L_{Dn}$ leads to generation of output from the self-hold circuit M6. Even by withdrawal thereafter, this output is held at the OFF delay circuit OFD3, until the signal $L_D \wedge L_{Dn}$ becomes ON after the signal $/L_D \vee /L_{Dn}$ becomes OFF. Further, the continuation permission signal AS from an OR gate OR2 is held by the OFF delay circuit OFD4, until the signal $/L_D \vee /L_{Dn}$ becomes ON after the signal $L_D \wedge L_{Dn}$ has become OFF.

Therefore, in a normal work exchanging action of the operator, the continuation permission signal AS from the OR gate OR2 continues to be generated. However, if re-entrance has occurred before the lapse of the predetermined time $TD_X$ after withdrawal from the danger zones D and $D_N$, the continuation permission signal AS disappears upon stoppage of the output of the OFF delay circuit OFD4.

Figure 38:
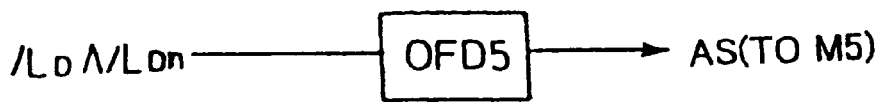
FIG. 38 is still another principal circuit diagram of the permission condition monitoring circuit.
Figure 39:
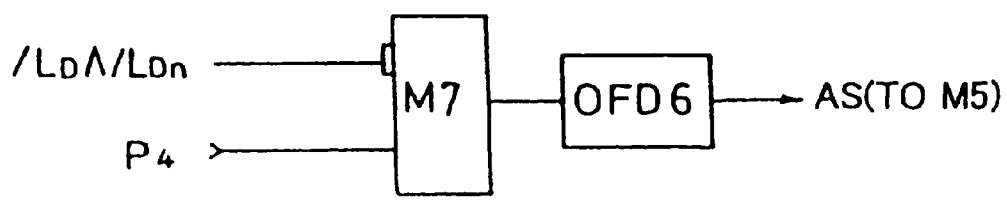
FIG. 39 is yet another principal circuit diagram of the permission condition monitoring circuit.

Shown in FIGS. 38 and 39 are exemplary circuits for monitoring, as the continuation permission condition, that the work is conducted during a predetermined working interval time, to thereby generate the continuation permission signal AS.

The reason for monitoring the working interval time is to avoid that the situation in which the operator may forget that the automatic actuation mode has been established, if the working interval time is longer than duly required. Namely, a work exchanging action (generation of signal $/L_D \wedge /L_{Dn}$ of entrance detection), which is detected after a working interval that is longer than duly required, is not regarded as being the operator's intention.

In FIG. 38, the signal $/L_D \wedge /L_{Dn}$ indicative of the presence of the human body is delayed by an OFF delay circuit OFD5 to thereby generate the continuation permission signal AS. A delay time of the OFF delay circuit OFD5 corresponds to the working time interval, which is to be properly established.

In such a constitution, if the next signal $/L_D \wedge /L_{Dn}$ is not generated within the delay time after the signal $/L_D \wedge /L_{Dn}$ indicative of the presence of the human body is once generated, the continuation permission signal AS is stopped and the self-hold circuit M5 of FIG. 35 is reset so that the automatic actuation permission signal AS' disappears.

FIG. 39 shows an exemplary circuit for monitoring the working time interval, by adopting the detection signal of the crank angle as a timing signal.

In FIG. 39, this circuit is constituted of a self-hold circuit M7 input with the signal $/L_D \wedge /L_{Dn}$ as a trigger input and with the detection signal $P_4$ (which becomes OFF between 240° and 270°) of the aforementioned crank angle as a hold input; and an OFF delay circuit OFD6 for delaying the output stoppage of self-hold circuit M7, for a predetermined period of time.

In such a constitution, an output of self-hold circuit M7 is forcibly reset at the crank angle 240° at each reciprocating motion of the slide. If the starting of the work exchanging action is postponed beyond the delay time established by the OFF delay circuit OFD6 after the resetting of the self-hold circuit M7, the continuation permission signal AS disappears so that the self-hold circuit M5 of FIG. 35 is reset, resulting in disappearance of the automatic actuation permission signal AS'.

Figure 40:
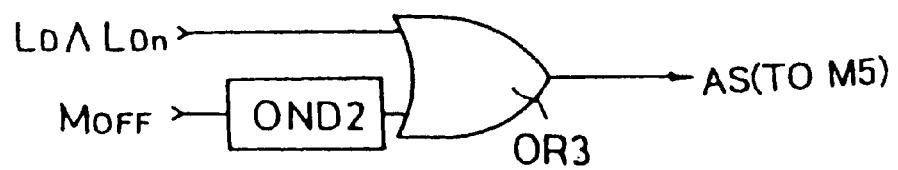
FIG. 40 is still yet another principal circuit diagram of the permission condition monitoring circuit.

FIG. 40 shows an exemplary circuit for monitoring, as the operator's erroneous action, re-entrance just after or simultaneously with the starting of automatic actuation after withdrawal.

In FIG. 40, this circuit is constituted of an ON delay circuit OND2 for delaying an output signal $M_{OFF}$ for a predetermined time, and an OR gate OR3 for operating the logical sum of an output signal of the ON delay circuit OND2 and the signal $L_D \wedge L_{Dn}$. The output signal $M_{OFF}$ becomes a logical value "1" when an electric current does not flow, by means of an output of a current zero sensor which detects that the solenoid valve for actuating the slide 2 is not supplied with electric current. The current zero sensor for generating the output signal $M_{OFF}$ in a fail-safe manner is known from Japanese Unexamined Patent Publication No. 6-201733, and U.S. Pat. No. 5,568,059.

In such a constitution, when re-entrance is performed and the output signal $M_{OFF}$ has ceased due to starting of automatic actuation after withdrawal, an output of OR gate OR3, i.e., the continuation permission signal AS, stops. There is a possibility that, since the slide 2 is suddenly stopped by the entrance of the operator, the output signal $M_{OFF}$ may immediately rise up almost simultaneously with the signal $/L_D \wedge /L_{Dn}$=0 (detection of entrance) to thereby cause the immediate generation of the output of OR gate OR3. As such, there is provided the ON delay circuit OND2 to thereby secure an OFF time when the continuation permission signal AS is turned OFF.

In case the operator, who has just noted an error, enters again after withdrawal, it will be effective, for assuring the safety of the operator, that actuation of the slide after detection of withdrawal be delayed by such an extent that the operation is not hindered.

Figure 41:
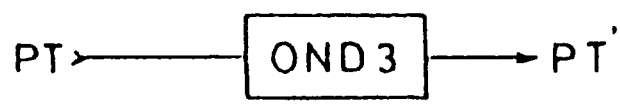
FIG. 41 is a diagram of a circuit for delaying the withdrawal detection signal.

Thus, as shown in FIG. 41, it is advisable to delay the detection signal PT from the withdrawal detection circuit 22 such as shown in FIGS. 14 and 34, by a predetermined period of time, by means of an ON delay circuit OND3 acting as a delay device, to thereby generate the final detection signal PT'.

By virtue of such a constitution, automatic actuation is not started if the operator becomes aware of an operation mistake within the time established by the ON delay circuit OND3.

Figure 42:
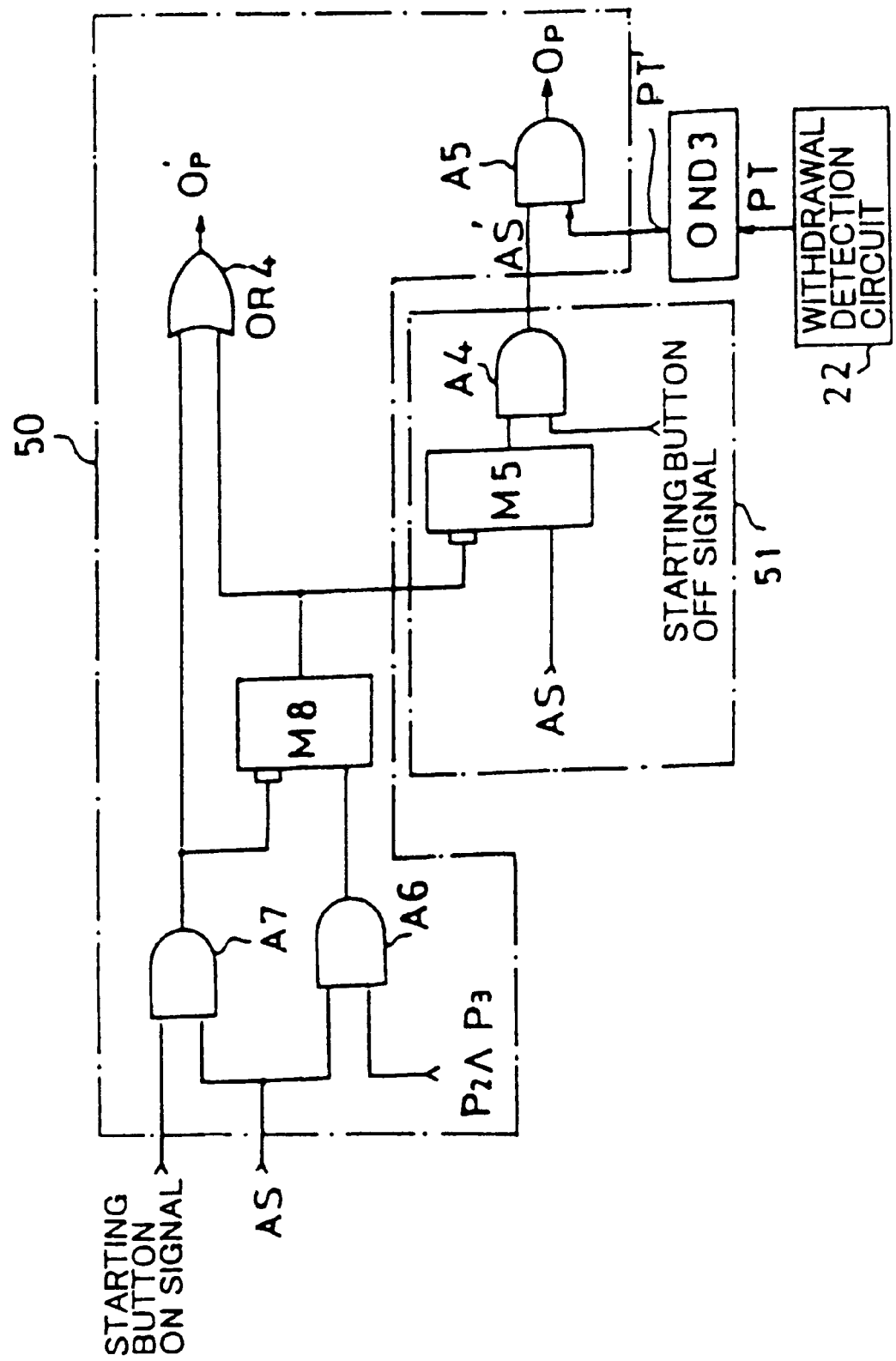
FIG. 42 is a whole circuit diagram of a third embodiment according to the present invention.

Next, FIG. 42 shows a third embodiment of the present invention. This is an example of an automatic actuation control circuit in which the slide 2 is first actuated manually, and then is transferred to automatic actuation after the slide 2 has passed the bottom dead center. Those parts identical with the aforementioned embodiments are designated by the same numerals and the explanations thereof shall be omitted.

In FIG. 42 an automatic actuation control circuit 50 of this embodiment is constituted to comprise three AND gates A5, A6, A7, a self-hold circuit M8, and an OR gate OR4. Although a permission condition monitoring circuit 51 is substantially identical with what is shown in FIG. 35, the trigger terminal of the self-hold circuit M5 is input with a self-holding output signal from the self-hold circuit M8, instead of the ON signal of starting button 24. As described above, the signal $P_2$ is the stop signal for determining the start timing of the brake operation for stopping the slide 2 in the top dead center range (from 340° to 15°), and this signal $P_2$ becomes OFF responsive to the detection signal of the crank angle being, for example, between from 300° and 345°.

According to such a constitution, if the starting button 24 is pushed when the continuation permission signal AS is being generated, an output of the AND gate A7 causes the OR gate OR4 to generate a sliding operation signal Op' as an actuation signal, to thereby start the lowering of the slide 2. At the same time, the trigger terminal of self-hold circuit M8 is also input with the output of the AND gate A7. If the slide 2 has passed the bottom dead center (crank angle 180°), an output of AND gate A6 due to signal $P_2 \wedge P_3$ causes the self-hold circuit M8 to generate an output which is input to the OR gate OR4. Thus, once the slide 2 has passed the bottom dead center, it continues to rise even if the starting button 24 is released. Further, the output of self-hold circuit M8 is also input to the trigger terminal of the self-hold circuit M5. Thus, if the slide 2 passes the bottom dead center under a state that the continuation permission signal AS is generated, the self-hold circuit M5 generates an output. As a result, the automatic actuation permission signal AS' is generated from the AND gate A4, simultaneously with the turning-OFF of starting button 24. The output of self-hold circuit M8 disappears at the time that the signal $P_2$ is made OFF at the crank angle of 300°, so that sliding operation signal Op' based on the manual operation is not generated thereafter from the OR gate OR4.

Thereafter, the sliding operation signal Op is generated as an automatic actuation signal from the AND gate A5, based on the withdrawal detection signal PT to be generated by the withdrawal detection circuit 22 for each work exchange of the operator, resulting in transference to automatic actuation operation control.

In this case, the AND gate A7 and OR gate OR4 cooperatively constitute a manual actuation signal generation device, and the AND gates A5, A6 and self-hold circuit M8 cooperatively constitute an automatic actuation signal generation device.

Figure 43:
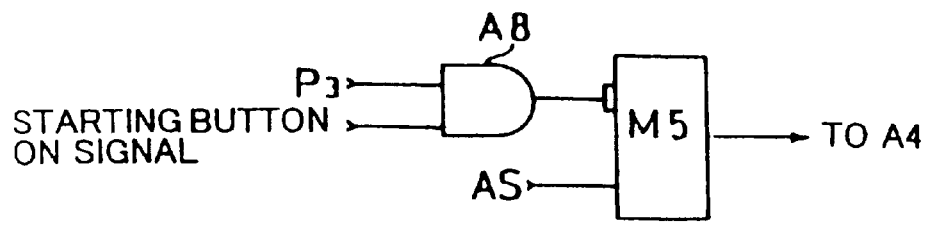
FIG. 43 is a simplified principal circuit diagram of the circuit of FIG. 42.

The circuit of FIG. 42 may be simplified into an example shown in FIG. 43. Namely, the self-hold circuit M8 and AND gate A6 of FIG. 42 may be omitted, and the trigger terminal of self-hold circuit M5 is input with, via the AND gate A8, the logical product output of the ON signal of starting button 24 and the signal $P_3$. Thus, by ON operation of starting button 24, the self-hold circuit M5 is caused to generate an output to thereby cause the automatic actuation permission signal AS' to be generated. Although not shown, the ON signal generated by the ON operation of starting button 24 may be directly provided as a manual sliding operation signal Op'.

Figure 44:
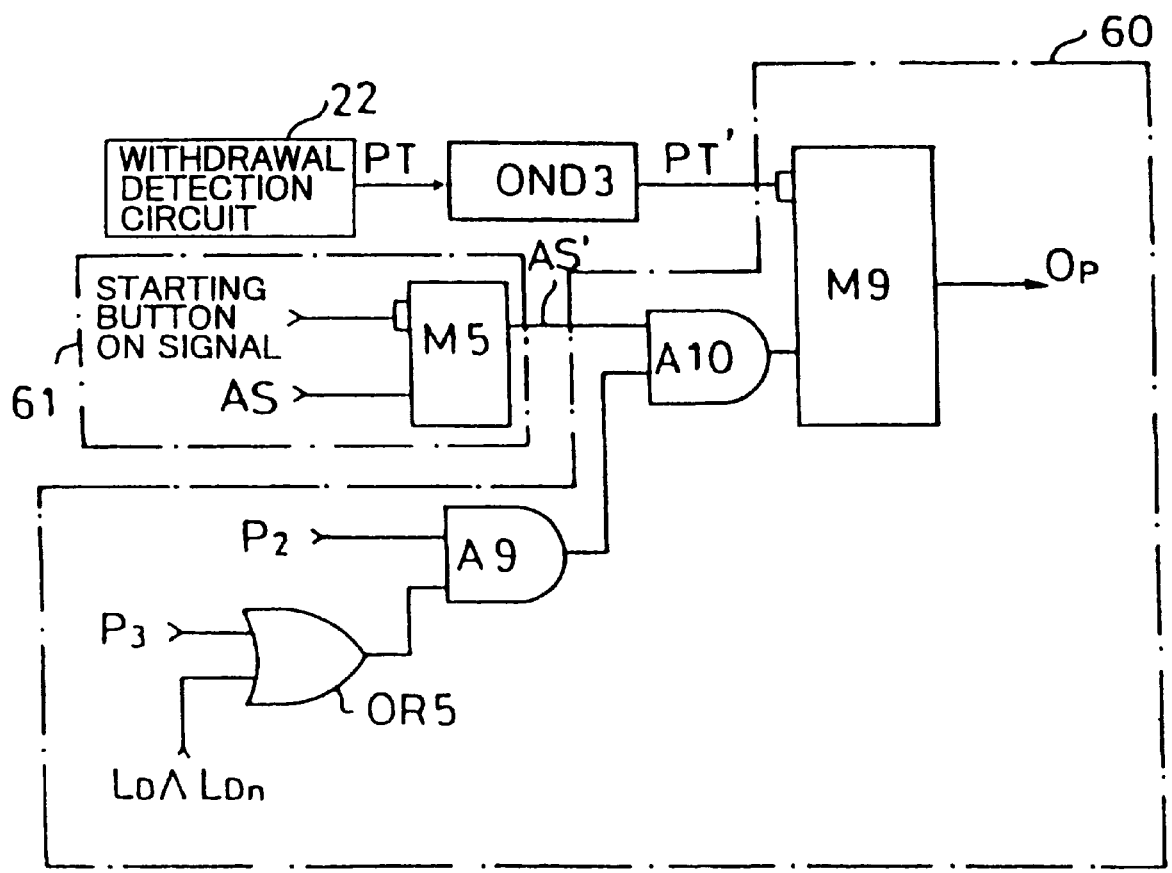
FIG. 44 is a whole circuit diagram of a fourth embodiment according to the present invention.

Next, FIG. 44 shows a fourth embodiment of the present invention. This embodiment is an example of an automatic actuation control circuit in which the transference to automatic actuation control is performed after the slide is manually actuated by the starting button 24. Those parts identical with the aforementioned embodiments are designated by the same numerals and the explanations thereof shall be omitted.

In FIG. 44, this embodiment includes an automatic actuation control circuit 60 constituted of AND gates A9, A10, a self-hold circuit M9, and an OR gate OR5. Similar to FIG. 35, the permission condition monitoring circuit 61 is constituted such that the automatic actuation permission signal AS' is generated by triggering the self-hold circuit M5 by ON operation of the starting button 24. The signals $P_2$ and $P_3$ are detection signals of the crank angle, as described above.

In such a constitution, the detection signal PT is generated from the withdrawal detection circuit 22, and an output is generated from the AND gate A9 by an output of OR gate OR5, if the operator has completed a work exchanging action and the withdrawal from the first and second danger zones D and $D_N$ is effected, under a state of slide 2 normally stopping or staying at the predetermined range of top dead center. If the continuation permission signal AS has been generated when starting button 24 is turned ON under this state, the automatic actuation permission signal AS' is generated from self-hold circuit M5 so that the self-hold circuit M9 generates a sliding operation signal Op, as an automatic actuation signal, by an output of AND gate A10, thereby causing the lowering of slide 2.

Thereafter, the self-hold circuit M9 is reset every OFF of the signal $P_2$. However, the automatic actuation permission signal AS' is self-held insofar as the continuation permission signal AS is kept generated. Thus, the sliding operation signal Op is generated at each generation of detection signal PT by the respective completion of a work exchanging operation, so that the transference to automatic actuation operation control is performed. Upon this occasion, if the operator enters the first and second danger zones D and $D_N$ during the lowering of the slide (signal $P_3$ is OFF), the output of OR gate OR5 is stopped so that the sliding operation signal Op is immediately stopped.

In FIG. 44, if the circuit is constituted such that the OR gate OR5 is input with the signal $L_D$ instead of the signal $L_D$ $L_{Dn}$, it becomes possible to perform an automatic operation control by means of one cycle operation in which entrance in the second danger zone $D_N$ is permitted during the lowering of the slide.

Figure 45:
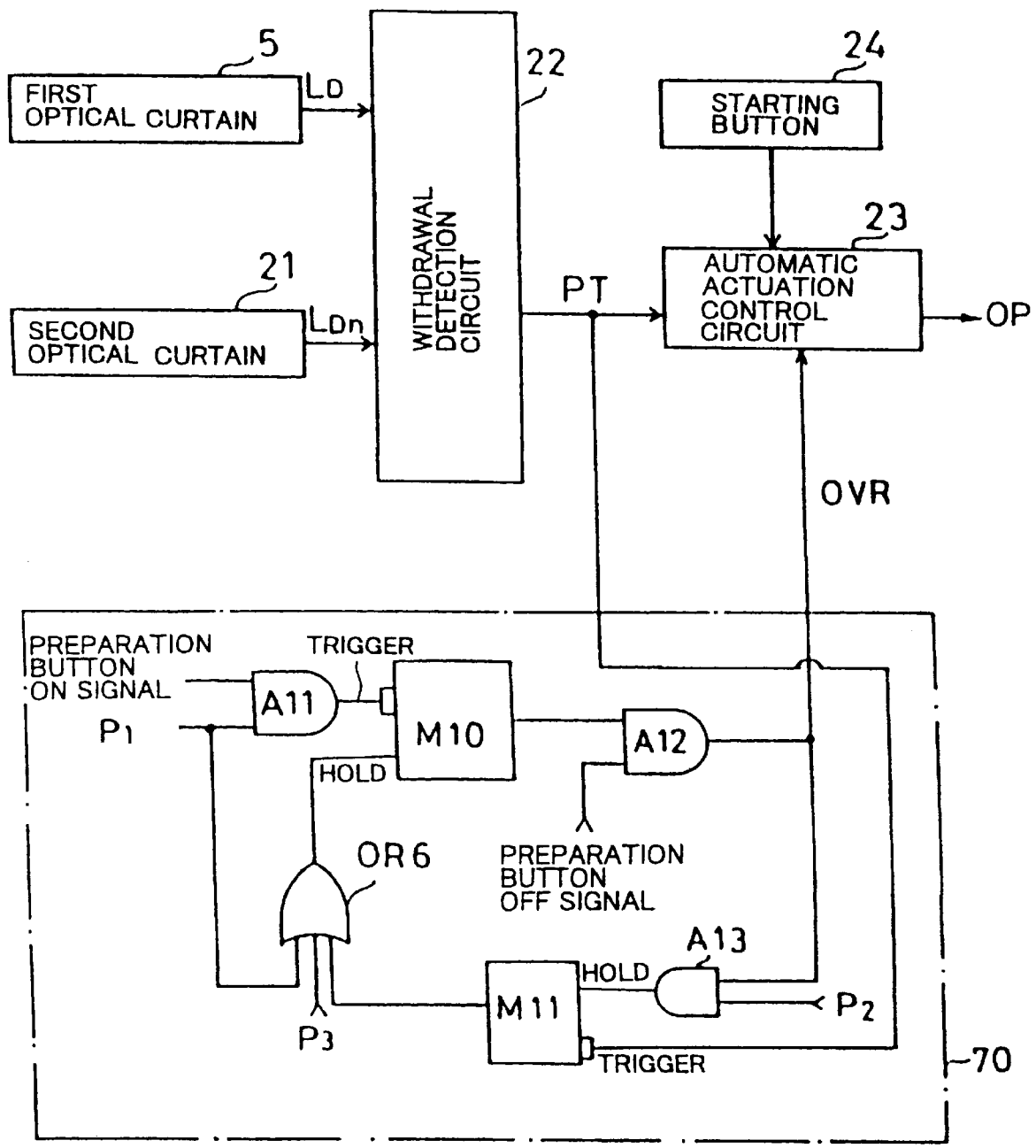
FIG. 45 is a whole circuit diagram of a fifth embodiment according to the present invention.

Next, FIG. 45 shows a fifth embodiment of the present invention. This embodiment is established by adding an overrun monitoring circuit, making use of withdrawal detection, to the constitution of FIG. 14. Those elements identical with FIG. 14 are designated by the same numerals and the explanation thereof shall be omitted.

In FIG. 45, there is provided an overrun monitoring circuit 70 constituted of self-hold circuits M10, M11, AND gates A11, A12, A13, and an OR gate OR6. The AND gate A11 is input with an ON signal of preparation button (not shown) and the signal $P_1$. An output of AND gate A11 is input to a trigger terminal of the self-hold circuit M10. The OR gate OR6 is input with the signals $P_1$, $P_3$ and an output of the self-hold circuit M11, and an output of OR gate OR6 is input to a hold terminal of the aforementioned self-hold circuit M10. An output of self-hold circuit M10 is input to one of the input terminals of AND gate A12, and another input terminal of AND gate A12 is input with an OFF signal of the preparation button. An output of AND gate A12 is input, as a brake normality signal OVR, to the automatic actuation control circuit 23, and to one of the input terminals of AND gate A13. The other input terminal of AND gate A13 is input with the signal $P_2$. An output of AND gate A13 is input to a hold terminal of the self-hold circuit M11, and a trigger terminal of the self-hold circuit M11 is input with the detection signal PT from the withdrawal detection circuit 22. This withdrawal detection circuit 22 is provided with the circuit configuration shown in FIG. 23 or FIG. 25, and the detection signal PT is reset at each reciprocating motion of the slide.

The preparation button is provided, separately from the starting button 24 for starting the slide actuation, so as to set the slide actuation control after turning on the power supply.

There will be explained its operation hereinafter.

When the slide 2 stops in the range of top dead center (crank angle from 340° to 15°) and the signal $P_1$ is in an ON state, the AND gate A11 generates an output if the preparation button is pushed. Since the hold terminal of the self-hold circuit M10 is being applied with the output of OR gate OR6 by virtue of the signal $P_1$, the output from the self-hold circuit M10 is generated. If the preparation button is appropriately turned OFF, this OFF signal causes the AND gate A12 to generate the brake normality signal OVR which is input to the automatic actuation control circuit 23. This brake normality signal OVR is also input to the AND gate A13. Since the signal $P_2$ (OFF at crank angle from 300° to 345°) is ON at this time, an output is generated from the AND gate A13. Further, the detection signal PT of the withdrawal detection circuit 22 causes the self-hold circuit M11 to generate an output which is input, via OR gate OR6, to the hold terminal of the self-hold circuit M10, so that the self-hold circuit M10 keeps its output.

During generation of the brake normality signal OVR, the automatic actuation control circuit 23 automatically actuates the slide 2 based on the generation of detection signal PT, to thereby start the lowering motion of the slide. The signal $P_1$ becomes OFF due to the lowering of slide 2. However, the self-hold circuit M11 is held by the signal $P_2$ during the lowering of the slide, and the output of self-hold circuit M10 is kept so that the brake normality signal OVR is kept generated.

When the slide 2 reaches the position of crank angle 300°, the function of the brake is operated and then the signal $P_2$ becomes OFF. Since the detection signal PT has been already reset to disappear, the output of self-hold circuit M11 is stopped. From that time on, however, the output of self-hold circuit M10 is kept generated by the signals $P_3$ (ON at crank angle of 180° to 350°) and $P_1$. If the function of the brake is normal, the slide 2 stops in the range of top dead center (ON range of signal $P_1$). As such, the output of self-hold circuit M11 is generated again, by the completion of the work exchanging action while the self-hold circuit M11 is held by the signal $P_1$. Thus, if the brake function is normal, the brake normality signal OVR is kept generated, and the automatic actuation of slide 2 is performed by the automatic actuation control circuit 23 for each input of the detection signal PT.

In case that the slide 2 does not stop within the range of crank angle 15° due to abnormality of the brake function, the output of self-hold circuit M10 disappears simultaneously with the OFF of signal $P_1$. Thus, the brake normality signal OVR from the AND gate A12 also disappears, to thereby stop the slide automatic actuation control of the automatic actuation control circuit 23. To resume the sliding operation, it is necessary to manually operate the preparation button to thereby generate the brake normality signal OVR.

Figure 46:
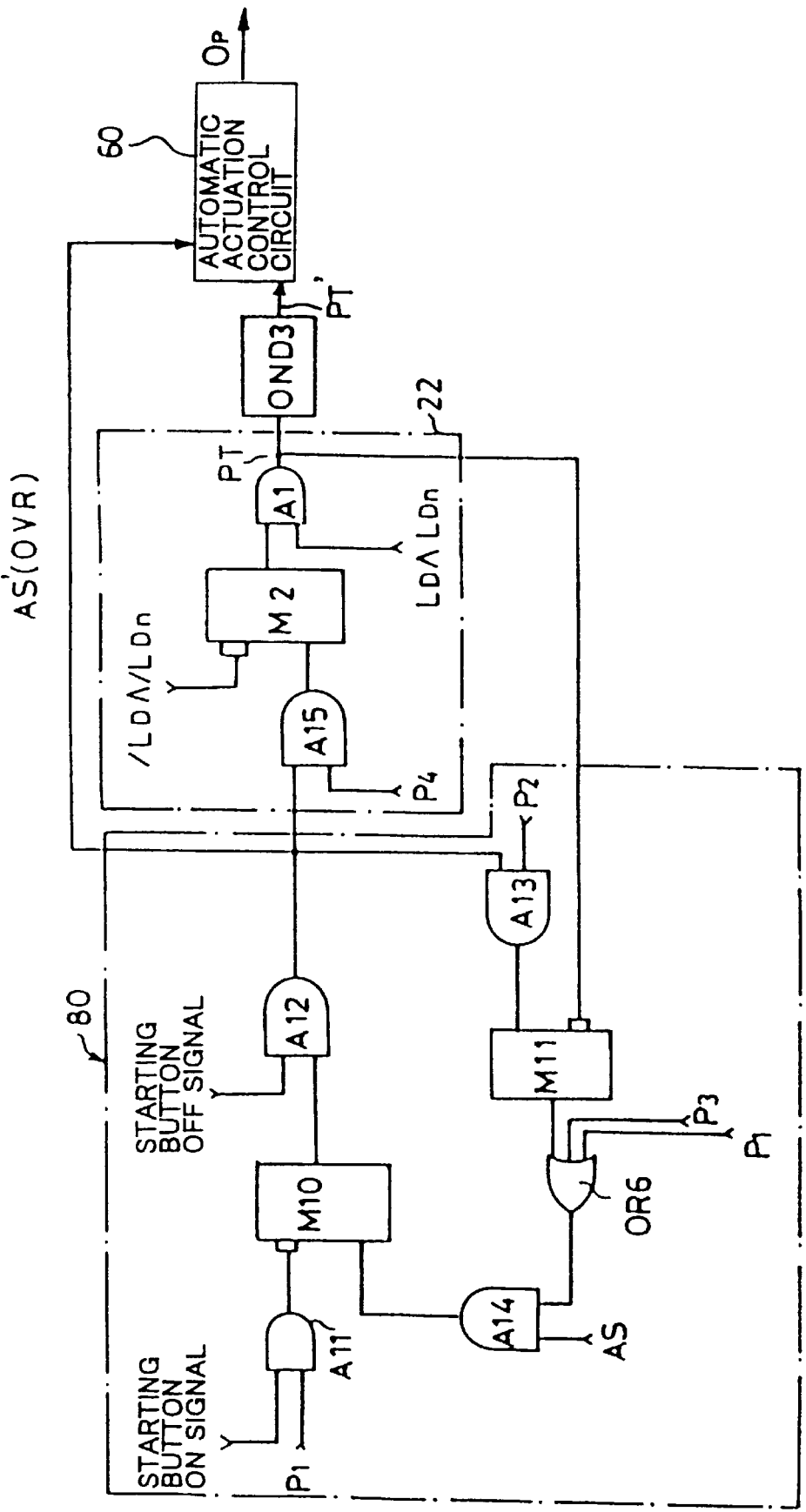
FIG. 46 is a whole circuit diagram of a sixth embodiment according to the present invention.

Next, FIG. 46 shows a sixth embodiment of the present invention. This embodiment is constituted to initiate automatic actuation control from the first, by including the brake normality signal OVR from an overrun monitoring circuit into the permission condition for continuation of automatic actuation.

In FIG. 46, there is provided a permission condition monitoring circuit 80 which includes the overrun monitoring function as described in relation to FIG. 45, and generates the automatic actuation permission signal AS' by including the overrun monitoring into the continuation permission condition.

Namely, this circuit is constituted by modifying the circuit in FIG. 45 such that the overrun monitoring circuit is augmented with an AND gate A14, one of the inputs of the AND gate A14 is input with the output of OR gate OR6, the other input of the AND gate A14 is input with the continuation permission signal AS which is obtained from any of the FIGS. 35, 36, 38, 39 and 40, or any combination thereof, and the output of the AND gate A14 is input to the hold terminal of the self-hold circuit M10. Thus, the output signal of the AND gate A12 functions as the automatic actuation permission signal AS' which includes the brake normality signal OVR as the continuation permission condition. It is noted that in this embodiment, the ON signal and OFF signal of the starting button are input to the AND gate A11 and the AND gate A12, respectively, instead of the preparation button in FIG. 45.

Figure 25:
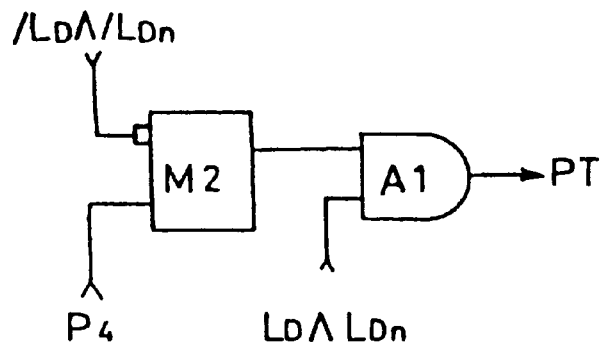
FIG. 25 is another withdrawal detection circuit for resetting a withdrawal detection signal at each reciprocating motion.

The withdrawal detection circuit 22 is constituted in a same manner as shown in FIG. 25, except that the hold input of the self-hold circuit M2 is input with an output of the AND gate A15 which performs a logical product operation of the automatic actuation permission signal AS' and the signal $P_4$.

Further, by the input of the final detection signal PT' based on the automatic actuation permission signal AS' and the withdrawal detection signal PT, the automatic actuation operation control of slide 2 is executed by the automatic actuation control circuit 60 of FIG. 44.

In such a constitution, the automatic actuation permission signal AS' including the brake normality signal OVR is generated from the AND gate A12, when the starting button 24 is turned OFF after its ON operation, under a state that the continuation permission signal AS is being generated because of satisfaction of the continuation permission condition. Then, the withdrawal detection signal PT is generated by the completion of the work exchanging action of the operator, to thereby set the self-hold circuit M11. Then, when the final detection signal PT' is generated via the ON delay circuit OND3, the automatic actuation operation control of slide 2 is started by the operation signal, Op, from the automatic actuation control circuit 60.

According to such a constitution, if the continuation permission condition is not established or the slide 2 has overrun, the output of the self-hold circuit M10 disappears to stop the automatic actuation permission signal AS' from the AND gate A12 to thereby stop the automatic actuation operation. To resume the automatic actuation operation control, it is necessary to operate the starting button 24.

In the above, if the optical curtain signal to be input to the OR gate OR5 of the automatic actuation control circuit 60 is the signal $L_D$, the one cycle operation control is performed in which the entrance into the second danger zone $D_N$ is permitted during the lowering motion of the slide. If the optical curtain signal to be input to OR gate OR5 is the signal $L_D \wedge L_{Dn}$, safety one cycle operation control is performed in which the entrance even into the second danger zone $D_N$ is not permitted during the lowering motion of the slide.

Figure 47:
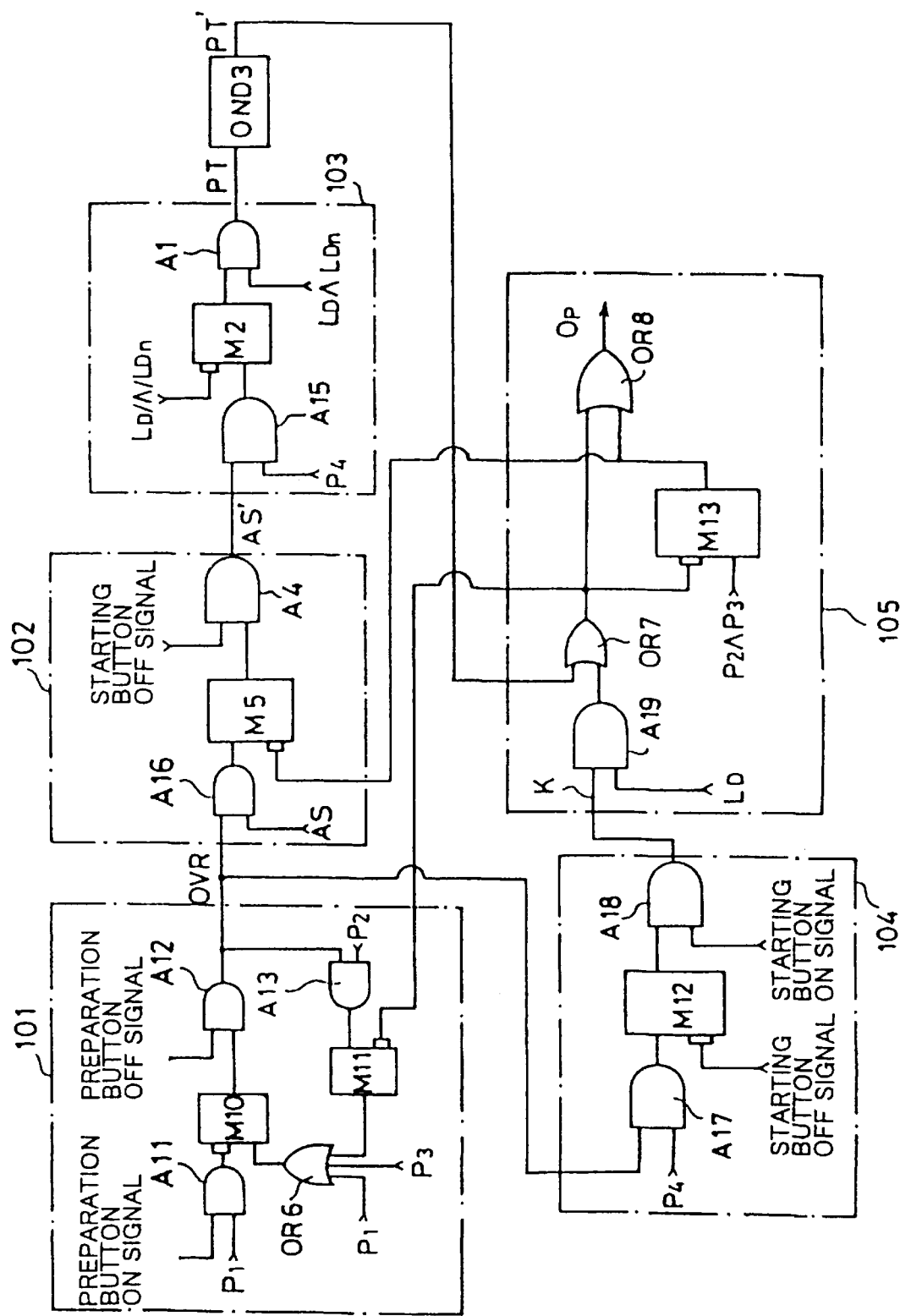
FIG. 47 is a whole circuit diagram of a seventh embodiment according to the present invention.

Next, FIG. 47 shows a seventh embodiment of the present invention. This embodiment is adapted to be used for either of manual/automatic operation in a switchable manner therebetween, whether an automatic actuation control in which a first actuation is manually effected, and the transference to the automatic actuation operation is performed at the time the slide has passed the bottom dead center, or a manual actuation operation by a manual actuation circuit. Those parts identical with the aforementioned embodiments are designated by the same numerals and the explanations thereof shall be omitted.

In FIG. 47, the automatic sliding operation control apparatus for a press according to this embodiment is constituted to comprise an overrun monitoring circuit 101, a permission condition monitoring circuit 102, a withdrawal detection circuit 103, a manual actuation circuit 104, and an automatic actuation control circuit 105 which also generates the manual actuation operation signal.

The overrun monitoring circuit 101 has a constitution like that shown in FIG. 45, except that the trigger input of the self-hold circuit M11 is an output from an OR gate OR7 of the automatic actuation control circuit 105 to be described later. The OR gate OR7 is input with the final detection signal PT' based on the detection signal PT of the withdrawal detection circuit 103 to be described later. Thus, this overrun monitoring circuit 101 is also constituted to perform the overrun monitoring, making use of the detection signal PT'.

The permission condition monitoring circuit 102 has a constitution like the circuit shown in FIG. 35, except for the input signal of the self-hold circuit M5. The self-hold circuit M5 has a trigger terminal input with an output of the self-hold circuit M13 of automatic actuation control circuit 105, and a hold terminal input with an output from an AND gate A16 which output is a logical product of the brake normality signal OVR and the continuation permission signal AS. Thus, the condition as to whether the brake function is normal or not, is included in the continuation permission condition of automatic operation.

The withdrawal detection circuit 103 is the same as the circuit 22 shown in FIG. 46.

The manual actuation circuit 104, acting as a manual actuation device, is constituted to comprise AND gates A17, A18 and a self-hold circuit M12. The AND gate A17 calculates a logical product of the signal $P_4$ and the brake normality signal OVR. The self-hold circuit M12 has a trigger terminal input with the OFF signal of starting button 24, and a hold terminal input with an output of the AND gate A17. The AND gate A18 performs a logical product operation of an output of self-hold circuit M12 and the ON signal of starting button 24. Thus, a manual actuation signal K is generated by the ON operation of starting button 24, under the condition that the slide 2 is not overrunning.

The automatic actuation control circuit 105 is constituted to comprise an AND gate A19, OR gates OR7, OR8, and a self-hold circuit M13. The AND gate A19 performs a logical product operation of the manual actuation signal K and the signal $L_D$ of the first optical curtain 5. The OR gate OR7 performs a logical sum operation of the detection signal PT' from the ON delay circuit OND3 and an output of the AND gate A19. The self-hold circuit M13 has a trigger terminal input with an output of the OR gate OR7, and a hold terminal input with a logical product signal $P_2 \wedge P_3$ of the signals $P_2$ and $P_3$. The OR gate OR8 performs a logical sum operation of the output of OR gate OR7 and that of self-hold circuit M13 to thereby generate the sliding operation signal Op. Thus, at the time of manual actuation, the sliding operation signal Op is manually generated based on the output from OR gate OR7, for each ON operation of starting button 24. Further, at the time of automatic control, the sliding operation signal Op according to the automatic control is generated for every generation of the withdrawal detection signal PT' from the ON delay circuit OND3.

The changeover between automatic actuation operation and manual actuation operation can be performed by turning ON/OFF of a power switch (not shown) of the second optical curtain 21. Namely, by turning ON/OFF of the second optical curtain 21, generation of signal $L_{DN}$ of the second optical curtain 21 can be controlled. The detection signal PT' is generated under turning ON of the second optical curtain 21 so that automatic control is possible, and the detection signal PT' can not be generated under turning OFF so that automatic actuation is impossible. Thus, the power switch of the second optical curtain 21 performs the function of a switching device.

There will be explained the operation hereinafter.

Firstly, there is explained about the automatic actuation control.

The first slide actuation is performed by the ON operation of starting button 24. If the slide 2 is stopping at the correct position, the manual actuation signal K is generated from the AND gate A18 of the manual actuation circuit 104, by the ON operation of starting button 24. The generation of manual actuation signal K causes the AND gate A19 to generate its output, so that the sliding operation signal Op is generated from the OR gate OR8 via OR gate OR7, to thereby start the actuation of slide 2. At the same time the self-hold circuit M11 of overrun monitoring circuit 101 is set to generate its output.

If the slide 2 has passed the bottom dead center, the output of self-hold circuit M13 of automatic actuation control circuit 105 is self-held by the signal $P_2 \wedge P_3$, so that the slide automatically moves upwardly. Further, the output of the self-hold circuit M5 of permission condition monitoring circuit 102 is generated by the output of the self-hold circuit M13, so that the automatic actuation permission signal AS' is generated from the AND gate A4 if the starting button 24 is OFF. If the second optical curtain 21 is in an operative condition, transfer is made to automatic actuation control, such that the sliding operation signal Op is automatically generated from the OR gate OR8 via OR gate OR7, by the generation of withdrawal detection signal PT' to be generated each time the operator's work exchanging operation is completed.

In case of manual actuation operation, the power supply of the second optical curtain 21 is turned OFF. As a result, the detection signal PT' is not generated. Thus, if the brake normality signal OVR is being generated, the sliding operation signal op is generated simply by the operator's operation of starting button, and is reset by the signal $P_2$ at each reciprocating motion of the slide 2. Therefore, there manual operation can be executed by virtue of the starting button operation at each reciprocating motion of the slide.

Next, the constitution of the optical curtain used in this apparatus is described.

The light emitter and light receiver of the optical curtain have certain directivities, respectively. As such, when a reflection plate C (such as a mirror) is located at a position a certain distance "d" from a center axis between light emitter A and light receiver B, which oppose each other at a distance "r", the light can be received from a place which is not on the center axis of the emitter A and receiver B, due to the reflected light from reflection plate C. It is known that the light to be reflected by the reflection plate C and then received by the light receiver B is interpreted as if the light emitter A is located at a position A', depicted by a dotted line in FIG. 48, over the reflection plate C.

Figure 48:
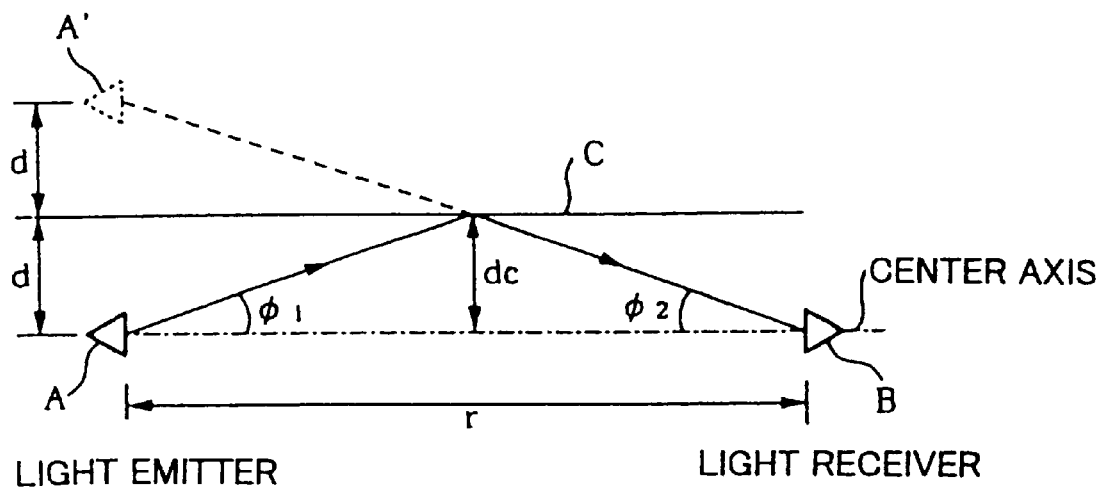
FIG. 48 is an explanatory view of a state of light reception when a reflection plate is positioned in parallel with a center axis connecting light emitter and receiver.
Figure 49:
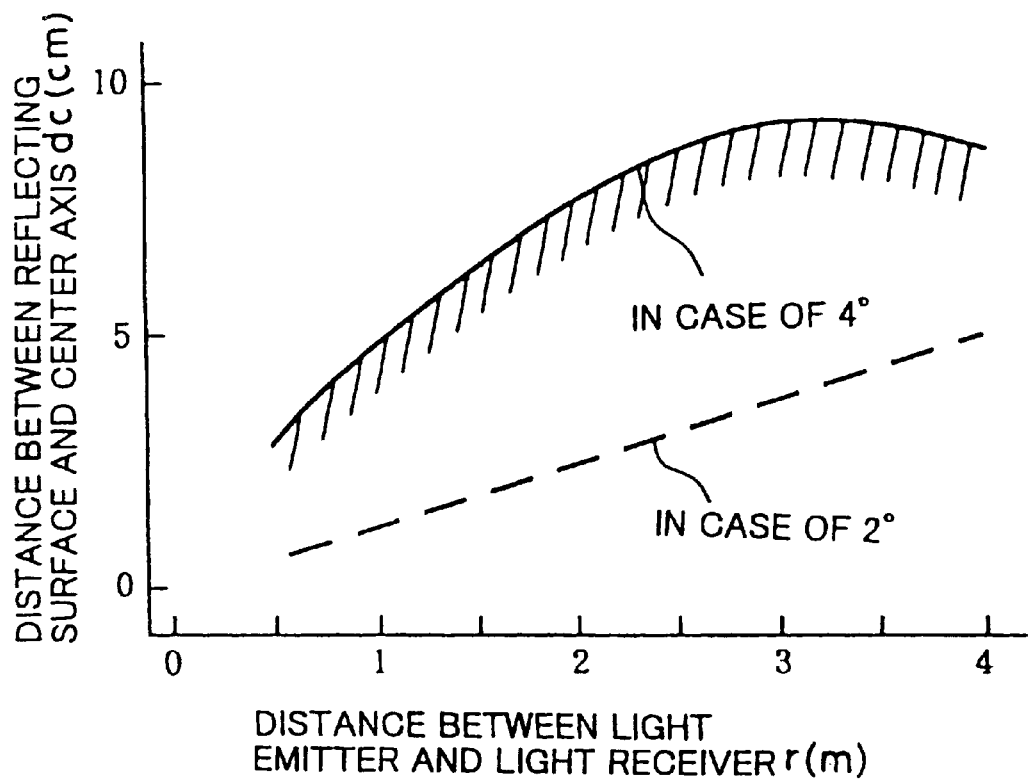
FIG. 49 is a graph showing a relationship between a directivity of the light emitter and receiver, a reflection plate distance, and a distance between light emitter and receiver.

FIG. 49 shows a measured result of a relationship between the distance dc from the center axis of reflection plate C and the distance "r" between the light emitter A and light receiver B where the reception level of the light receiver B is lowered by 14 dB when the mirror like reflection plate C is located in a manner shown in FIG. 48, while adopting an optical curtain which Indicates that "Light Is not received" when the reception level on the center axis of light receiver B has lowered by 14 dB. In each case the directivity angles of light emitter A and light receiver B are 4° and 2° by half-value angle, respectively.

As apparent from FIG. 49, it is understood that the larger the distance "r", between light emitter and receiver is, and the lower or inferior the directivities of light emitter and receiver is, the larger the distance dc from the center axis becomes.

Figure 50:
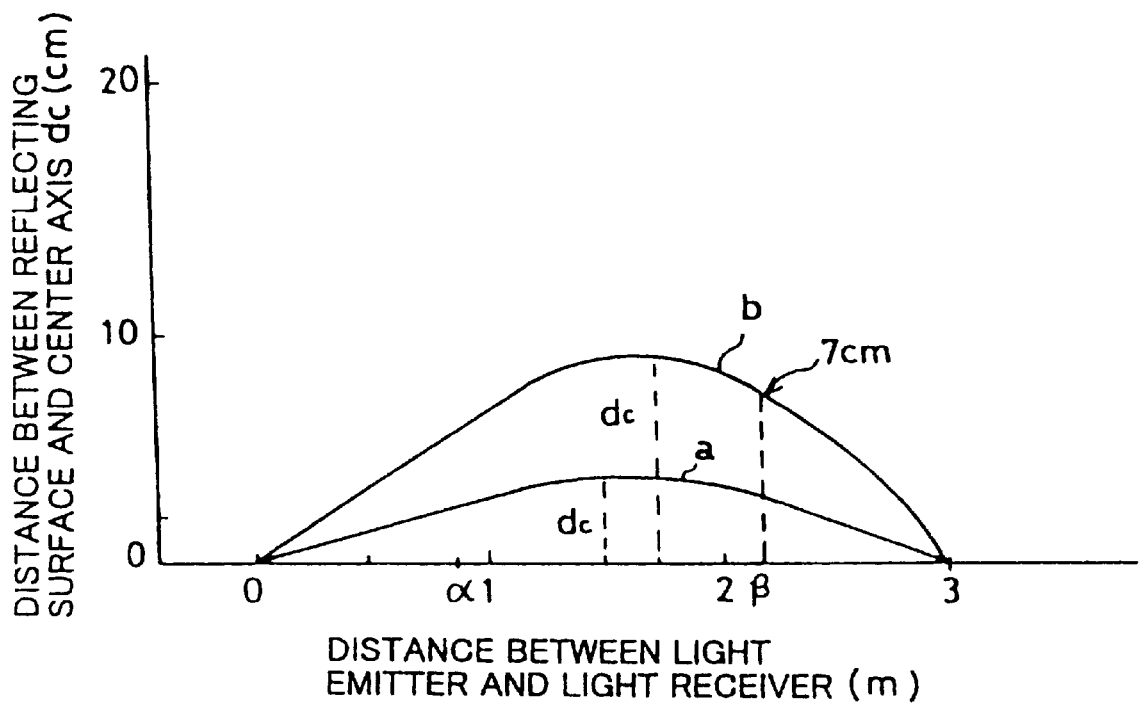
FIG. 50 is a graph showing a measurement result of an affected area of a reflected light in case that the directivities of the light emitter and receiver are the same and different, respectively.

FIG. 50 shows an example of a measured result of the distance dc of the reflection plate C from the center axis where the aforementioned threshold value −14 dB is attained, while fixing the distance "r" between light emitter and receiver at 3 m, and allowing the reflection plate C to face in an arbitrary direction.

In FIG. 50, the curve "a" represents a case in which both of the directivity angles of light emitter A and light receiver B are 2° in half-value angle, in which the position at which the distance dc from the center axis to reflection plate C becomes largest, is equidistant between the light emitter and receiver. The curve "b" represents a case in which the directivity angle of the light emitter A is approximately 4° in half-value angle and that of light receiver B is approximately 5° in half-value angle, in which the position at which the distance dc from the center axis to reflection plate becomes largest, is shifted from the center toward the side of the light receiver B. Further, the distance dc and the direction of the reflection plate C, at which the aforementioned threshold value −14 dB is attained, depend on the positions between the light emitter and receiver, as shown in FIG. 51.

Figure 51:
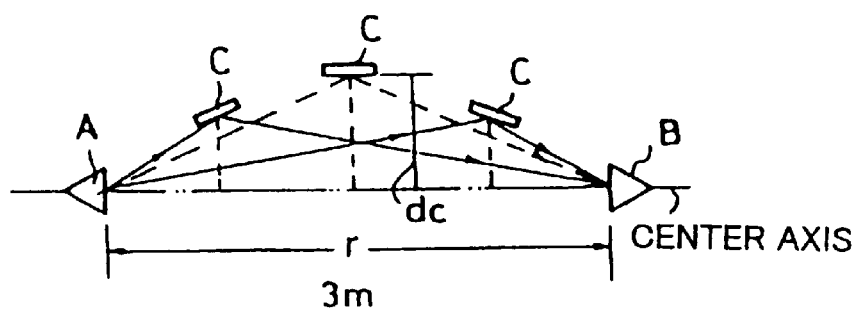
FIG. 51 is a diagram showing a relationship between a maximum distance of influence of the reflection plate and the direction and position of the reflection plate.

The measured results shown in FIGS. 49–51 have two implications to be considered for a light-beam type sensor to be applied to a safety apparatus.

Figure 52:
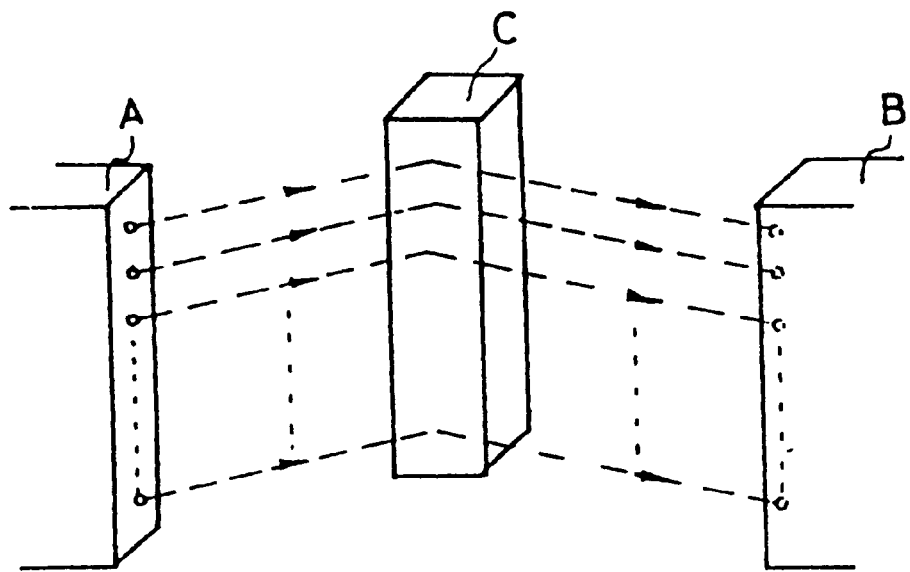
FIG. 52 is an explanatory view of an influence state of reflected light when a reflective body is located in parallel with an optical curtain.

First, it is possible that entrance of the operator's hand will not be detected even when the operator's hand has intercepted the light beam on the center axis of the optical curtain, if some reflective body such as a metal body exists on the bolster or near the optical curtain such that the light reflected by the reflective body is received. Particularly, in the event that the reflective body exists parallel to the vertical row of a plurality of light beams of the optical curtain as shown in FIG. 52, all of these light beam will fall into such a state.

Secondly, by differentiating the directivities of the light emitter and receiver from each other, the maximum distance of a reflection plate having influence through its reflecting light, from the center axis of the light emitter and receiver, can be shifted toward the light emitter or light receiver side. This is particularly important when designing a light emitter or light receiver making use of the existing light emitting element or light receiving element, since it is difficult to establish the directivity angle of a light receiver narrower than that of the light emitter.

There will be hereinafter explained a constitutional example of the optical curtain shown in FIG. 53, in which the influenced region from the center axis due to a reflective body is made narrower making use of the above noted second implication.

Figure 53:
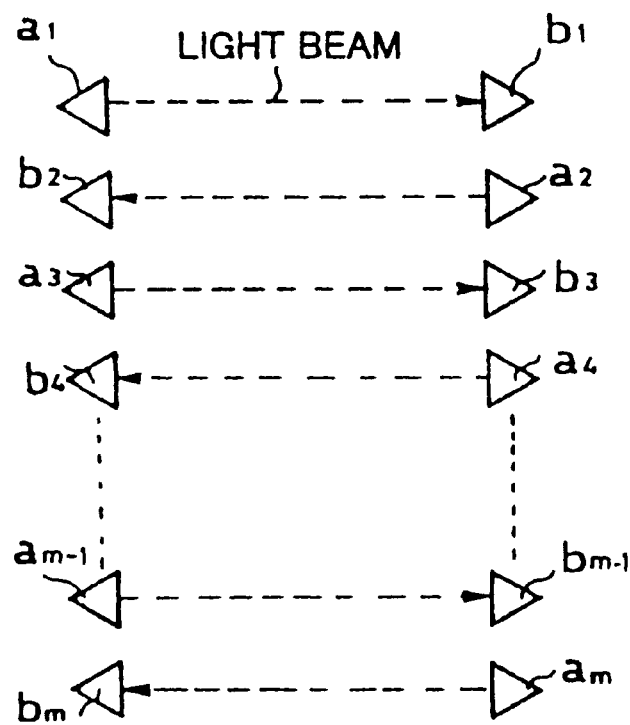
FIG. 53 is a schematic view showing a preferred constitutional example of an optical curtain applied to the present invention.

In FIG. 53, each of the vertically disposed and respectively paired light emitting elements $a_n$ and light receiving elements $b_n$ (n=1 to m) of an optical curtain are arranged in a staggered manner. Namely, arranged at one side of the optical curtain are light emitting elements $a_n$ (n=1, 3, •••, m−1) and light receiving elements $b_n$ (n=2, 4, •••, m), and arranged at the other side of the optical curtain are light emitting elements $a_n$ (n=2, 4, •••, m) and light receiving elements $b_n$ (n=1, 3, •••, m−1). Further, it shall be judged that "light is received", when there is obtained a logical value "1" from the result of a logical product operation of the outputs of two vertically disposed light receiving elements, such as "the first and the second" and "the third and the fourth".

Figure 54:
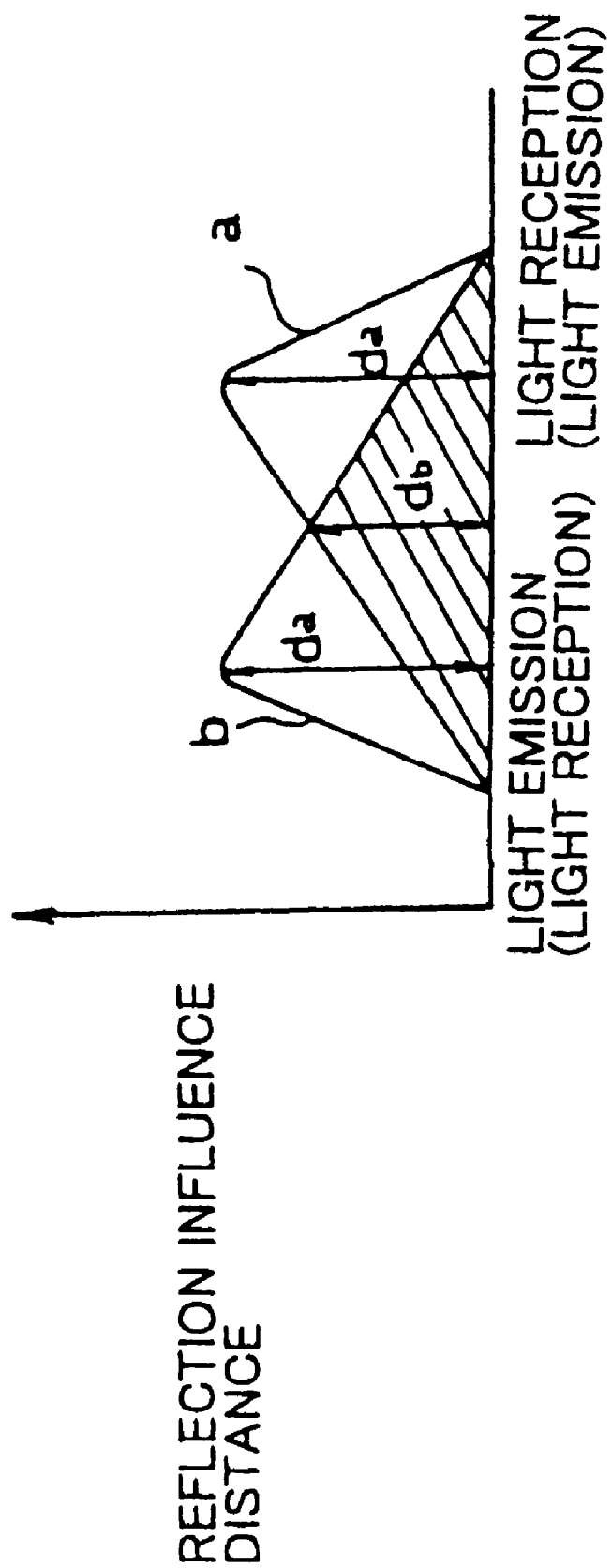
FIG. 54 is an explanatory graph of an effect of the optical curtain of FIG. 53.

According to such a constitution, the influenced region of a light receiving element at one side of the optical curtain due to a reflection plate is represented by a curve "a", and the influenced region of a light receiving element at the other side of the optical curtain due to a reflection plate is represented by a curve "b", as shown in FIG. 54. As such, if it shall be judged that "the light is received" only when the result of a logical product operation for both light receiving elements, i.e., both of the light receiving levels of the one and the other light receiving elements, exceeds the threshold value, the region to be influenced by the reflection plate is represented by the slashed region which is an overlapped region of the regions covered by the curves "a" and "b" in FIG. 54. Thus the maximum distance $d_b$ of the slashed region from the center axis can be shortened as compared to the maximum distances $d_a$ of the respective curves "a" and "b" from the center axis, so that the influenced region due to the reflection plate can be made narrower.

Therefore, if the plurality of light emitting elements $a_n$ and light receiving elements $b_n$ are vertically disposed to constitute an optical curtain as shown in FIG. 53, the region influenced by the light reflected from a reflective body existing in parallel to the rows of light emitting elements/light receiving elements can be made substantially narrower. As a result, the reliability of the optical curtain is improved, so that operator safety can also be improved.

With regard to the first implication, in the press (having an optical curtain 5 and an operation button 4) shown in FIG. 1, for example, the distance between the optical curtain 5 and bolster 3 is determined to be 1.6 T cm (the unit of T is ms). In this case, T means a period of time from the interception of the optical curtain by the operator up to the stoppage of the slide. The operation button is arranged outside this distance 1.6 T. Clearly the operator can not perform the work exchanging action on the bolster if a reflective body exists at the front in a manner vertically and in parallel with the light emitting and receiving elements of the optical curtain 5. Thus, if the influence of light reflected from a reflective body toward an optical curtain is to be considered, there shall be also considered location of a reflective body at a position which does not hinder the working operation.

For example, suppose that the operator's working region extends up to the point of 75 cm in both directions from the center point between the light emitter and receiver (i.e., the region between $\alpha$ and $\beta$ in FIG. 50. An optical curtain may be construed or regarded as if it were located at a position about 7 cm, at the maximum, closer to the bolster from the center axis of the light emitter and receiver when a reflective body is actually located outside the aforementioned working region (between $\alpha$ and $\beta$), provided the adopted optical curtain has the characteristics represented by the curve "b" in FIG. 50. Relatedly, in case of operational control of the press based on the optical curtains 5, 21 such as shown in FIG. 14, the slide actuation permission signal should disappear when the operator's hand intercepts the optical curtain 21. However, considering the influence of the reflected light from the reflective body, when the optical curtain 21 has a characteristic "b" such as shown in FIG. 50, there may occur such a situation that the slide actuation permission signal disappears only when the operator's hand has reached the position which is closer to the bolster by 7 cm from the position of the optical curtain 21. To avoid this situation, it is advisable to dispose another optical curtain 5 at a position closer to the bolster by 7 cm from the optical curtain 21. If it is realized, the optical curtain 5 will be intercepted by a reflective body even if the latter is disposed at a position closer to the bolster by 7 cm from curtain 21.

There will be described hereinafter the width of vertically disposed light axes (light axis interval) of the optical curtain.

The light axis interval of an optical curtain may be set at 10 mm for detecting the fingers of a hand. In the system of the present invention, the slide actuation permission signal is not generated when at least one of the optical curtain 21 and optical curtain 5 is intercepted. As such, the operator's hand may be detected by either curtain 21 or 5.

Figure 55:
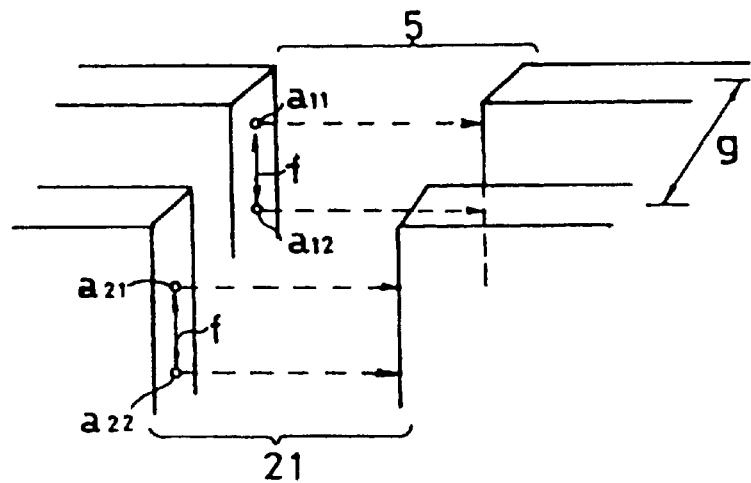
FIG. 55 is a partial perspective view of another preferred constitutional example of an optical curtain applied to the present invention.
Figure 56:
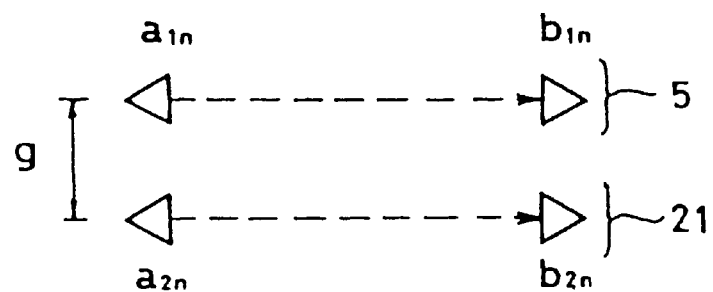
FIG. 56 is a schematic plan view of FIG. 55.
Figure 57:
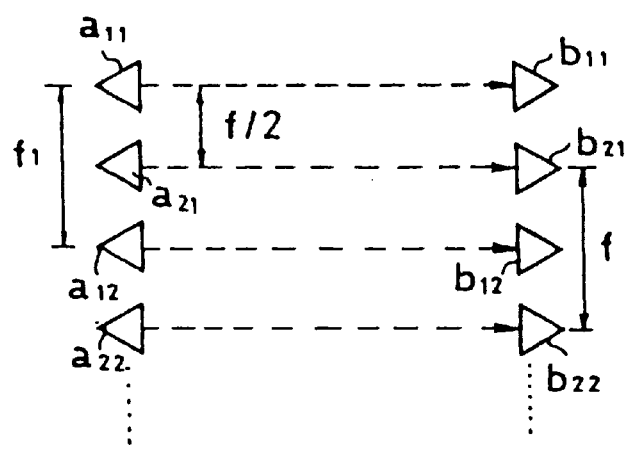
FIG. 57 is a schematic view of FIG. 55 from the front.

Thus, the optical curtains 5 and 21 may be constituted and arranged in a manner as shown in FIGS. 55 through 57. FIG. 55 is a perspective view, FIG. 56 is a schematic view from the above of FIG. 55, and FIG. 57 is a schematic view from the front of FIG. 55. In the drawings, $a_{1n}$, $a_{2n}$ (n=1, 2, •••) designate light emitting elements of respective optical curtains 5, 21, and $b_{1n}$, $b_{2n}$ designate light receiving elements of respective optical curtains 5, 21.

Namely the distance "g" between optical curtains 5 and 21 is arranged in view of the aforementioned influence of reflected light, the gap "f" between light axes of respective optical curtains 5, 21 is set at 20 mm, and the light axes of optical curtain 5 are vertically or uprightly offset from those of optical curtain 21 by 10 mm.

According to such a constitution, in addition to reducing the influence of the reflective body, if any, the total number of light axes of optical curtains 5, 21 can be reduced by up to half since the light axes of curtains 5, 21 are provided at an interval of 10 mm when viewed from the front, leading to a cost reduction for optical curtains 5 and 21.

Figure 58:
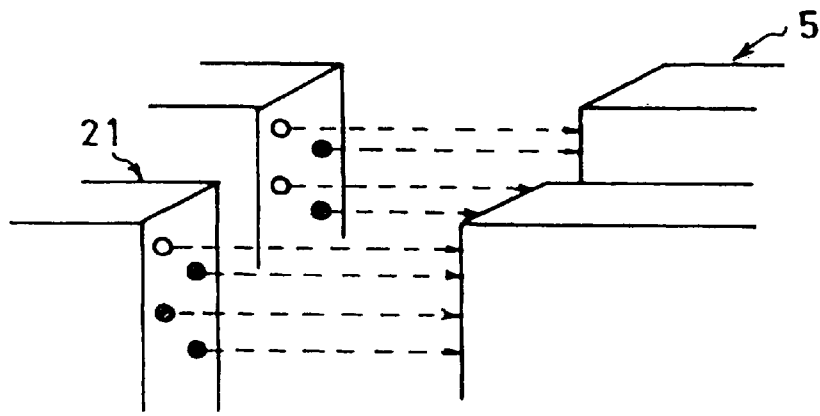
FIG. 58 is still another preferred constitutional example of an optical curtain applied to the present invention.

Further, each of optical curtains 5, 21 may be provided with two rows of light emitting and light receiving elements as shown in FIG. 58, with the positional relationship explained in FIGS. 55–57.

In the case shown in FIG. 58, those light axes of optical curtain 5 at the forefront of the drawing are separated from the bolster further than a position separated from the bolster by 1.6 T. As such, when the operator's finger passes between the light axes (of 20 mm gap) of this side of curtain 5, the light axis/axes is intercepted by the thick part of the hand to thereby detect the hand. Thus, as compared to a case in which the light axes are provided with gaps of 10 mm at a position 1.6 T from the bolster, the current configuration offers several advantages; not only may the influence due to light reflected by the reflective body be avoided, but also the number of light axes of optical curtains 5, 21 can be kept the same as with the optical curtain having light axes with gaps of 10 mm. As a result, the cost of the optical curtain does not greatly increase.

In the constitutions of FIGS. 55 through 58, if the light emitting and receiving elements of the optical curtains are vertically arranged in a staggered manner such as shown in FIG. 53, the influenced region due to a reflective body can be narrowed.

Figure 59:
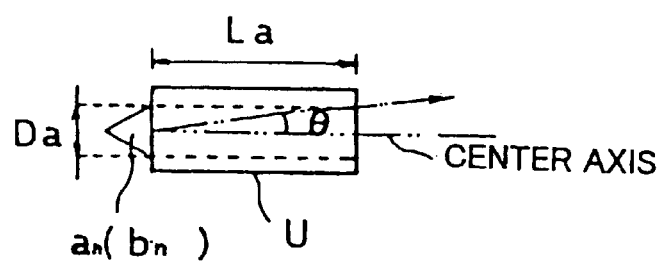
FIG. 59 is a constitutional example for improving the directivities of the light emitter and receiver.

FIG. 59 shows another example of a configuration for improving the directivity of the optical curtain. A light conducting tube U is provided parallel to the center axis, in front of the light emitting element $a_n$ or light receiving element $b_n$ of the optical curtain. This light conducting tube U is made representatively as a hollow pipe. It is assumed that $D_a$ is a diameter of the hollow part of the light conducting tube U, $L_a$ is a length of the light conducting tube U, and θ is a maximum angle defined by the center axis of light emitting element $a_n$ or light receiving element $b_n$ and the light beam exiting from the light emitting element or entering the light receiving element. The smaller the diameter $D_a$ of the hollow part is and the longer the length $L_a$ of the light conducting tube U is, the smaller the angle θ can be made, to thereby improve the directivity of the light emitting element $a_n$ or the light receiving element $b_n$.

Figure 60:
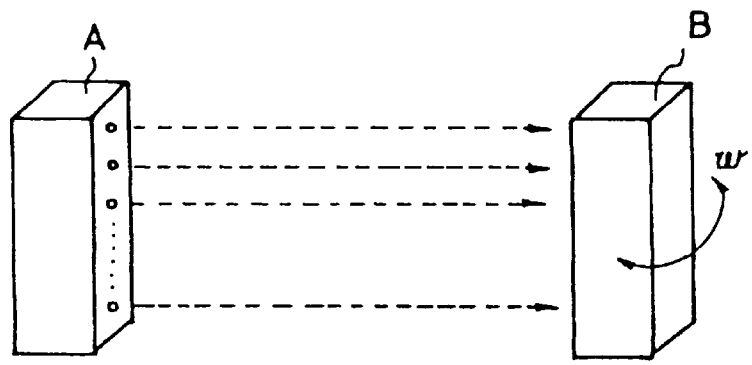
FIG. 60 is an explanatory view of the effect of FIG. 59.

Referring to FIG. 60, if the directivity is improved by providing the aforementioned light conducting tube U in front of the light emitting element or light receiving element, a deviation of the center axis can be detected since the light receiver B does not generate a light reception output when the deviation of the center axis has occurred by the rotation, in the direction of ω, of either the light emitter A side or light receiver B side of the optical curtain facing each other, such as due to vibration. Thus, even if the directivity itself of light emitting element $a_n$ or light receiving element $b_n$ is not high, deviation of the light axis of the optical curtain due to vibration, for example, can be detected.

Directivity may also be improved by providing a convex lens, instead of the light conducting tube U, in front of the light emitting element $a_n$ or the light receiving element $b_n$.

There will be explained a signal transmission path for slide driving.

In a press, the transmission of an operation signal for slide driving is typically provided by switching of a relay contact point. As such, welding of the relay contact point can lead to a dangerous side effect. Thus, a back-check (to check for ON of the contact point, as described later) is performed at each reciprocating motion of the slide, to thereby monitor problems due to welding (see Japanese Unexamined Patent Publication No. 8-273508). It is noted that the back-check is unnecessary if the structure for generating an output for slide driving is made fail-safe based on the dynamic signal processing defined by the European Standard prEN50100-1. As a concrete device, there is known the embodiment disclosed in U.S. patent application Ser. No. 08/108,579. However, when utilizing existing equipment, it is necessary to modify the interface.

In the case of a dual path system in which the power supply circuit for the slide includes two serially connected relay contact points (to be called A contact points) which become ON when energized, a switching control may be included. Such a control checks at the outset that both of the A contact points are made ON only when it is monitored that the relay contact points (to be called B contact points) which become ON when each relay is not energized are being ON (i.e., only when it is monitored that both of the A contact points are being OFF). According to this constitution, it is possible to cut off or stop the output if one of the A contact points is operating normally, even if the other A contact point is troubled by welding. However, there remains the defect that the output can not be cut off if both A contact points are troubled by welding.

Figure 61:
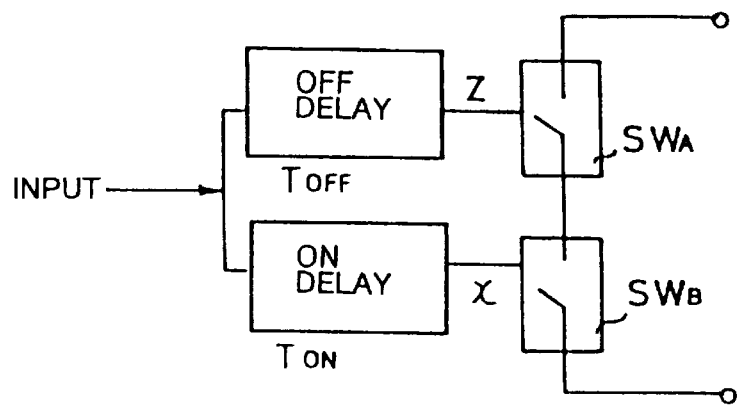
FIG. 61 is a standard constitutional diagram of a switching circuit.

FIG. 61 shows a switching circuit having a constitution known from PCT/JP96/00866, in which the switch $SW_B$ is a normal cut-off switch and the switch $SW_A$ is an emergency cut-off switch.

Figure 62:
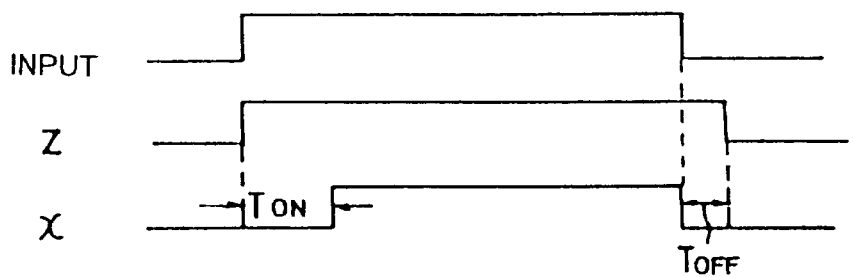
FIG. 62 is an operational time chart of the switch of FIG. 61.

In this constitution, as shown in a time-chart of FIG. 62, the emergency cut-off switch $SW_A$ does not directly turn ON/OFF the electric current at the usual time, but cuts off the current only once when the normal cut-off switch $SW_B$ has welded or when the output side has been short circuited.

However, the welding/short circuit trouble of the normal cut-off switch $SW_B$ can not be detected unless an input signal becomes OFF. Even under such a situation that the input signal is provided and the normal cut-off switch $SW_B$ is allowed to become ON, the fact may be that the switch $SW_B$ has lost cut-off capability. Further, when the normal cut-off switch $SW_B$ is operating normally, the output to the slide is immediately cut off (stoppage of output x) upon OFF of the input signal. However, in case that the normal cut-off switch $SW_B$ is short circuited so that the output is to be cut off by means of the emergency cut-off switch $SW_A$, the output z is kept for a delay time $T_{OFF}$ of the OFF delay circuit, resulting in delay of response. This is inevitable in a switching circuit in which the electric current is not directly turned ON/OFF by the emergency cut-off switch $SW_A$, In this figure $T_{ON}$ designates the delay time of the ON delay circuit.

Figure 63:
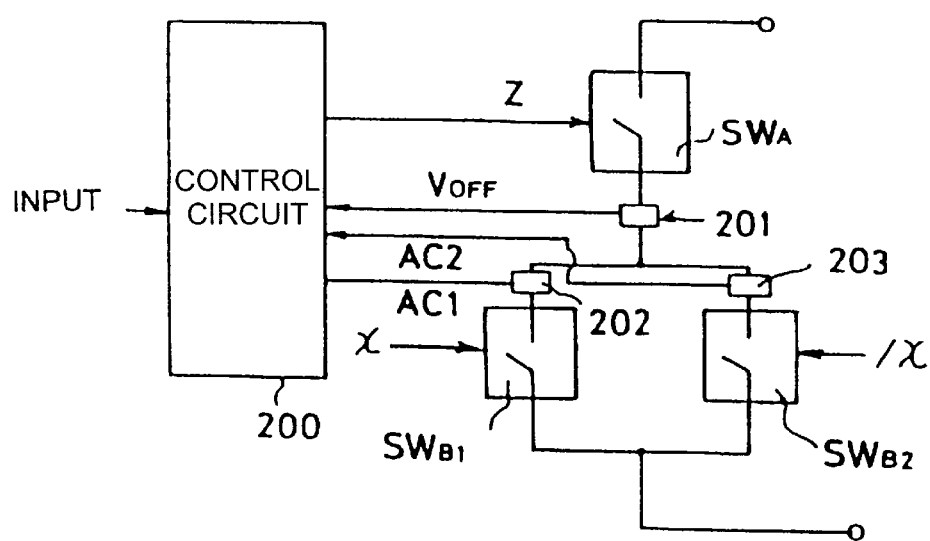
FIG. 63 is a basic constitutional diagram of a switching circuit applied to the present invention.

FIG. 63 shows an example of a switching circuit for driving the slide, to be applied to the automatic sliding operation control apparatus for a press according to the present invention.

Figure 64:
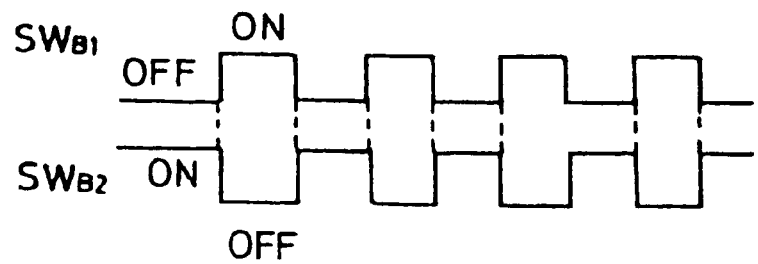
FIG. 64 is a time chart of the driving signal of a normal cut-off switch in FIG. 63.

In FIG. 63, the switching circuit of this embodiment includes a parallel circuit of two normal cut-off switches $SW_{B1}$, $SW_{B2}$, which are connected in series with an emergency cut-off switch $SW_A$. Further, these two normal cut-off switches $SWB_1$ and $SWB_2$ are alternately turned ON/OFF by two-phase signals x and /x (negation signal of x) having a mutually complementary output relationship to each other such as shown in the time chart of FIG. 64. These signals are generated by a control circuit 200 acting as a control device, based on the input signal (corresponding to the operation signal of the slide). The control circuit 200 outputs an ON driving signal, via an OFF delay circuit OFD10 (shown in FIG. 65), toward the emergency cut-off switch $SW_A$, based on the input of the input signal, and the aforementioned two-phase signals x, /x toward the normal cut-off switches $SW_{B1}$, $SW_{B2}$, via an ON delay circuit OND10 (shown in FIG. 65), by means of a two-phase signal generation circuit 122 to be described later. Further, the control circuit 200 turns ON to drive the emergency cut-off switch $SW_A$ upon receiving an operation signal, under the condition that a signal $V_{OFF}$ indicative of an OFF state is being input from a monitoring circuit 201 which monitors that the normal cut-off switches $SW_{B1}$, $SW_{B2}$ are both in an OFF state. The control circuit 200 maintains the ON state of the emergency cut-off switch $SW_A$, based on signals AC1, AC2 indicative of alternating ON/OFF operations from monitoring circuits 202, 203 which monitor the switching operations (ON/OFF operations) of each of the normal cut-off switches $SW_{B1}$, $SW_{B2}$.

According to such a constitution, under a state that the emergency cut-off switch $SW_A$ may be turned ON to supply the power, there can be executed the continuous supply of power by alternately turning ON/OFF the normal cut-off switch $SW_{B1}$, $SW_{B2}$, while confirming that these normal cut-off switches are not short-circuited. Should a short circuiting trouble exist, the power is cut off by turning OFF the emergency cut-off switch $SW_A$ even under a state that the power supply is permitted by the input signal.

Thus, there can be obtained the advantage that the output can be immediately cut off upon discovery of trouble in either of the normal cut-off switches $SW_{B1}$ and $SW_{B2}$ under an ON state of the input signal in the present invention, whereas trouble in the normal cut-off off switch $SW_B$ of the conventional constitution shown in FIG. 61 can not be discovered unless the input signal is turned OFF.

Figure 65:
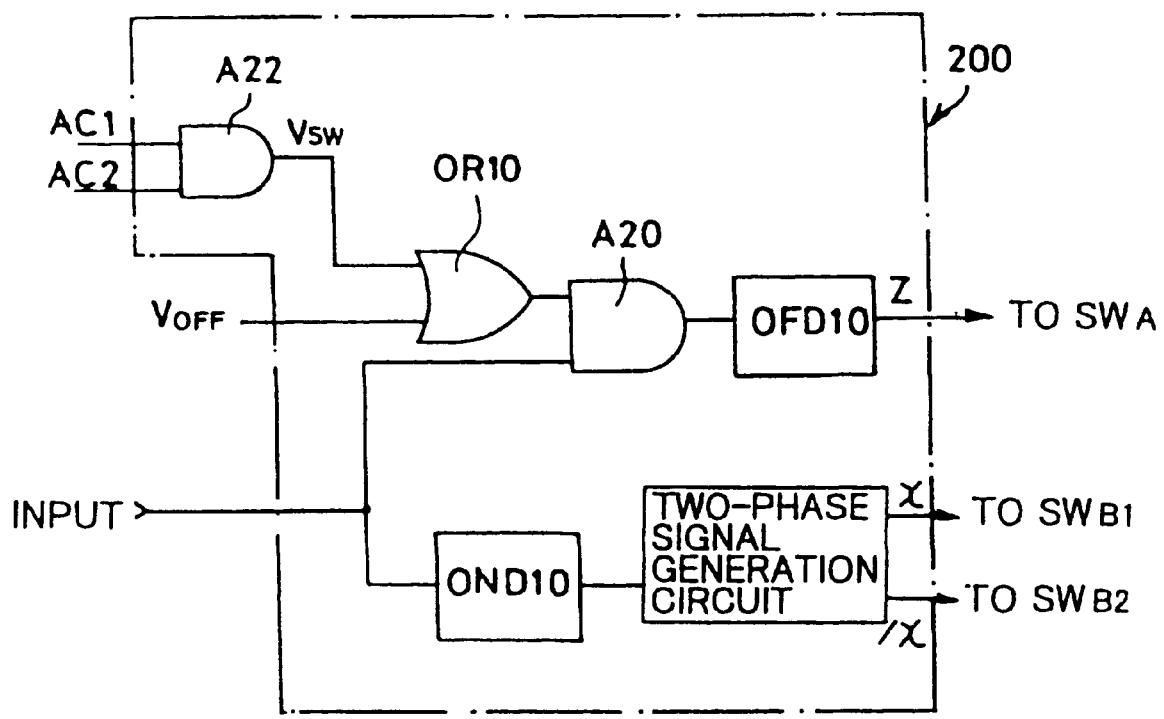
FIG. 65 is a basic constitutional view of a control circuit for a switching circuit of FIG. 63.

FIG. 65 shows a basic constitution of the control circuit 200 which first turns ON the emergency cut-off switch $SW_A$ based on the confirmation that both normal cut-off switches $SW_{B1}$, $SW_{B2}$ are OFF, and thereafter permits the continuation of ON state of the emergency cut-off switch $SW_A$, by confirming the normality of the normal cut-off switches $SW_{B1}$, $SW_{B2}$ through monitoring of their switching operations (ON/OFF operations).

In FIG. 65, if an input signal is generated under a state that both of the normal cut-off switches $SW_{B1}$, $SW_{B2}$ are being OFF (the OFF confirmation signal $V_{OFF}$ being generated from the monitoring circuit 201), an output is generated from an AND gate A20, so that the emergency cut-off switch $SW_A$ is turned ON by the output signal z of an OFF delay circuit OFD10. Thereafter, the two-phase signals (signal x, signal /x) are generated after a delay time to be determined by the ON delay circuit OND10, such that the normal cut-off switches $SW_{B1}$ and $SW_{B2}$ are alternately turned ON/OFF. At the same time, the switching operations of the normal cut-off switches $SW_{B1}$ and $SW_{B2}$ are monitored by the monitoring circuits 202, 203, and in case of normality, the signals AC1, AC2 are both generated to thereby generate the normality confirmation signal $V_{sw}$ which keeps the output of OR gate OR10 so that the emergency cut-off switch $SW_A$ is kept ON. Under a state that the input signal is being generated, if short circuiting trouble occurs in either or both of the normal cut-off switches $SW_{B1}$ and $SW_{B2}$, the normality confirmation signal stops, thereby turning OFF the emergency cut-off switch $SW_A$. Thereafter, the OFF confirmation signal $V_{OFF}$ of the normal cut-off switches $SW_{B1}$ and $SW_{B2}$ is not generated, so that the ON actuation of the emergency cut-off switch $SW_A$ becomes disabled (locked out).

Figure 66:
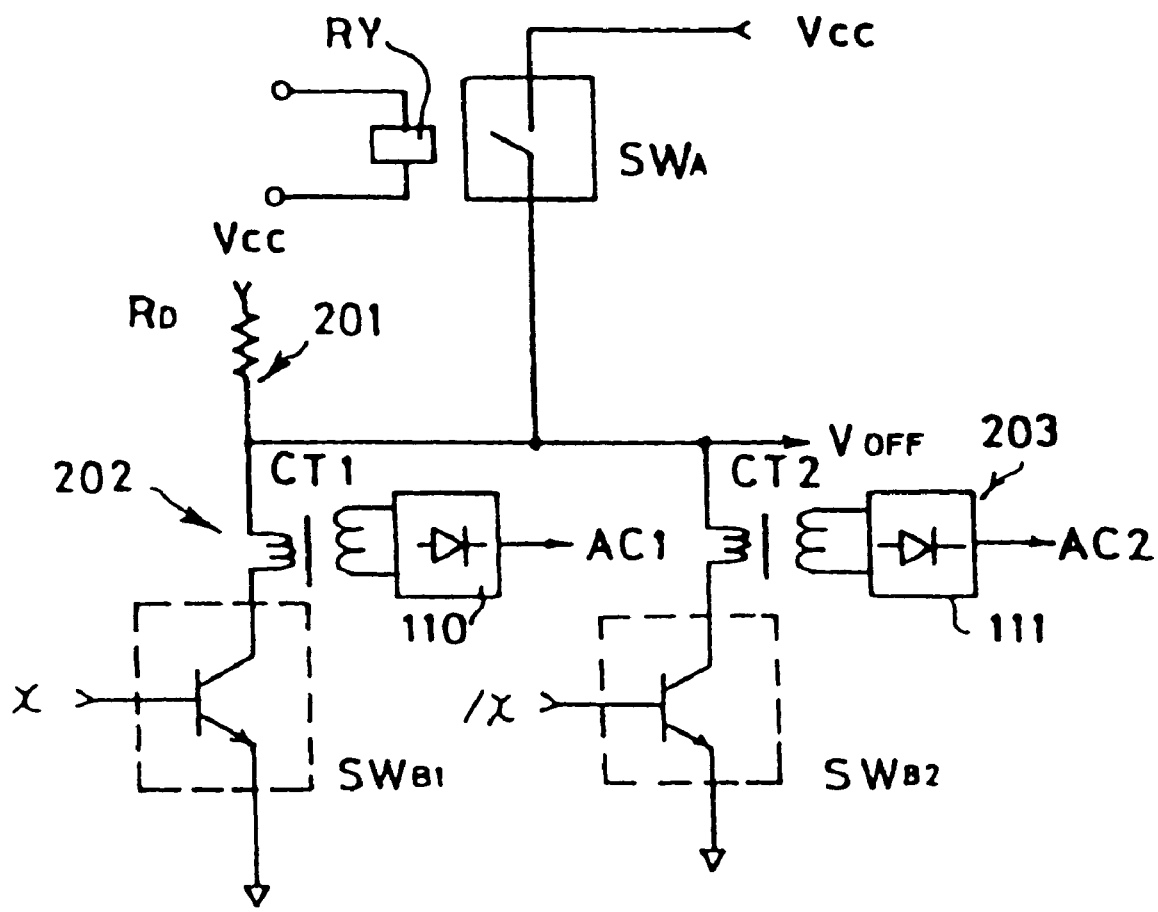
FIG. 66 is a diagram of a monitoring circuit for an OFF confirmation signal and a normality confirmation signal, where the normal cut-off switch of the switching circuit of FIG. 65 is constituted of transistors.

FIG. 66 shows a concrete example of the monitoring circuit 201 for generating the OFF confirmation signal $V_{OFF}$, and the monitoring circuits 202, 203 for cooperatively generating the normality confirmation signal $V_{sw}$ of the switching operation, in a case in which transistors are used as the normal cut-off switches $SW_{B1}$, $SW_{B2}$.

In FIG. 66, the monitoring circuit 201 is constituted by connecting the power supply voltage $V_{CC}$, via a resistor $R_D$, to a power supply line between the emergency cut-off switch $SW_A$ and the normal cut-off switches $SW_{B1}$ and $SW_{B2}$.

Further, 110, 111 are rectifying circuits, and CT1, CT2 are current sensors, in which the current sensor CT1 and rectifying circuit 110 cooperatively constitute the monitoring circuit 202, and the current sensor CT2 and rectifying circuit 111 cooperatively constitute the monitoring circuit 203. RY is a relay, the A contact of which acts as the emergency cut-off switch $SW_A$.

According to such a constitution, the power supply voltage $V_{CC}$ generates the OFF confirmation signal $V_{OFF}$ from the monitoring circuit 201 via the resistor $R_D$, only when both of the normal cut-off switches $SW_{B1}$ and $SW_{B2}$ are OFF. If either of the normal cut-off switches $SW_{B1}$ or $SW_{B2}$ is ON, the OFF confirmation signal $V_{OFF}$ is 0 volt. Insofar as the normal cut-off switches $SW_{B1}$ and $SW_{B2}$ are being alternately turned ON/OFF, the current sensors CT1, CT2 are flown by an AC signal to thereby cause the rectifying circuits 110, 111 to generate rectified signals AC1, AC2, respectively, so that the signals AC1, AC2 are generated from both monitoring circuits 202, 203. The logical product output of these signals AC1, AC2 becomes the normality confirmation signal $V_{sw}$ of FIG. 65. If either the normal cut-off switch $SW_{B1}$ or $SW_{B2}$ is kept ON, the primary side of the corresponding one of the current sensors CT1 and CT2 is flown by an electric current having a value larger than a predetermined level, so that the corresponding one of the output of rectifying circuits 110 and 111 stops.

Figure 67:
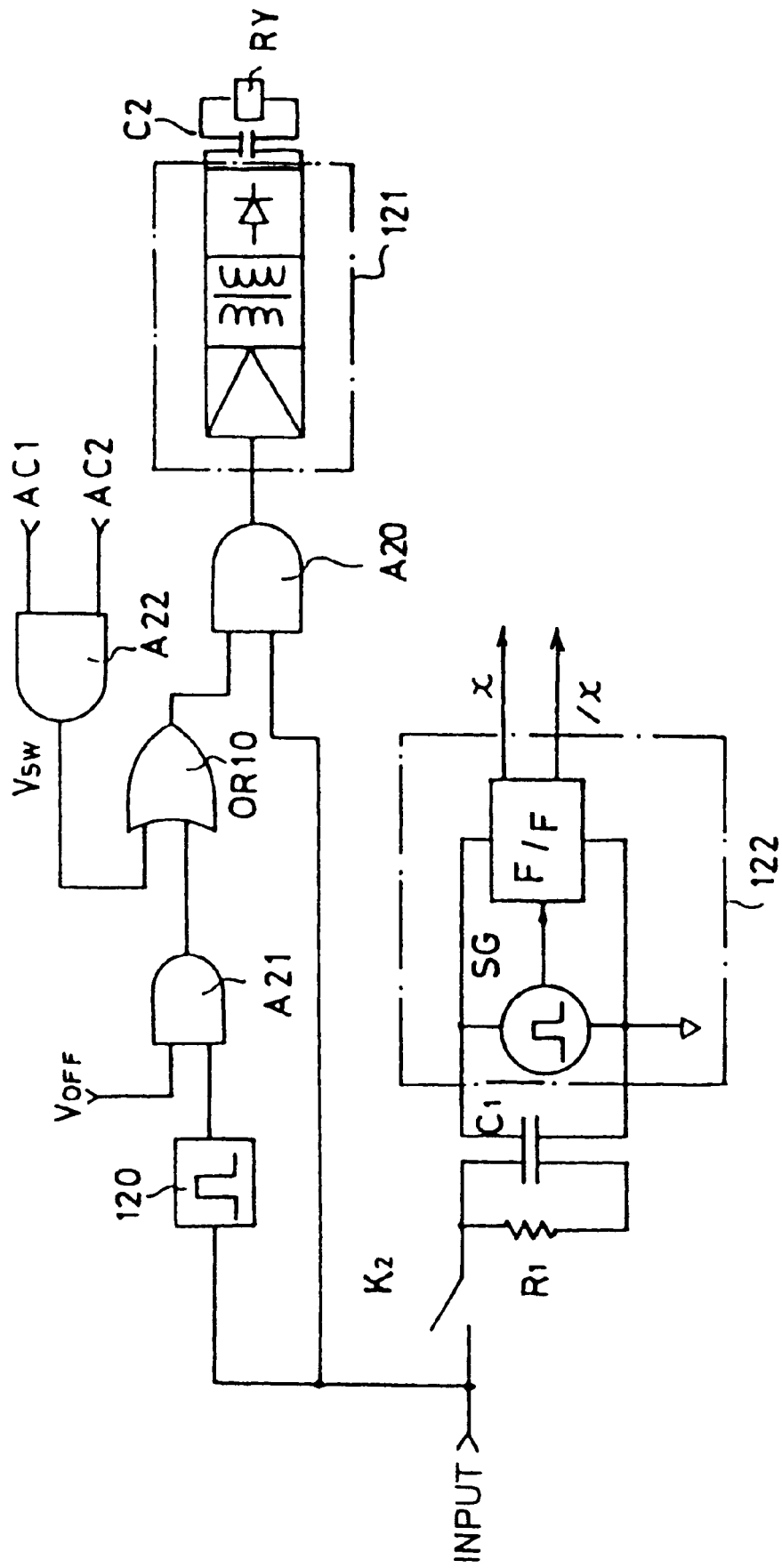
FIG. 67 is a diagram of a exemplary circuit for constituting a control circuit of FIG. 65 in a fail-safe manner.
Figure 68:
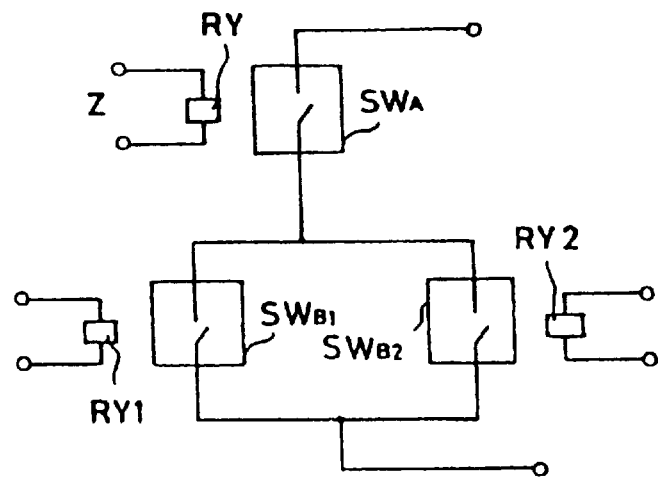
FIG. 68 is a circuit diagram where the normal cut-off switch of the switching circuit of FIG. 63 is a relay contact point.

FIG. 67 shows a concrete example of a circuit which realizes the circuit of FIG. 65 in a fail-safe manner, making use of the monitoring circuit of FIG. 66.

In FIG. 67, 120 is a leading-edge detection circuit, 121 is a relay driver constituted of an amplifier, a transformer and a rectifying circuit, and 122 is the two-phase signal generation circuit of FIG. 65 comprising an oscillator SG and a flip-flop circuit F/F. The capacitors $C_1$, $C_2$ are four-terminal capacitors, in which the capacitor $C_1$ has a function of the ON delay circuit OND10, and the capacitor $C_2$ has a function of the OFF delay circuit OFD10.

In such a constitution, when an input signal is generated, an output of the leading-edge detection circuit 120 based on its leading-edge is input to an AND gate A21. At this time, if the normal cut-off switches $SW_{B1}$ and $SW_{B2}$ are both in an OFF state and the OFF confirmation signal $V_{OFF}$ is being generated from the circuit of FIG. 66, the output of the OR gate OR10 based on an output of the AND gate A21 is applied to the AND gate A20 so that an output is generated therefrom. As a result, the relay RY is energized based on the output of the relay driver 121, so that the emergency cut-off switch $SW_A$ constituted by its contact point, is turned ON.

Further, the contact point $K_2$ is turned ON by the excitation of the relay RY, the oscillator operates after a predetermined period of time, and the respective signals x, /x are generated via flip-flop circuit F/F, so that the normal cut-off switches $SW_{B1}$ and $SW_{B2}$ are alternately turned ON/OFF. During normal operation, the signals AC1, AC2 of FIG. 66 are generated, and the normality confirmation signal $V_{sw}$ is generated via an AND gate A22, so that the relay RY is kept energized.

Figure 69:
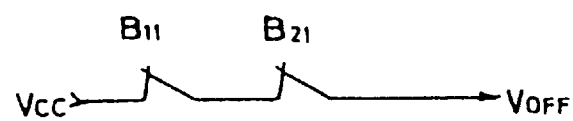
FIG. 69 is a diagram of a monitoring circuit of the OFF confirmation signal of FIG. 68.

In case the normal cut-off switches $SW_{B1}$ and $SW_{B2}$ are constituted of the A contact points (which become ON when energized) of relays RY1, RY2, the OFF confirmation signal $V_{OFF}$ and normality confirmation signal $V_{sw}$ can be generated making use of the B contact points (which become OFF when energized) as shown in FIG. 69.

Figure 70:
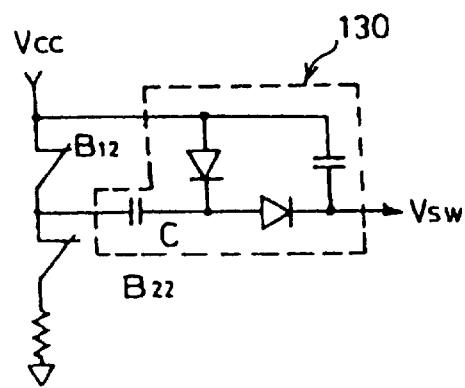
FIG. 70 is a diagram of a monitoring circuit of FIG. 68.

Namely, the OFF confirmation signal $V_{OFF}$ is generated by serially connecting the first B contact points $B_{11}$, $B_{21}$ Of the relays RY1, RY2, respectively. Further, since the normal cut-off switches $SW_{B1}$ and $SW_B$ are alternately turned ON/OFF, the normality confirmation signal $V_{sw}$ is generated by the charge/discharge of the capacitor C of a voltage doubler rectifying circuit 130 based on the alternating ON/OFF operations of the second B contact points $B_{12}$, $B_{22}$ of the relays RY1, RY2, respectively, as shown in FIG. 70. In this case, if either of the second B contact points $B_{12}$ or $B_{22}$ is fixed at the ON side or OFF side, the capacitor C stops repeating charge and discharge, so that the normality confirmation signal $V_{sw}$ is not generated.

According to this embodiment, the monitoring circuits 202, 203 of FIG. 63 can be constituted by a single circuit so that the AND gate A22 shown in FIG. 65 can be omitted.

In this embodiment, the switching circuits have been applied to a press in which the slide is automatically actuated. However, it is apparent that these switching circuits can be applied to those presses in which the slide is manually actuated based on the manipulation of the operation button such as in the conventional press system. Further, the switching circuits of the present invention have been explained in connection with those situations in which they are applied to a power supply circuit of a moving part of press. However, it is apparent that these switching circuits can be applied to any type of machines insofar as they include a power supply circuit for supplying power to a load.

According to the present invention as explained above, the slide is automatically actuated by judging the completion of the operator's work exchanging operation, based on the time-wise transition state of the outputs of the first and second detecting devices. Thus, it becomes unnecessary to manipulate the operation button, as is required in the conventional system, thereby reducing the operator's burden. Further, in the present invention, the signal to be generated for operational control of the press is a signal indicative of affirmative permission of operation based on the basic principle of fail-safe control, and is never a signal for providing the control condition for output stoppage. Thus, the operational control signal according to the present invention is constituted in a fail-safe manner. Further, unexpected operator behavior may be monitored, so that the automatic actuation control is discontinued when such behavior is exhibited, resulting in improved safety during automatic actuation control of the slide.

The industrial applications of the present invention are clear because the automation of the sliding operation of a press can be achieved by a fail-safe constitution so that the efficiency of press operation can be improved and the operator's safety can be assuredly guaranteed.

We claim:

1. A fail-safe automatic sliding operation control apparatus for a press in which a work located on a bolster is processed by downwardly moving a slide to the work, comprising:

first detecting means for detecting entry of a human body within a first danger zone which is established to include the bolster;

second detecting means for detecting entry of the human body within a second danger zone which is established outside of said first danger zone to include said first danger zone;

withdrawal detection means for generating a human-body-withdrawal-detection-signal indicative of withdrawal of the human body from said first and second danger zones, when a first human-body-absence-detection-signal is generated by said first detecting means and thereafter a second human-body-absence-detection-signal is generated by said second detecting means; and actuation control means for generating an automatic actuation signal for the slide when said human-body-withdrawal-detection-signal is generated by said withdrawal detection means.

2. The fail-safe automatic sliding operation control apparatus for a press of claim 1, wherein said withdrawal detection means generates said human-body-withdrawal-detection-signal when said first human-body-absence-detection-signal is received from said first detecting means and thereafter said second human-body-absence-detection-signal is received from said second detecting means, after a first human-body-presence-detection-signal is generated by said second detecting means and thereafter a second human-body-presence-detection-signal is generated by said first detecting means.

3. The fail-safe automatic sliding operation control apparatus for a press of claim 1, wherein said withdrawal detection means generates, upon withdrawal of the human body, said human-body-withdrawal-detection-signal by judging that the human body has been withdrawn based on said second human-body-absence-detection-signal of said second detecting means, and wherein said withdrawal detection means stops generating, upon entrance of the human body, said human-body-withdrawal-detection-signal by judging that the human body has entered based on said second human-body-presence-detection-signal of said first detecting means.

4. The fail-safe automatic sliding operation control apparatus for a press of claim 3, wherein said withdrawal detection means generates said human-body-withdrawal-detection-signal based on said second human-body-absence-detection-signal of said second detecting means, only when said second human-body-absence-detection-signal is generated by said second detecting means after said second human-body-presence-detection-signal is generated by said first detecting means during a rising interval of the slide.

5. The fail-safe automatic sliding operation control apparatus for a press of claim 1, further comprising:

a guard fence provided around said second danger zone, said guard fence enclosing the bolster except for a work insertion zone for an operator.

6. The fail-safe automatic sliding operation control apparatus for a press of claim 5, wherein said guard fence includes a transparent member at an upper part of said guard fence above said work insertion zone.

7. The fail-safe automatic sliding operation control apparatus for a press of claim 1, further comprising:

permission condition monitoring means for monitoring whether a continuation permission condition necessary for automatic actuation control by said actuation control means is satisfied, and for generating an automatic actuation permission signal when said continuation permission condition is satisfied;

wherein said actuation control means generates the automatic actuation signal based on said human-body-withdrawal-detection-signal only when said automatic actuation permission signal is being generated.

8. The fail-safe automatic sliding operation control apparatus for a press of claim 7, wherein said permission condition monitoring means stops generating said automatic actuation permission signal when one of said first and second human-body-absence-detection-signals of said first and second detecting means have disappeared during lowering motion of the slide.

9. The fail-safe automatic sliding operation control apparatus for a press of claim 7, wherein said permission condition monitoring means stops generating said automatic actuation permission signal when said human-body-presence-detection-signals of said first and second detecting means are generated within a predetermined period of time after said human-body-absence-detection-signals of said first and second detecting means have been generated.

10. The fail-safe automatic sliding operation control apparatus for a press of claim 7 wherein said permission condition monitoring means stops generating said automatic actuation permission signal when a generation interval between said first and second human-body-presence-detection-signals from said first and second detecting means has exceeded a previously set working time interval.

11. The fail-safe automatic sliding operation control apparatus for a press of claim 7, further comprising:
resetting means for resetting the human-body-withdrawal-detection-signal from said withdrawal detection means during a slide rising interval.

12. The fail-safe automatic sliding operation control apparatus for a press of claim 11, further comprising:
overrun monitoring means for monitoring whether the slide has stopped at a position within a predetermined range including a top dead center based on a brake signal to be generated during the slide rising interval, and for generating a brake normality signal when the slide has stopped within said predetermined range;
wherein said actuation control means is enabled to generate said automatic actuation signal when said brake normality signal is generated.

13. The fail-safe automatic sliding operation control apparatus for a press of claim 12 wherein said overrun monitoring means maintains said brake normality signal when said human-body-withdrawal-detection-signal is generated under a state that the slide has stopped within said predetermined range.

14. The fail-safe automatic sliding operation control apparatus for a press of claim 12, wherein said brake normality signal of said overrun monitoring means is input to said permission condition monitoring means, such that said permission condition monitoring means is enabled to generate said automatic actuation permission signal when said brake normality signal is being generated.

15. The fail-safe automatic sliding operation control apparatus for a press of claim 1, further comprising:
a starting button which is manually operated by an operator;
wherein said actuation control means is enabled to operate by an ON operation of said starting button, so as to generate the automatic actuation signal based on said human-body-withdrawal-detection-signal.

16. The fail-safe automatic sliding operation control apparatus for a press of claim 15, wherein said actuation control means comprises:
manual actuation signal generation means for generating a manual actuation signal [of] for the slide by an ON operation of said starting button; and
automatic actuation signal generation means which is set when the slide, which was actuated responsive to said manual actuation signal, has passed a bottom dead center, such that said automatic actuation signal generation means generates said automatic actuation signal based on said human-body-withdrawal-detection-signal.

17. The fail-safe automatic sliding operation control apparatus for a press of claim 15, wherein said actuation control means includes starting button OFF confirming means for confirming that said starting button is turned OFF after said starting button has been turned ON, and is enabled to operate by generation of a confirmation signal of said starting button OFF confirming means.

18. The fail-safe automatic sliding operation control apparatus for a press of claim 1, further comprising:
manual actuation means for generating a manual actuation signal based on manual operation by an operator, wherein slide actuation operation by said manual actuation means and slide actuation operation by said actuation control means are selectively switched by switching means.

19. The fail-safe automatic sliding operation control apparatus for a press of claim 18, wherein said switching means comprises a power supply switch for said second detecting means, and said actuation control means is set by turning ON said power supply switch.

20. The fail-safe automatic sliding operation control apparatus for a press of claim 1, further comprising:
delay means for delaying said human-body-withdrawal-detection-signal for a predetermined period of time and for inputting said human-body-withdrawal-detection-signal to said actuation control means.

21. The fail-safe automatic sliding operation control apparatus for a press of claim 1, wherein said first and second detecting means are embodied as first and second interrupter type optical sensors, respectively, each optical sensor comprising a light emitting element and a light receiving element which are arranged to oppose each other at a boundary of a corresponding one of said first and second danger zones.

22. The fail-safe automatic sliding operation control apparatus for a press of claim 21, wherein each of said optical sensors comprises a plurality of light emitting elements and a plurality of light receiving elements which are vertically arranged to oppose one another along a boundary plane of said corresponding one of said first and second danger zones.

23. The fail-safe automatic sliding operation control apparatus for a press of claim 22, wherein said plurality of light emitting elements and said plurality of light receiving elements of each of said optical sensors are disposed such that light emitting elements and light receiving elements are vertically and alternately arranged at a first side of the boundary plane of said corresponding one of said danger zones, and light receiving elements and light emitting elements are vertically and alternately arranged at a second side of the boundary plane of said corresponding one of said danger zones, said light receiving elements and light emitting elements on the second side opposing said light emitting elements and light receiving elements on the first side.

24. The fail-safe automatic sliding operation control apparatus for a press of claim 22, wherein light axes of said first optical sensor disposed at the boundary plane of said first danger zone and light axes of said second optical sensor disposed at the boundary plane of said second danger zone are vertically offset from each other along said boundary planes, when viewed from a front of said boundary planes.

25. The fail-safe automatic sliding operation control apparatus for a press of claim 1, further comprising:
a switching circuit for closing a power supply circuit of the slide by generating a driving signal based on an automatic actuation signal from said actuation control means, said switching circuit including, an emergency cut-off switch which is turned ON simultaneously with an input of said automatic actuation signal, and turned OFF at a predetermined OFF delay time after stoppage of said input of said automatic actuation signal; and two normal cut-off switches which are turned ON at a predetermined ON delay time after an input of said automatic actuation signal, and turned OFF simultaneously with stoppage of said input of said automatic actuation signal;

wherein said two normal cut-off switches, which are connected in parallel to each other, are connected in series with said emergency cut-off switch, and said two normal cut-off switches are alternately turned ON/OFF by signals having a mutually complementary relationship.

26. The fail-safe automatic sliding operation control apparatus for a press of claim 25, wherein:

said emergency cut-off switch is turned ON by an OFF confirmation signal indicating that said two normal cut-off switches are both OFF, and is kept ON by a normality confirmation signal indicative of a normal condition in which said two normal cut-off switches are being turned ON/OFF alternately.

27. A fail-safe automatic sliding operation control apparatus for a press provided with a switching circuit for controlling o opening and closing of a power supply circuit for a movable part of the press, said power supply circuit comprising:

an emergency cut-off switch which is turned ON simultaneously with an input of an actuation signal of said movable part, and turned OFF at a predetermined OFF delay time after stoppage of said input of said actuation signal; and two normal cut-off switches which are turned ON at a predetermined ON delay time after an input of said actuation signal, and turned OFF simultaneously with stoppage of said input of said actuation signal;

wherein said two normal cut-off switches, which are connected in parallel to each other, are connected in series with said emergency cut-off switch, said two normal cut-off switches being alternately turned ON/OFF by signals having a mutually complementary relationship based on said actuation signal; and said apparatus further comprising control means for keeping closure of said emergency cut-off switch when said two normal cut-off switches are being turned ON/OFF alternately.

28. The fail-safe automatic sliding operation control apparatus for a press of claim 27 wherein said control means generates an ON driving signal for said emergency cut-off switch when an OFF confirmation signal, indicating that both of said two normal cut-off switches are OFF at a time of input of said actuation signal, is being generated; and wherein said control means continuously generates an ON driving signal for said emergency cut-off switch when a normality confirmation signal, indicative of a normal state in which said two normal cut-off switches are being alternately turned ON/OFF based on said actuation signal, is being generated.

* * * * *